(12) United States Patent
Otten et al.

(10) Patent No.: US 11,961,698 B2
(45) Date of Patent: Apr. 16, 2024

(54) REPLACEABLE MODULE FOR A CHARGED PARTICLE APPARATUS

(71) Applicant: ASML Netherlands B.V., Veldhoven (NL)

(72) Inventors: Christiaan Otten, IJsselstein (NL); Peter-Paul Crans, Poeldijk (NL); Marc Smits, Pijnacker (NL); Laura Del Tin, The Hague (NL); Christan Teunissen, Delft (NL); Yang-Shan Huang, Veldhoven (NL); Stijn Wilem Herman Karel Steenbrink, The Hague (NL); Xuerang Hu, San Jose, CA (US); Qingpo Xi, Fremont, CA (US); Xinan Luo, San Jose, CA (US); Xuedong Liu, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/344,446

(22) Filed: Jun. 10, 2021

(65) Prior Publication Data

US 2021/0391139 A1  Dec. 16, 2021

Related U.S. Application Data

(60) Provisional application No. 63/037,481, filed on Jun. 10, 2020.

(30) Foreign Application Priority Data

Sep. 22, 2020  (EP) .................................... 20197510

(51) Int. Cl.
*H01J 37/15* (2006.01)
*H01J 37/02* (2006.01)
(Continued)

(52) U.S. Cl.
CPC ............ *H01J 37/15* (2013.01); *H01J 37/023* (2013.01); *H01J 37/14* (2013.01);
(Continued)

(58) Field of Classification Search
CPC .......... H01J 37/023; H01J 37/15; H01J 37/28
See application file for complete search history.

(56) References Cited

U.S. PATENT DOCUMENTS 5,401,974 A    3/1995  Oae et al.
10,658,152 B1*  5/2020  Hendrich .............. H01J 37/244
(Continued)

FOREIGN PATENT DOCUMENTS

CN    104272427 B    5/2017
CN    103681190 B    6/2018
(Continued)

OTHER PUBLICATIONS

Office Action of the Intellectual Property Office of Taiwan issued in related Taiwanese Patent Application No. 110120894; dated Mar. 28, 2022 (16 pgs.).
(Continued)

*Primary Examiner* — Eliza W Osenbaugh-Stewart
(74) *Attorney, Agent, or Firm* — Finnegan, Henderson, Farabow, Garrett & Dunner, LLP

(57)  ABSTRACT

Disclosed herein is a module for supporting a device configured to manipulate charged particle paths in a charged particle apparatus, the module comprising: a support arrangement configured to support the device, wherein the device is configured to manipulate a charged particle path within the charged particle apparatus; and a support positioning system configured to move the support arrangement within the module; wherein the module is arranged to be field replaceable in the charged particle apparatus.

20 Claims, 18 Drawing Sheets

(51) Int. Cl.
  *H01J 37/14* (2006.01)
  *H01J 37/147* (2006.01)
  *H01J 37/18* (2006.01)
  *H01J 37/244* (2006.01)
  *H01J 37/28* (2006.01)
  *H01J 37/20* (2006.01)
  *H01J 37/317* (2006.01)

(52) U.S. Cl.
  CPC .......... *H01J 37/1477* (2013.01); *H01J 37/18* (2013.01); *H01J 37/244* (2013.01); *H01J 37/28* (2013.01); *H01J 37/20* (2013.01); *H01J 37/3177* (2013.01); *H01J 2237/2006* (2013.01); *H01J 2237/20214* (2013.01); *H01J 2237/2817* (2013.01)

(56) References Cited

U.S. PATENT DOCUMENTS

| | | |
|---|---|---|
| 2003/0155534 A1 | 8/2003 | Platzgummer et al. |
| 2006/0163475 A1 | 7/2006 | Choi et al. |
| 2007/0012562 A1 | 1/2007 | Le et al. |
| 2008/0149846 A1 | 6/2008 | Platzgummer |
| 2009/0212229 A1 | 8/2009 | Wieland et al. |
| 2011/0084220 A1 | 4/2011 | Koning et al. |
| 2011/0174985 A1 | 7/2011 | Peijster |
| 2012/0273691 A1 | 11/2012 | Van Den Brom et al. |
| 2012/0305798 A1 | 12/2012 | Zonnevylle et al. |
| 2013/0087706 A1 | 4/2013 | Kociak et al. |
| 2015/0348738 A1 | 12/2015 | Zeidler et al. |
| 2016/0203948 A1 | 7/2016 | Huynh et al. |
| 2017/0092461 A1 | 3/2017 | Kozakai et al. |
| 2017/0133194 A1 | 5/2017 | Zeidler et al. |
| 2018/0358199 A1* | 12/2018 | Kumamoto ............ H01J 37/22 |
| 2018/0364564 A1 | 12/2018 | Goldenshtein et al. |
| 2019/0103249 A1 | 4/2019 | Biberger et al. |
| 2019/0148106 A1* | 5/2019 | Fukuda ............. G01N 23/2251 250/311 |
| 2019/0189387 A1* | 6/2019 | Perel .................. H01J 37/3007 |
| 2019/0228958 A1 | 7/2019 | Fienberg et al. |
| 2020/0203116 A1 | 6/2020 | Winkler et al. |
| 2020/0251301 A1 | 8/2020 | Zeidler et al. |
| 2021/0391139 A1 | 12/2021 | Otten et al. |

FOREIGN PATENT DOCUMENTS

| | | |
|---|---|---|
| CN | 108735563 A | 11/2018 |
| JP | 63266742 | 2/1988 |
| JP | S63266742 A | 11/1988 |
| JP | 2004-040076 A | 2/2004 |
| JP | 2017-098429 A | 6/2017 |
| KR | 10-2007-0001746 | 1/2007 |
| TW | 200834751 A | 8/2008 |
| TW | 201044118 A | 12/2010 |
| TW | 201130009 A | 9/2011 |
| TW | 201618149 A | 5/2016 |
| WO | WO 2009127658 A1 | 10/2009 |
| WO | WO 2017213078 A1 | 12/2017 |

OTHER PUBLICATIONS

International Search Repot issued in related Foreign Application No. PCT/EP2021/064949; dated Sep. 16, 2021 (4 pgs.).

The extended European search report, pursuant to Rule 62 EPC, the European search report (R. 61 EPC) or the partial European search report/declaration of no search (R. 63 EPC) and the European search report, issued in related foreign Application No. 20197510.9, dated Mar. 21, 2018 (16 pgs.).

Wang, Qing-Ming et al.; "Characteristics of Shear Mode Piezoelectric Actuators"; 1996 IEEE 0-7803-3355-1/96 (4 pgs.).

Notice of Reasons for Rejection from the Japan Patent Office issued in related Japanese Patent Application No. 2022-567224; dated Aug. 9, 2023 (6 pgs.).

Notification Before Examination from the Israeli Patent Office issued in related Israeli Patent Application No. 298348; dated Jul. 2, 2023 (5 pgs.).

* cited by examiner

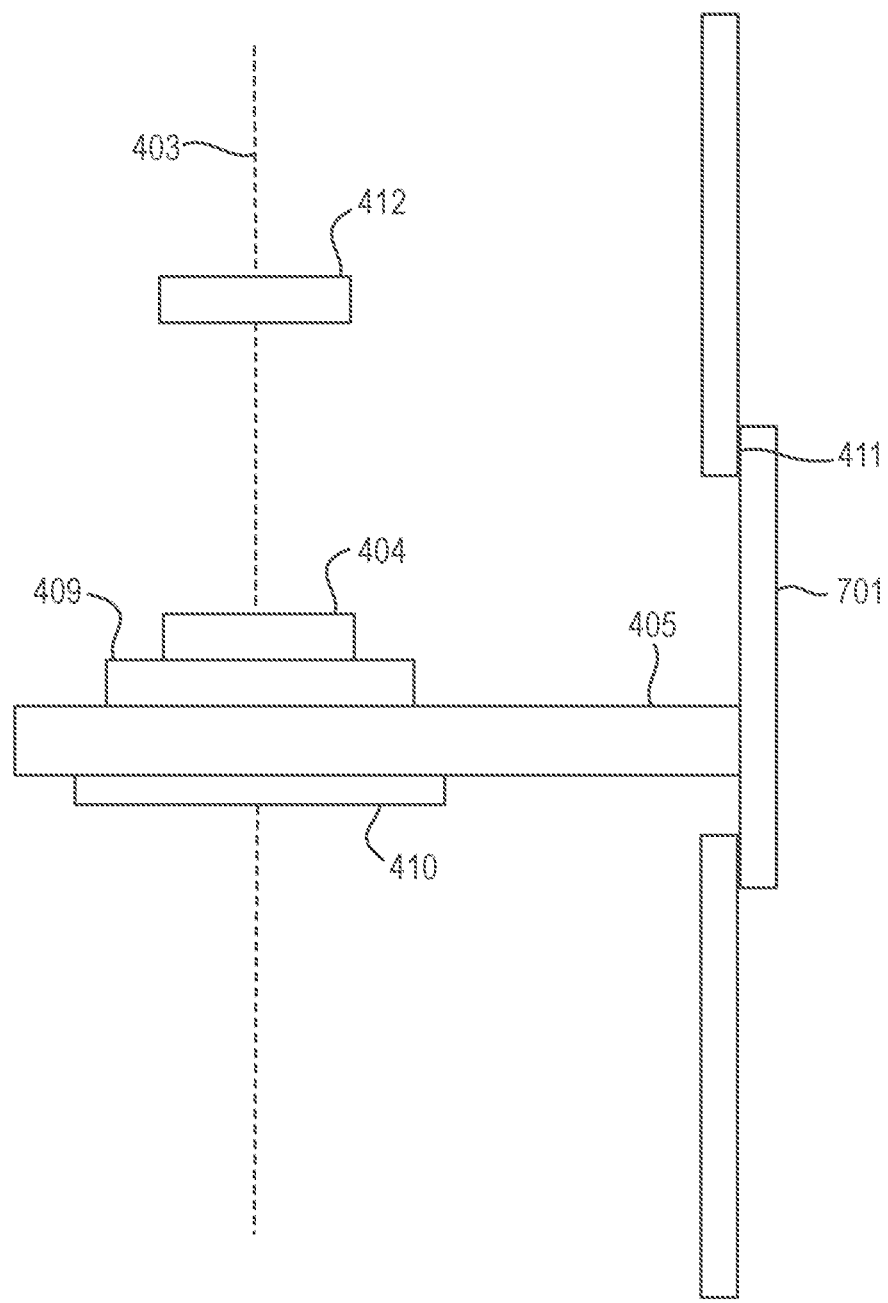

REPLACEABLE MODULE FOR A CHARGED PARTICLE APPARATUS

CROSS-REFERENCE TO RELATED APPLICATION

This application claims priority to U.S. Provisional Patent Application No. 63/037,481, filed on Jun. 10, 2020, and European Application No. 20197510.9, filed Sep. 22, 2020. The contents of these applications are incorporated herein by reference in their entireties.

FIELD

The embodiments provided herein generally relate the provision of an electron-optical assembly in a charged particle apparatus. An electron-optical assembly is configured to manipulate one or more beams of charged particles, such as by deflecting and/or focusing the beams of charged particles. Embodiments provide an electron-optical device on a module that is replaceable in the charged particle apparatus. Embodiments also provide techniques for appropriately aligning an electron-optical assembly with an incident source beam.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an import process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample.

Another application for a charged particle beam is lithography. The charged particle beam reacts with a resist layer on the surface of a substrate. A desired pattern in the resist can be created by controlling the locations on the resist layer that the charged particle beam is directed towards.

A charged particle apparatus may be an apparatus for generating, illuminating, projecting and/or detecting one or more beams of charged particles. Within a charged particle apparatus, one or more electron-optical devices are provided for manipulating one or more beams of charged particles.

There is a general need to improve on known techniques for providing an electron-optical device in a charged particle apparatus.

SUMMARY

The embodiments provided herein disclose a module that comprises an electron-optical device. The module is replaceable within a charged particle apparatus in the field. An electron-optical device may therefore be easily replaced by removing a module from the charged particle apparatus and re-installing the module with a different electron-optical device attached. Alternatively, a different module may be installed that comprises a different electron-optical device.

Embodiments also provide techniques for aligning the electron-optical device with the other components with the charged particle apparatus.

According to a first aspect of the invention, there is provided a module for supporting a device configured to manipulate charged particle paths in a charged particle apparatus, the module comprising: a support arrangement configured to support the device, wherein the device is configured to manipulate a charged particle path within the charged particle apparatus; and a support positioning system configured to move the support arrangement within the module; wherein the module is arranged to be field replaceable in the charged particle apparatus.

According to a second aspect of the invention, there is provided a module for supporting a device configured to manipulate the paths of charged particles in a charged particle apparatus, the module comprising: a module flange configured to attach to, and detach from, a housing flange of a housing of the charged particle apparatus such that the module is field replaceable in the charged particle apparatus.

According to a third aspect of the invention, there is provided a charged particle apparatus comprising a field replaceable module according to any of the first or second aspects.

According to a fourth aspect of the invention, there is provided a method of installing an electron-optical device within a charged particle apparatus, the method comprising: attaching an electron-optical device to a module; applying a coarse adjustment to the Rx state, Ry state and/or z-position of the electron optical device relative to a main body of the module; and securing the module to the charged particle apparatus.

According to a fifth aspect of the invention, there is provided a method of aligning an electron-optical device with a charged particle beam, or multi-beam, within a charged particle apparatus, the method comprising: securing a module comprising an electron-optical device to a charged particle apparatus to thereby install the electron-optical device in the charged particle apparatus; applying fine adjustment(s) to the x-position, y-position and/or Rz state of the electron optical device relative to a main body of the module; and applying an adjustment to the path of a charged particle beam, or multi-beam, within the charged particle apparatus.

According to a sixth aspect of the invention, there is provided an electron optical column configured to project an electron beam to a sample, the column comprising: a frame configured to define a frame of reference of the column; a chamber for accepting a field replaceable module comprising an electron-optical device; an engagement arrangement configured to engage with the field replaceable module to align the field replaceable module with the frame; and an active positioning system configured to position the beam and the device relative to each other for fine alignment.

According to a seventh aspect of the invention, there is provided a field replaceable module arranged to be removably insertable into an electron-optical column, the field replaceable module comprising: an electron-optical element configured to manipulate a path of an electron beam in the electron-optical column a support configured to support the electron optical element; and an engagement arrangement configured to align the support with a frame of the electron-optical column in all degrees of freedom.

Advantageously, the module according to embodiments allows an electron-optical device to be easily replaced without substantial disassembly of a charged particle apparatus.

Other advantages of the present invention will become apparent from the following description taken in conjunction with the accompanying drawings wherein are set forth, by way of illustration and example, certain embodiments of the present invention.

BRIEF DESCRIPTION OF FIGURES

The above and other aspects of the present disclosure will become more apparent from the description of exemplary embodiments, taken in conjunction with the accompanying drawings.

FIG. 4B is a schematic diagram of part of a charged particle apparatus according an embodiment.

Figure 1:
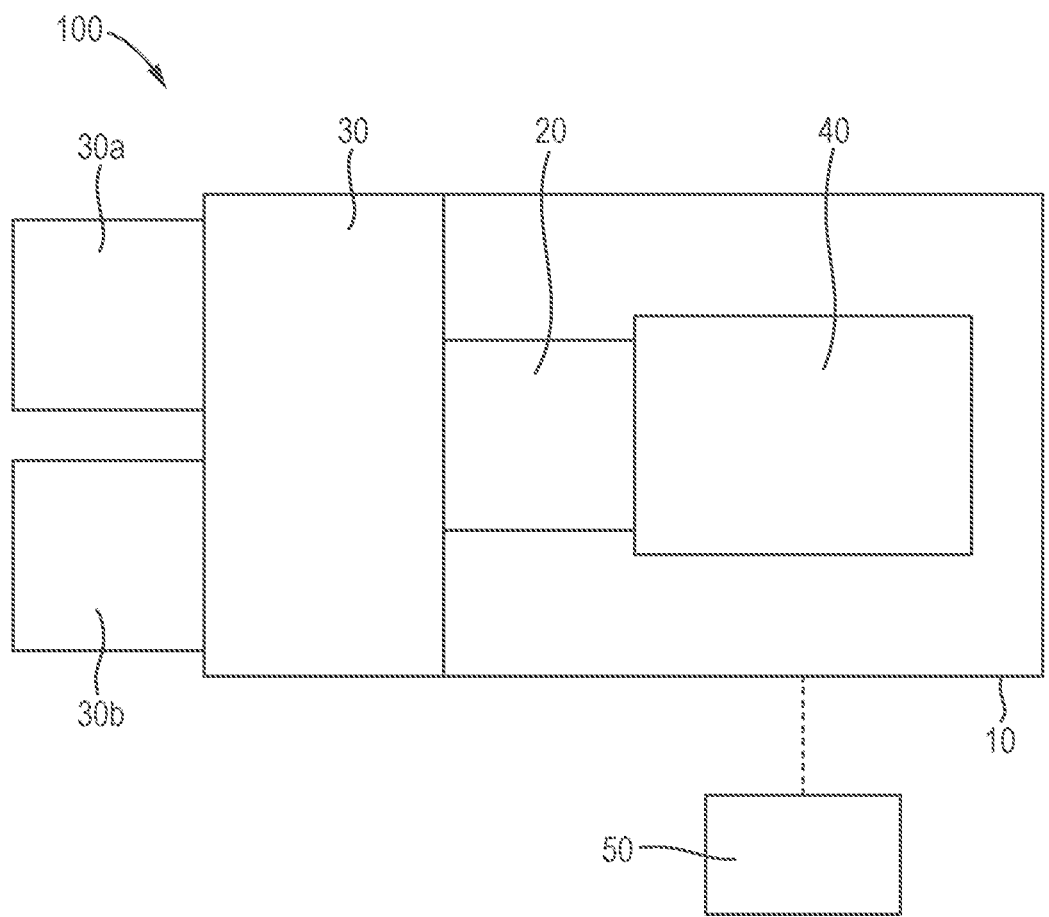
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

DETAILED DESCRIPTION

The reduction of the physical size of devices, and enhancement of the computing power of electronic devices may be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than $\frac{1}{1000}$th of a human hair. Thus, it is not surprising that semiconductor IC manufacturing is a complex and time-consuming process, with hundreds of individual steps. Errors in even one step have the potential to dramatically affect the functioning of the final product. Just one "killer defect" may cause device failure. The goal of the manufacturing process is to improve the overall yield of the process. For example, to obtain a 75% yield for a 50-step process (where a step may indicate the number of layers formed on a wafer), each individual step must have a yield greater than 99.4%. If an individual step has a yield of 95%, the overall process yield would be as low as 7-8%.

While high process yield is desirable in an IC chip manufacturing facility, maintaining a high substrate (i.e. wafer) throughput, defined as the number of substrates processed per hour, is also essential. High process yield and high substrate throughput may be impacted by the presence of a defect. This is especially if operator intervention is required for reviewing the defects. Thus, high throughput detection and identification of micro and nano-scale defects by inspection tools (such as a Scanning Electron Microscope ('SEM')) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. The primary electrons interact with the sample and generate interaction products, such as secondary electrons and/or backscattered electrons. The detection apparatus captures the secondary electrons and/or backscattered electrons from the sample as the sample is scanned so that the SEM may create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam may scan different parts of a sample simultaneously. A multi-beam inspection apparatus may therefore inspect a sample at a much higher speed than a single-beam inspection apparatus.

In a multi-beam inspection apparatus, the paths of some of the primary electron beams are displaced away from the central axis, i.e. a mid-point of the primary electron-optical axis (also referred to herein as the charged particle axis), of the scanning device. To ensure all the electron beams arrive at the sample surface with substantially the same angle of incidence, sub-beam paths with a greater radial distance from the central axis need to be manipulated to move through a greater angle than the sub-beam paths with paths closer to the central axis. This stronger manipulation may cause aberrations that cause the resulting image to be blurry and out-of-focus. An example is spherical aberrations which bring the focus of each sub-beam path into a different focal plane. In particular, for sub-beam paths that are not on the central axis, the change in focal plane in the sub-beams is greater with the radial displacement from the central axis. Such aberrations and de-focus effects may remain associated with the secondary electrons from the target when they are detected, for example the shape and size of the spot formed by the sub-beam on the target will be affected. Such aberrations therefore degrade the quality of resulting images that are created during inspection.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, an electron beam tool 40, an equipment front end module (EFEM) 30 and a controller 50.

EFEM 30 includes a first loading port 30a and a second loading port 30b. EFEM 30 may include additional loading port(s). First loading port 30a and second loading port 30b may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas molecules in main chamber 10 so that the pressure around the sample reaches a second pressure lower than the first pressure. After reaching the second pressure, the sample is transported to the electron beam tool by which it may be inspected. An electron beam tool 40 may comprise either a single beam or a multi-beam electron-optical apparatus.

Controller 50 is electronically connected to electron beam tool 40. Controller 50 may be a processor (such as a computer) configured to control the charged particle beam inspection apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam inspection apparatus or it may be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
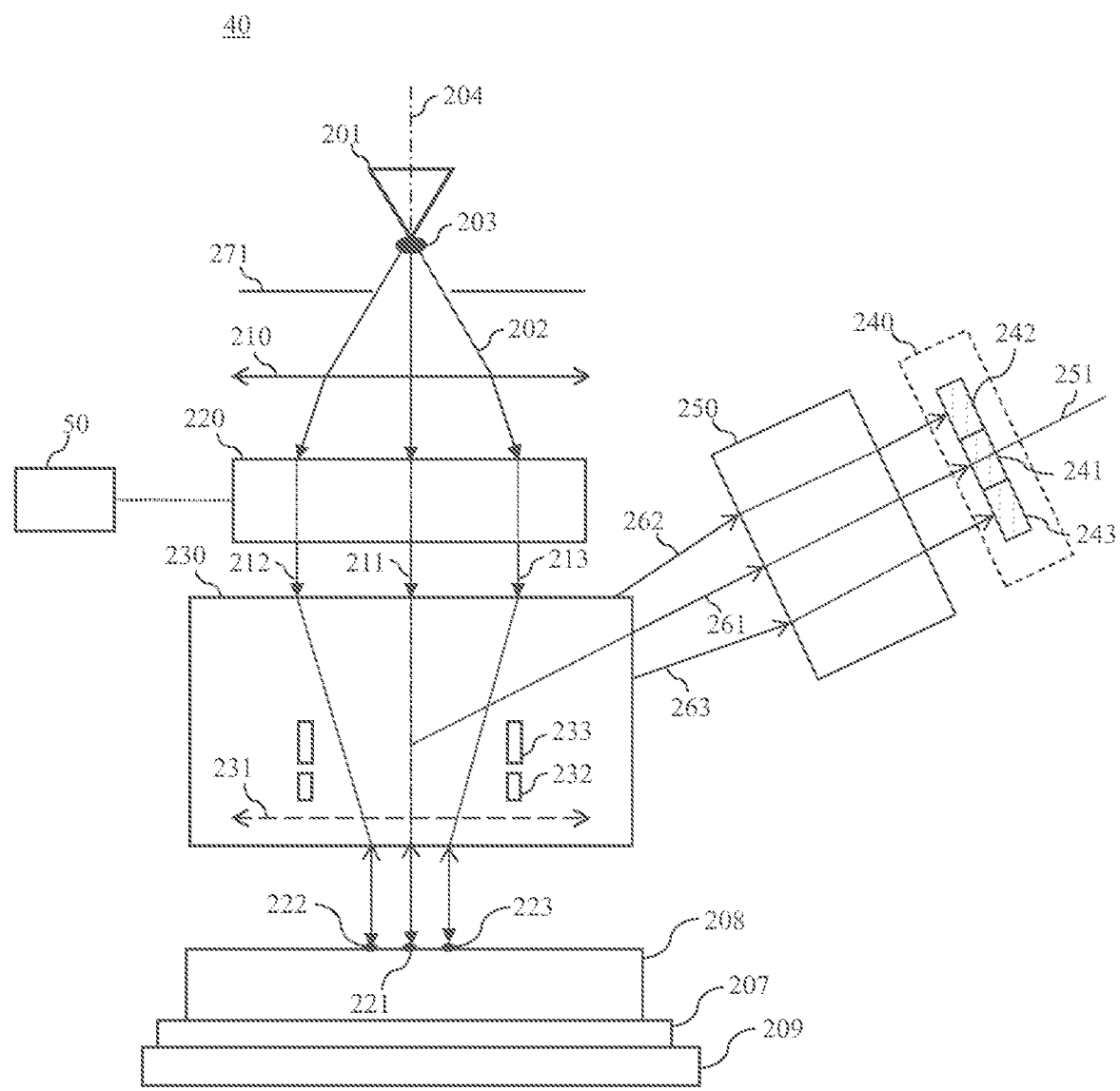
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam tool 40 including a multi-beam inspection tool that is part of the exemplary charged particle beam inspection apparatus 100 of FIG. 1. Multi-beam electron beam tool 40 (also referred to herein as apparatus 40) comprises an electron source 201, a gun aperture plate 271, a condenser lens 210, a source conversion unit 220, a primary projection apparatus 230, a motorized stage 209, and a sample holder 207. The electron source 201, a gun aperture plate 271, a condenser lens 210, a source conversion unit 220 are the components of an illumination apparatus comprised by the multi-beam electron beam tool 40. The sample holder 207 is supported by motorized stage 209 so as to hold a sample 208 (e.g., a substrate or a mask) for inspection. Multi-beam electron beam tool 40 may further comprise a secondary projection apparatus 250 and an associated electron detection device 240. Primary projection apparatus 230 may comprise an objective lens 231. Electron detection device 240 may comprise a plurality of detection elements 241, 242, and 243. A beam separator 233 and a deflection scanning unit 232 may be positioned inside primary projection apparatus 230.

The components that are used to generate a primary beam may be aligned with a primary electron-optical axis of the apparatus 40. These components may include: the electron source 201, gun aperture plate 271, condenser lens 210, source conversion unit 220, beam separator 233, deflection scanning unit 232, and primary projection apparatus 230. Secondary projection apparatus 250 and its associated electron detection device 240 may be aligned with a secondary electron-optical axis 251 of apparatus 40.

The primary electron-optical axis 204 is comprised by the electron-optical axis of the of the part of electron beam tool 40 that is the illumination apparatus. The secondary electron-optical axis 251 is the electron-optical axis of the of the part of electron beam tool 40 that is a detection apparatus. The primary electron-optical axis 204 may also be referred to herein as the primary optical axis (to aid ease of reference) or charged particle optical axis. The secondary electron-optical axis 251 may also be referred to herein as the secondary optical axis or the secondary charged particle optical axis.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202 that forms a primary beam crossover (virtual or real) 203. Primary electron beam 202 may be visualized as being emitted from primary beam crossover 203.

The formed primary electron beam 202 may be a single beam and a multi-beam may be generated from the single beam. At different locations along the beam path, the primary electron beam 202 may therefore be either a single beam or a multi-beam. By the time it reaches the sample, and preferably before it reaches the projection apparatus, the primary electron beam 202 is a multi-beam. Such a multi-beam may be generated from the primary electron beam in a number of different ways. For example, the multi-beam may be generated by a multi-beam array located before the cross-over 203, a multi-beam array located in the source conversion unit 220, or a multi-beam array located at any point in between these locations. A multi-beam array may comprise a plurality of electron beam manipulating elements arranged in an array across the beam path. Each manipulating element may influence at least part of the primary electron beam to generate a sub-beam. Thus the multi-beam array interacts with an incident primary beam path to generate a multi-beam path down-beam of the multi-beam array. The interaction of the multi-beam array with the primary beam may include one or more aperture arrays, individual deflectors e.g. per sub-beam, lenses, stigmators and (aberration) correctors, again e.g. per sub-beam.

Gun aperture plate 271, in operation, is configured to block off peripheral electrons of primary electron beam 202 to reduce Coulomb effect. The Coulomb effect may enlarge the size of each of probe spots 221, 222, and 223 of primary sub-beams 211, 212, 213, and therefore deteriorate inspection resolution. A gun aperture plate 271 may also include multiple openings for generating primary sub-beams (not shown) even before the source conversion unit 220 and may be referred to as a coulomb aperture array.

Condenser lens 210 is configured to focus (or collimate) primary electron beam 202. In an embodiment, the condenser lens 210 may be designed to focus (or collimate) primary electron beam 202 to become a substantially parallel beam and be substantially normally incident onto source conversion unit 220. Condenser lens 210 may be a movable condenser lens that may be configured so that the position of its principle plane is movable. In an embodiment, the movable condenser lens may be configured to physically move, e.g. along the optical axis 204. Alternatively, the movable condenser lens may be constituted of two or more electro-optical elements (lenses) in which the principle plane of the condenser lens moves with a variation of the strength of the individual electro-optical elements. The (movable) condenser lens may be configured to be magnetic, electrostatic or a combination of magnetic and electrostatic lenses. In a further embodiment, the condenser lens 210 may be an anti-rotation condenser lens. The anti-rotation condenser lens may be configured to keep the rotation angles unchanged when the focusing power (collimating power) of condenser lens 210 is changed and/or when the principle plane of the condenser lens moves.

In an embodiment of the source conversion unit 220, the source conversion unit 220 may comprise an image-forming element array, an aberration compensator array, a beam-limit aperture array, and a pre-bending micro-deflector array. The pre-bending micro-deflector array may, for example, be optional and may be present in an embodiment in which the condenser lens does not ensure substantially normal incidence of sub-beams originating from the coulomb aperture array onto e.g. the beam-limit aperture array, the image-forming element array, and/or the aberration compensator array. The image-forming element array may be configured to generate the plurality of sub-beams in the multi-beam path, i.e. primary sub-beams 211, 212, 213. The image forming element array may, for example, comprise a plurality electron beam manipulators such as micro-deflectors micro-lenses (or a combination of both) to influence the plurality of primary sub-beams 211, 212, 213 of primary electron beam 202 and to form a plurality of parallel images (virtual or real) of primary beam crossover 203, one for each of the primary sub-beams 211, 212, and 213. The aberration compensator array may, for example, comprise a field curvature compensator array (not shown) and an astigmatism compensator array (not shown). The field curvature compensator array may, for example, comprise a plurality of micro-lenses to compensate field curvature aberrations of the primary sub-beams 211, 212, and 213. The astigmatism compensator array may comprise a plurality of micro-stigmators to compensate astigmatism aberrations of the primary sub-beams 211, 212, and 213. The beam-limit aperture array may be configured to define the diameters of individual primary sub-beams 211, 212, and 213. FIG. 2 shows three primary sub-beams 211, 212, and 213 as an example, and it should be understood that source conversion unit 220 may be configured to form any number of primary sub-beams. Controller 50 may be connected to various parts of charged particle beam inspection apparatus 100 of FIG. 1, such as source conversion unit 220, electron detection device 240, primary projection apparatus 230, or motorized stage 209. As explained in further detail below, controller 50 may perform various image and signal processing functions. Controller 50 may also generate various control signals to govern operations of the charged particle beam inspection apparatus, including the charged particle multi-beam apparatus.

Condenser lens 210 may further be configured to adjust electric currents of primary sub-beams 211, 212, 213 downbeam of source conversion unit 220 by varying the focusing power (collimating power) of condenser lens 210. Alternatively, or additionally, the electric currents of the primary sub-beams 211, 212, 213 may be changed by altering the radial sizes of beam-limit apertures within the beam-limit aperture array corresponding to the individual primary sub-beams.

Objective lens 231 may be configured to focus sub-beams 211, 212, and 213 onto the sample 208 for inspection and, in the current embodiment, may form three probe spots 221, 222, and 223 on the surface of sample 208.

Beam separator 233 may be, for example, a Wien filter comprising an electrostatic dipole field and a magnetic dipole field (not shown in FIG. 2). In operation, beam separator 233 may be configured to exert an electrostatic force by electrostatic dipole field on individual electrons of primary sub-beams 211, 212, and 213. In an embodiment, the electrostatic force is equal in magnitude but opposite in direction to the magnetic force exerted by magnetic dipole field of beam separator 233 on the individual primary electrons of the primary sub-beams 211, 212, and 213. Primary sub-beams 211, 212, and 213 may therefore pass at least substantially straight through beam separator 233 with at least substantially zero deflection angles. The direction of the magnetic force depends on the direction of motion of the electrons while the direction of the electrostatic force does not depend on the direction of motion of the electrons. So because the secondary electrons and backscattered electrons generally move in an opposite direction compared to the primary electrons, the magnetic force exerted on the secondary electrons and backscattered electrons will no longer cancel the electrostatic force and as a result the secondary electrons and backscattered electrons moving through the beam separator 233 will be deflected away from the optical axis 204.

Deflection scanning unit 232, in operation, is configured to deflect primary sub-beams 211, 212, and 213 to scan probe spots 221, 222, and 223 across individual scanning areas in a section of the surface of sample 208. In response to incidence of primary sub-beams 211, 212, and 213 or probe spots 221, 222, and 223 on sample 208, electrons are generated from the sample 208 which include secondary electrons and backscattered electrons. In the current embodiment, the secondary electrons propagate in three secondary electron beams 261, 262, and 263. The secondary electron beams 261, 262, and 263 typically have secondary electrons (having electron energy ≤50 eV) and may also have at least some of the backscattered electrons (having electron energy between 50 eV and the landing energy of primary sub-beams 211, 212, and 213). The beam separator 233 is arranged to deflect the path of the secondary electron beams 261, 262, and 263 towards the secondary projection apparatus 250. The secondary projection apparatus 250 subsequently focuses the path of secondary electron beams 261, 262, and 263 onto a plurality of detection regions 241, 242, and 243 of electron detection device 240. The detection regions may, for example, be the separate detection elements 241, 242, and 243 that are arranged to detect corresponding secondary electron beams 261, 262, and 263. The detection regions may generate corresponding signals which are, for example, sent to controller 50 or a signal processing system (not shown), e.g. to construct images of the corresponding scanned areas of sample 208.

The detection elements 241, 242, and 243 may detect the corresponding secondary electron beams 261, 262, and 263. On incidence of secondary electron beams with the detection elements 241, 242 and 243, the elements may generate corresponding intensity signal outputs (not shown). The outputs may be directed to an image processing system (e.g., controller 50). Each detection element 241, 242, and 243 may comprise one or more pixels. The intensity signal output of a detection element may be a sum of signals generated by all the pixels within the detection element.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled to the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, may be used in combination with corresponding scan path data of each of primary sub-beams 211, 212, and 213 incident on the sample surface, to reconstruct images of the sample structures under inspection. The reconstructed images may be used to reveal various features of the internal or external structures of sample 208. The reconstructed images m thereby be used to reveal any defects that may exist in the sample.

The controller 50 may, e.g. further control the motorized stage 209 to move the sample 208 during, before or after inspection of the sample 208. In an embodiment, the controller 50 may enable the motorized stage 209 to move sample 208 in a direction, e.g. continuously, for example at a constant speed, at least during sample inspection. The controller 50 may control movement of the motorized stage 209 so that the speed of the movement of the sample 208 changes, e.g. dependent on various parameters. For example, the controller may control the stage speed (including its direction) depending on the characteristics of the inspection steps of scanning process.

Although FIG. 2 shows that apparatus 40 uses three primary electron sub-beams, it is appreciated that apparatus 40 may use two or more number of primary electron sub-beams. The present disclosure does not limit the number of primary electron beams used in apparatus 40.

Figure 3:
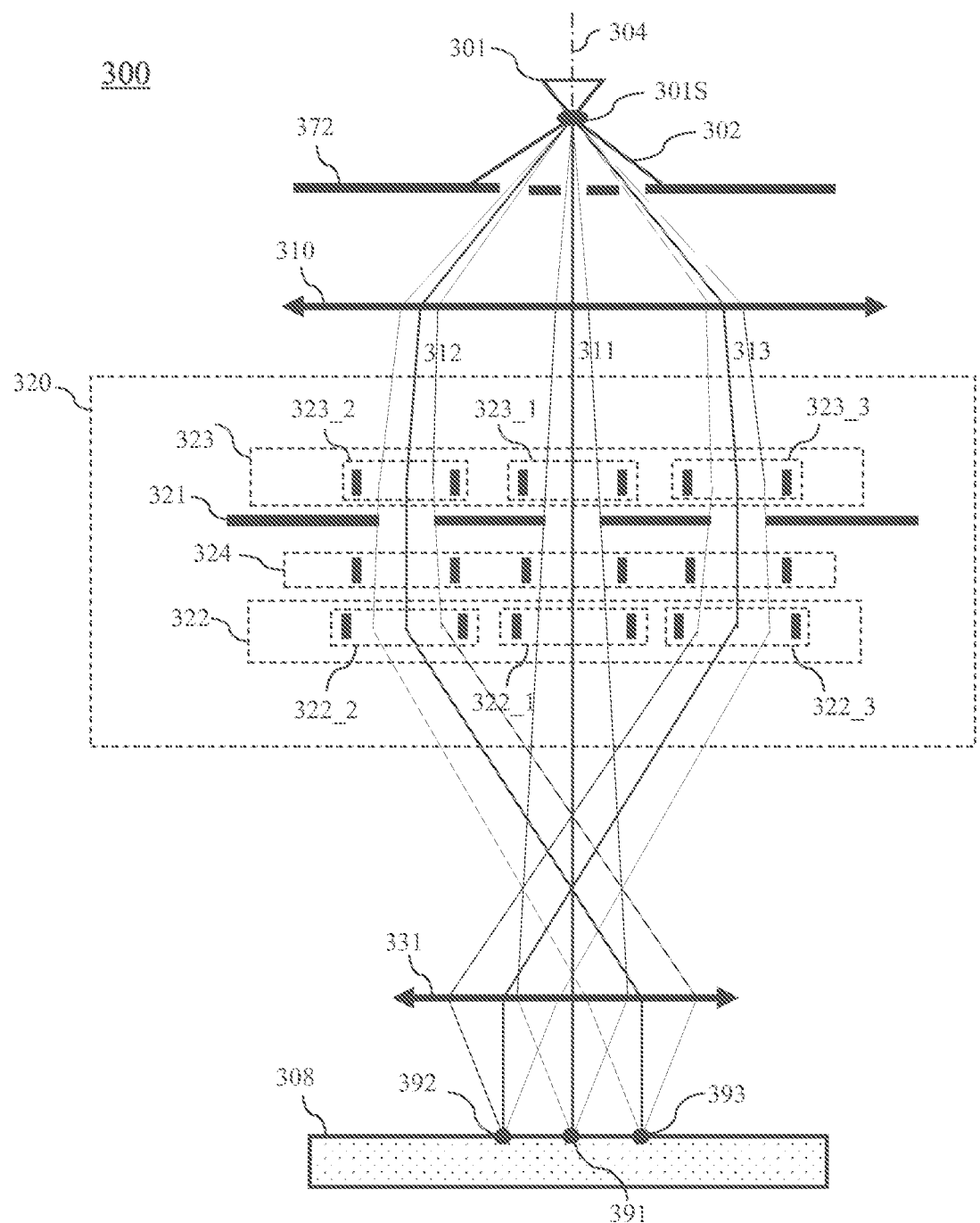
FIG. 3 is a schematic diagram of exemplary multi-beam apparatus illustrating an exemplary configuration of source conversion unit of the exemplary charged particle beam inspection apparatus of FIG. 1.

Reference is now made to FIG. 3, which is a schematic diagram of exemplary multi-beam apparatus illustrating an exemplary configuration of source conversion unit of the exemplary charged particle beam inspection apparatus of FIG. 1. The apparatus 300 may comprise an election source 301, a pre-sub-beam-forming aperture array 372 (further also referred to as coulomb aperture array 372), a condenser lens 310 (similar to condenser lens 210 of FIG. 2), a source conversion unit 320, an objective lens 331 (similar to objective lens 231 of FIG. 2), and a sample 308 (similar to sample 208 of FIG. 2). The election source 301, the coulomb aperture array 372, the condenser lens 310 may be the components of an illumination apparatus comprised by the apparatus 300. The source conversion unit 320 and objective lens 331 may be the components of a projection apparatus comprised by the apparatus 300. The source conversion unit 320 may be similar to source conversion unit 220 of FIG. 2 in which the image-forming element array of FIG. 2 is image-forming element array 322, the aberration compensator array of FIG. 2 is aberration compensator array 324, the beam-limit aperture array of FIG. 2 is beam-limit aperture array 321, and the pre-bending micro-deflector array of FIG. 2 is pre-bending micro-deflector array 323. The election source 301, the coulomb aperture array 372, the condenser lens 310, the source conversion unit 320, and the objective lens 331 are aligned with a primary electron-optical axis 304 of the apparatus. The electron source 301 generates a primary-electron beam 302 generally along the primary electron-optical axis 304 and with a source crossover (virtual or real) 301S. The coulomb aperture array 372 cuts the peripheral electrons of primary electron beam 302 to reduce a consequential Coulomb effect. The primary-electron beam 302 may be trimmed into a specified number of sub-beams, such as three sub-beams 311, 312 and 313, by the coulomb aperture array 372 of a pre-sub-beam-forming mechanism. Although three sub-beams and their paths are referred to in the previous and following description, it should be understood that the description is intended to apply an apparatus, tool, or system with any number of sub-beams.

The source conversion unit 320 may include a beamlet-limit aperture array 321 with beam-limit apertures configured to define the outer dimensions of the sub-beams 311, 312, and 313 of the primary electron beam 302. The source conversion unit 320 may also include an image-forming element array 322 with image-forming micro-deflectors, 322_1, 322_2, and 322_3. There is a respective micro-deflector associated with the path of each sub-beam. The micro-deflectors 322_1, 322_2, and 322_3 are configured to deflect the paths of the sub-beams 311, 312, and 313 towards the electron-optical axis 304. The deflected sub-beams 311, 312 and 313 form virtual images (not shown) of source crossover 301S. In the current embodiment, these virtual images are projected onto the sample 308 by the objective lens 331 and form probe spots thereon, which are the three probe spots, 391, 392, and 393. Each probe spot corresponds to the location of incidence of a sub-beam path on the sample surface. The source conversion unit 320 may further comprise an aberration compensator array 324 configured to compensate aberrations that may be present in each of the sub-beams. The aberration compensator array 324 may, for example, include a field curvature compensator array (not shown) with micro-lenses. The field curvature compensator and micro-lenses may, for example, be configured to compensate the individual sub-beams for field curvature aberrations evident in the probe spots, 391, 392, and 393. The aberration compensator array 324 may include an astigmatism compensator array (not shown) with micro-stigmators. The micro-stigmators may, for example, be controlled to operate on the sub-beams to compensate astigmatism aberrations that are otherwise present in the probe spots, 391, 392, and 393.

The source conversion unit 320 may further comprise a pre-bending micro-deflector array 323 with pre-bending micro-deflectors 323_1, 323_2, and 323_3 to bend the sub-beams 311, 312, and 313 respectively. The pre-bending micro-deflectors 323_1, 323_2, and 323_3 may bend the path of the sub-beams onto the beamlet-limit aperture array 321. In an embodiment, the pre-bending micro-deflector array 323 may be configured to bend the sub-beam path of sub-beams towards the orthogonal of the plane of on beamlet-limit aperture array 321. In an alternative embodiment the condenser lens 310 may adjust the path direction of the sub-beams onto the beamlet-limit aperture array 321. The condenser lens 310 may, for example, focus (collimate) the three sub-beams 311, 312, and 313 to become substantially parallel beams along primary electron-optical axis 304, so that the three sub-beams 311, 312, and 313 incident substantially perpendicularly onto source conversion unit 320, which may correspond to the beamlet-limit aperture array 321. In such alternative embodiment the pre-bending micro-deflector array 323 may not be necessary.

The image-forming element array 322, the aberration compensator array 324, and the pre-bending micro-deflector array 323 may comprise multiple layers of sub-beam manipulating devices, some of which may be in the form or arrays, for example: micro-deflectors, micro-lenses, or micro-stigmators.

In the current example of the source conversion unit 320, the sub-beams 311, 312 and 313 of the primary electron beam 302 are respectively deflected by the micro-deflectors 322_1, 322_2 and 322_3 of image-forming element array 322 towards the primary electron-optical axis 304. It should be understood that the sub-beam 311 path may already correspond to the electron-optical axis 304 prior to reaching micro-deflector 322_1, accordingly the sub-beam 311 path may not be deflected by micro-deflector 322_1.

The objective lens 331 focuses the sub-beams onto the surface of the sample 308, i.e., it projects the three virtual images onto the sample surface. The three images formed by three sub-beams 311 to 313 on the sample surface form three probe spots 391, 392 and 393 thereon. In an embodiment the deflection angles of sub-beams 311 to 313 are adjusted to pass through or approach the front focal point of objective lens 331 to reduce or limit the off-axis aberrations of three probe spots 391 to 393.

In the embodiment of a multi-beam inspection tool 300 as shown in FIG. 3 the beam path of the secondary electrons, beam separator (similar as Wien filter 233), secondary projection optics (similar as secondary projection optics 250 of FIG. 2) and electron detection device (similar as electron detection device 240) have been omitted for clarity reasons. Is should be clear however that similar beam separator, secondary projection optics and electron detection device may be present in the current embodiment of FIG. 3 to register and generate an image of the sample surface using the secondary electrons or backscattered electrons.

At least some of the above-described components in FIG. 2 and FIG. 3 may individually, or in combination with each other, be referred to as a manipulator array, or manipulator, because they manipulate one or more beams, or sub-beams, of charged particles.

The above described embodiments of multi-beam inspection tools comprise a multi-beam charged particle apparatus, that may be referred to as a multi-beam charged particle optical apparatus, with a single source of charged particles. The multi-beam charged particle apparatus comprises an illumination apparatus and a projection apparatus. The illumination apparatus may generate a multi-beam of charged particles from the beam of electrons from the source. The projection apparatus projects a multi-beam of charged particles towards a sample. At least part of the surface of a sample may be scanned with the multi-beam of charged particles.

A multi-beam charged particle apparatus comprises one or more electron-optical devices for manipulating the sub-beams of the multi-beam of charged particles. The applied manipulation may be, for example, a deflection of the paths of sub-beams and/or a focusing operation applied to the sub-beams. The one or more electron-optical devices may comprise MEMS.

The charged particle apparatus may comprise beam path manipulators located up-beam of the electron-optical device and, optionally, in the electron-optical device. Beam paths may be manipulated linearly in directions orthogonal to the charged particle axis, i.e. optical axis, by, for example, two electrostatic deflector sets operating across the whole beam. The two electrostatic deflector sets may be configured to deflect the beam path in orthogonal directions. Each electrostatic deflector set may comprise two electrostatic deflectors located sequentially along the beam path. The first electrostatic deflector of each set applies a correcting deflection and the second electrostatic deflector restores the beam to the correct angle of incidence on the electron-optical device. The correcting deflection applied by the first electrostatic deflector may be an over correction so that the second electrostatic deflector can apply a deflection for ensuring the desired angle of incidence to the MEMS. The location of the electrostatic deflector sets could be at a number of locations up-beam of the electron-optical device. Beam paths may be manipulated rotationally. Rotational corrections may be applied by a magnetic lens. Rotational corrections may additionally, or alternatively, be achieved by an existing magnetic lens such as the condenser lens arrangement.

It may be necessary to replace an electron-optical device in a charged particle apparatus, such as a multi-beam charged particle apparatus. For example, a different electron-optical device may be required for a particular application, such as requiring a different beam specification of the charged particle apparatus. Another example is if an electron-optical device within the charged particle apparatus develops a fault and needs to be replaced.

Known techniques for replacing an electron-optical device in a charged particle apparatus comprise at least partially disassembling the charged particle apparatus so that a replacement electron-optical device can be installed. A consequence of the at least partial disassembly is that vacuum conditions within the charged particle apparatus are lost. After the replacement electron-optical device has been installed, it is then necessary for the charged particle apparatus to be re-assembled. The vacuum conditions within the charged particle apparatus then need to be restored and this process alone may take a number of hours. The known techniques for replacing an electron-optical device in a charged particle apparatus are therefore complicated and time consuming.

It is also necessary for a replacement electron-optical device to be appropriately positioned within the charged particle apparatus so that it is appropriately aligned with a beam, or multi-beam, of charged particle paths.

Embodiments improve on the known techniques for replacing an electron-optical device in a charged particle apparatus. Embodiments also provide coarse and/or fine positioning techniques for appropriately aligning an electron-optical device with a beam, or multi-beam, of charged particle paths in up to six degrees of freedom.

According to embodiments, an electron-optical device is supported within a charged particle apparatus, such as a multi-beam charged particle apparatus, by a module. The module can be easily removed from, and re-inserted into, the charged particle apparatus. The module is therefore a field replaceable component of the charged particle apparatus. Field replaceable is intended to mean that the component can be replaced in a factory where the charged particle apparatus is operated without having to dismantle the charged particle apparatus. A component may be easily removed and replaced efficiently so that there is little downtime of the tool and the mechanical process is as simple as possible. Advantageously, this attempts to maximize the operational time as well as reduce the repair time and resources required to replace the component. The process of replacing an electron-optical device in a charged particle apparatus therefore comprises removing the module, replacing the electron-optical device supported by the module and then re-inserting the module into the charged particle apparatus. Alternatively, a different module comprising a different electron-optical device may be inserted into the charged particle apparatus. Advantageously, a substantial disassembly and re-assembly of at least part of the charged particle apparatus is not required. If an electron-optical device needs to be replaced, for example due to a change of use of the charged particle apparatus or a fault with the electron-optical device occurring, the down time of the charged particle apparatus may be substantially reduced.

The electron-optical device, as supported by a module according to embodiments, may comprise MEMS devices and a PCB. The PCB may provide a stage for the MEMS devices. The MEMS devices of the electron-optical device may be for manipulating a beam or multi-beam of charged particles. The electron-optical device may be secured to a stage in the module.

Embodiments include providing vacuum locks in the charged particle apparatus so that the part of the charged particle apparatus that houses the replaceable module can be isolated from vacuum conditions in the rest of the charged particle apparatus. Advantageously, after a module has been inserted, the time required to establish vacuum conditions is substantially less than that required to establish vacuum conditions in the entire charged particle apparatus.

The module according to embodiments may be configured so the electron-optical device can be moved relative a main body of the module. This movement allows the electron-optical device to be re-positioned after the module has been installed so that the electron-optical device 404 can be appropriately aligned with a charged particle beam, or multi-beam.

Embodiments are described in more detail below.

Figure 4A:
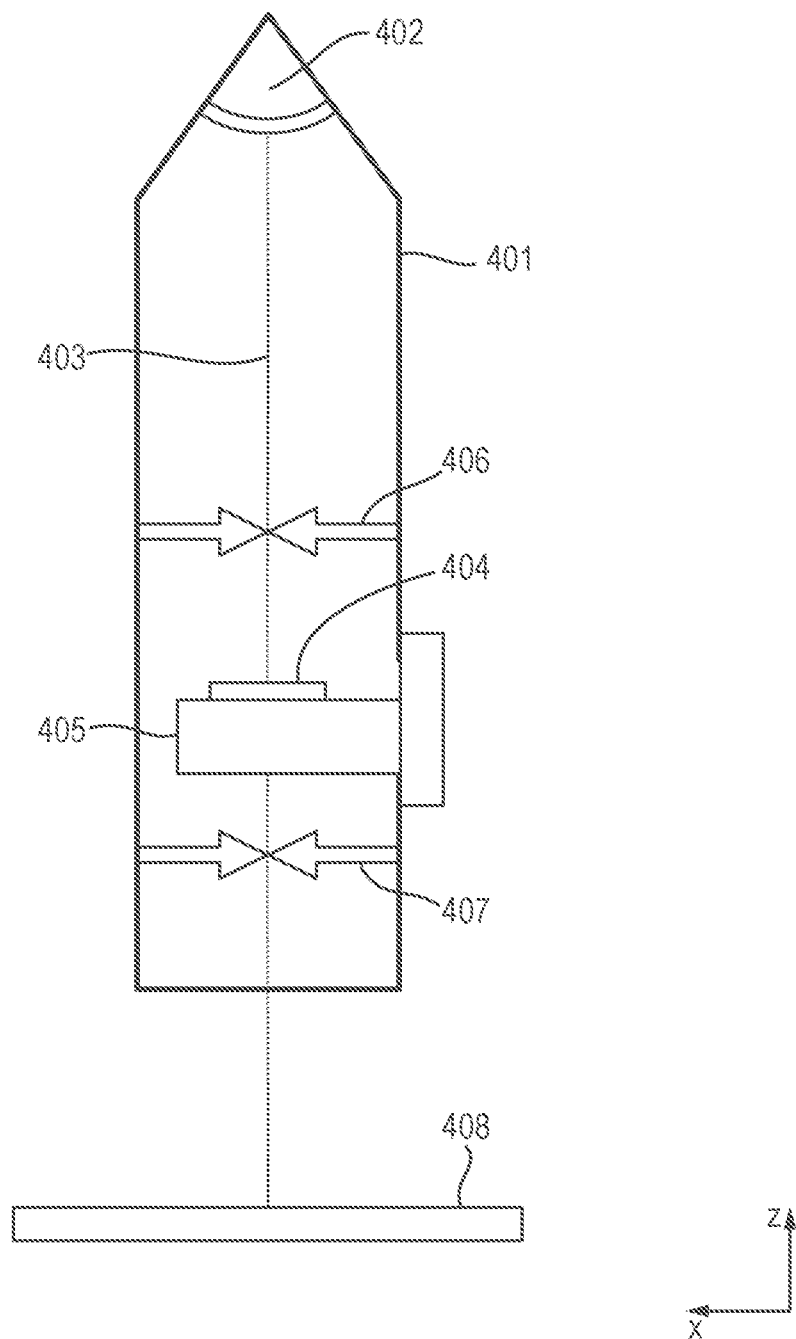
FIG. 4A is a schematic diagram of part of a charged particle apparatus according an embodiment.

FIG. 4A is a schematic diagram of part of a charged particle apparatus 401 according an embodiment. FIG. 4B is a schematic diagram of part of the charged particle apparatus 401 shown in FIG. 4A.

The charged particle apparatus 401 comprises a source 402. The source 402 emits a charged particle beam, referred to herein as a source beam. Similar to the earlier described optical axis 204 and 304, within the charged particle apparatus 401 there is a charged particle axis. A charged particle beam path 403, referred to herein as a charged particle path 403, that may be a multi-beam path, may be substantially along the charged particle axis.

An electron-optical device 404 is provided in the charged particle path 403. The electron-optical device 404 may be supported in the charged particle path 403 by the module 405. There is an opening in the wall of the charged particle apparatus 401 so that the module 405, and thereby the electron-optical device 404 supported by the module 405, are replaceable components of the charged particle apparatus 401. The charged particle apparatus 401 comprises an up-beam vacuum lock 406. The up-beam vacuum lock 406 is closer to the source 402 than the module 405. The charged particle apparatus 401 also comprises a down-beam vacuum lock 407. The down-beam vacuum lock 407 is further from the source 402 than the module 405. In operation, sample/substrate 408 is irradiated by a beam, or multi-beam, of charged particles emitted from the charged particle apparatus 401.

Embodiments include a number of techniques for ensuring that the electron-optical device 404 is appropriately aligned with the charged particle path 403. Appropriate alignment may require position adjustments of the electron-optical device 404 and/or the charged particle path 403 in a number of degrees of freedom. In particular, the charged particle path 403 may define a z-direction. In a plane that is orthogonal to the charged particle path 403, orthogonal x-directions and y-directions may be defined. Up to six degrees of freedom may be defined as linear position adjustments in the x-direction, y-direction and z-direction, as well as rotational position adjustments about an x-axis (i.e. Rx), a y-axis (i.e. Ry) and a z-axis (i.e. Rz). It may be worth noting that some of the devices which may be mounted to a field replaceable module may be planar or have a planar structure. In operation, the structure may be alignable with the plane orthogonal to the beam path; thus the planar structure may be in the x axis and the y axis and be rotatable around Rz.

Embodiments include coarse alignment techniques and fine alignment techniques using coarse alignment systems and fine alignment systems for applying position adjustments. The coarse alignment techniques may include pre-calibration techniques using pre-calibration systems.

The coarse alignment systems may position the electron-optical device 404 in a known region relative to the physical structure of the charged particle apparatus 401. For example, the coarse alignment systems may position the electron-optical device 404 in a known region relative to the housing of the charged particle apparatus 401 and/or a vacuum chamber in the charged particle apparatus 401 for receiving the module 405. The coarse alignment systems are provided by the connection between a flange 701 of the module 405 and the charged particle apparatus 401, as indicated by 411 in FIG. 4B. That is to say, the coarse alignment systems permit the securing of the module 405 to the charged particle apparatus 401, such as by a frame (not shown), to secure the module in the frame of reference of the of charged particle apparatus 401. Alignment pins are used in the connection between the flange 701 and the charged particle apparatus 401. The alignment pins may allow the position of the module 405 to be known relative to the charged particle apparatus 401 in up to six degrees of freedom. The position of the module 405 is known subject to the tolerances of the coarse alignment process. The coarse positioning systems are described in more detail later in the sixth embodiment.

The pre-calibration systems according to embodiments may be applied before the module 405 is inserted into the charged particle apparatus 401. The pre-calibration systems are indicated by 410 in FIG. 4B. The pre-calibration systems adjust the position of an electron-optical device 404, that has been secured to a module 405, relative to the main body of the module 405 and in particular relative to the flange 701 of the module 405. The pre-calibration systems may adjust the position of an electron-optical device 404 relative to the flange 701 in up to six degrees of freedom The pre-calibration systems are described in more detail later in the seventh embodiment.

The fine alignment systems are for aligning the electron-optical device 404 to the charged particle path 403.

The fine alignment systems may include mechanically adjusting the position of the electron-optical device 404 relative to the main body of the module 405 when the module 405 is installed in the charged particle apparatus 401, using an apparatus indicated by 409 in FIG. 4B. The mechanical fine alignment systems may adjust the position of the electron-optical device 404 in up to six degrees of freedom. In a preferred implementation, the mechanical fine alignment systems may adjust the position of the electron-optical device 404 in three degrees of freedom, namely x, y and Rz. The mechanical fine alignment systems are described in more detail in the first to fifth embodiments.

The fine alignment systems may additionally, or alternatively, include electronically adjusting the position of the charged particle path 403 relative to the electron-optical device 404 when the electron-optical device 404 is installed in the charged particle apparatus 401, using an apparatus indicated by 412 in FIG. 4B. The electronic fine alignment systems may use, for example, electro-static and magnetic manipulators and lenses to adjust the position of the charged particle path 403 in up to six degrees of freedom. In a preferred implementation, the electronic fine alignment systems may adjust the position of the electron-optical device 404 in four degrees of freedom, namely x, y, z and Rz. The adjustment in a charged particle 403 in the z-direction may be performed by changing the focus of the charged particle beam, or multi-beam. The electronic fine alignment systems are described in more detail in the eighth embodiment.

The coarse alignment and pre-calibration techniques are passive techniques in that they are applied before and during the process of securing the electron-optical device 404 in the charged particle apparatus 401. The fine alignment techniques are active techniques in that they are applied, mechanically or electronically, after the electron-optical device 404 is installed in the charged particle apparatus 401.

Although not shown in FIGS. 4A and 4B, the charged particle apparatus 401 may comprise alternative and/or additional components on the charged particle path 403, such as lenses and other components as described earlier with reference to FIGS. 1 to 3. In particular, embodiments also include a charged particle projection apparatus that divides a charged particle beam from a source into a plurality of sub-beams. A plurality of respective objective lenses may project the sub-beams onto a sample. In some embodiments, a plurality of condenser lenses is provided up-beam from the objective lenses. The condenser lenses focus each of the sub-beams to an intermediate focus up-beam of the objective lenses. In some embodiments, collimators are provided up-beam from the objective lenses. Correctors may be provided to reduce focus error and/or aberrations. In some embodiments, such correctors are integrated into or positioned directly adjacent to the objective lenses. Where condenser lenses are provided, such correctors may additionally, or alternatively, be integrated into, or positioned directly adjacent to, the condenser lenses and/or positioned in, or directly adjacent to, the intermediate foci. A detector is provided to detect charged particles emitted by the sample. The detector may be integrated into the objective lens. The detector may be on the bottom surface of the objective lens so as to face a sample in use. The condenser lenses, objective lenses and/or detector may be formed as MEMS or CMOS devices.

As shown in FIG. 4A, the up-beam vacuum lock 406 and the down-beam vacuum lock 407 allow a vacuum chamber in the charged particle apparatus to be isolated from the vacuum conditions in the rest of the charged particle apparatus 401.

The process of replacing a module 405 may comprise the following steps. The power supply to the source may be cut off so that no charged particles are emitted. The up-beam vacuum lock 406 and the down-beam vacuum lock 407 may be closed so that the region of the charged particle apparatus 401 that comprises the module 405 may be isolated from the vacuum conditions in the rest of the charged particle apparatus 401. The region of the charged particle apparatus 401 that comprises the module 405 may then be vented and the module 405 removed from the charged particle apparatus 401. A pre-calibrated new module may then be inserted and secured to the charged particle apparatus 401 using the coarse positioning techniques according to embodiments. A pumping process may be performed to return the region of the charged particle apparatus 401 that comprises the module 405 to vacuum conditions and a baking process may also be performed. Both the up-beam vacuum lock 406 and down-beam vacuum lock 407 may then be opened. The power supply to the source may be switched on so that charged particles are emitted. When the up-beam vacuum lock 406 and down-beam vacuum lock 407 are open, they do not cause an obstruction on the charged particle path 403. The charged particle path 403 may therefore pass through both the up-beam vacuum lock 406 and the down-beam vacuum lock 407 when they are both open. A mechanical fine alignment process according to embodiments may be performed. A high voltage test may be performed. An electrical fine alignment process according to embodiments may be performed. When it is determined that the electron-optical device is appropriately aligned with the charged particle path 403, the charged particle apparatus 401 is ready for use.

Figure 5:
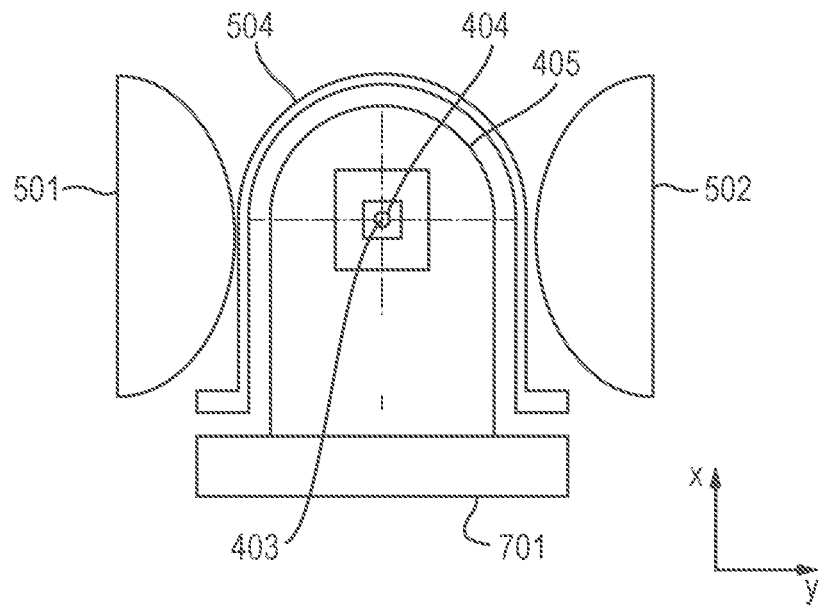
FIG. 5 is a schematic diagram of a cross section through a module according to an embodiment installed in a charged particle apparatus.
Figure 6:
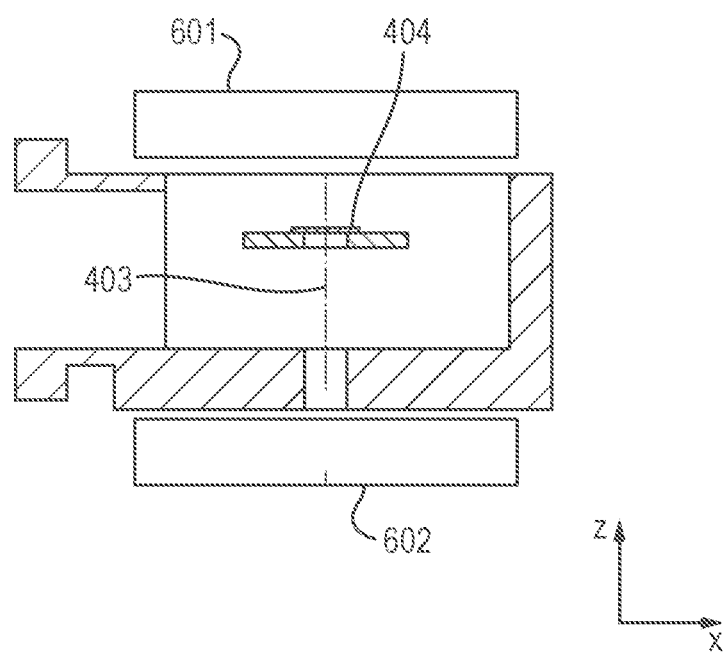
FIG. 6 is a schematic diagram of a cross section through an electron-optical device according to an embodiment installed in a charged particle apparatus.

FIGS. 5 and 6 are schematic diagrams of the module 405 installed in the charged particle apparatus 401.

FIG. 5 shows a schematic cross-sectional view through the module 405 and the part of the charged particle apparatus 401 that comprises the module 405. The cross-section is in a plane that may be orthogonal to the charged particle path 403.

In order for the module 405 to be replaceable, it is preferable for it to be possible to both remove and insert the module 405 into the charged particle apparatus 401 without substantial movement of the substantial components of the charged particle apparatus 401. In FIG. 5, components 501, 502 and 504 are representations of components of the charged particle apparatus 401. Component 504 may be a structure that defines the volume that module is required to fit in. For example, component 504 may be a vacuum chamber wall. Components 501 and 502 may be substantial components of the charged particle apparatus, such as a flood column or other substantial components, that restrict the maximum size of component 504.

The closest spacing across component 504 may be, for example, in the range 80 mm to 120 mm. The maximum width of the module 405 should be less than, or equal to, the closest spacing across component 504.

The module 405 comprises an electron-optical device 404. The module may comprise a flange 701. Within the flange may be supporting circuitry and connections for the electron-optical device 404.

FIG. 6 shows another schematic cross-sectional view through the part of the charged particle apparatus 401 that comprises the module 405. The cross-section is in a plane that may comprise the charged particle path 403. The electron optical device that is supported by the module is shown but the main body of the module is not shown.

In FIG. 6, components 601 and 602 are components of the charged particle apparatus 401 that the module 405 is required to fit between. Component 601 may be, for example, a component of an illumination apparatus, such as the up-beam vacuum lock 406 or other component. Component 602 may be, for example, the down-beam vacuum lock 407 or other component. In a direction along the charged particle path 403, the closest spacing between the parts of the charged particle apparatus 401 that the module 405 is required to fit between may be in the range 40 mm to 70 mm. The maximum height of the module 405 should be less than, or equal to, this closest spacing along the charged particle path 403.

Figure 7:
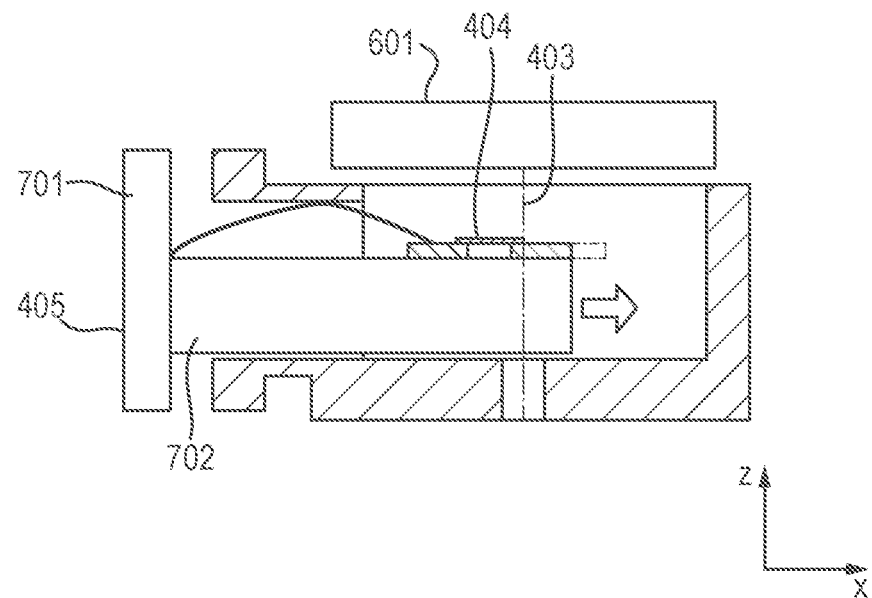
FIG. 7 is a schematic diagram of a cross section through a module according to an embodiment in the process of being inserted into a charged particle apparatus.

FIG. 7 shows a further schematic cross-sectional view through the module 405 and the part of the charged particle apparatus 401 that comprises the module 405. The cross-section is in the same plane as that shown in FIG. 6. As indicated by the arrow, FIG. 7 shows the module 405 when it is in the process of being installed into the charged particle apparatus 401.

The module 405 comprises a main body 702 that supports the electron-optical device 404. The main body 702 is a part of the module 405 that is inserted into the charged particle apparatus 401. The main body 702 of the module 405 may inserted into a vacuum chamber for receiving the module 405 in the charged particle apparatus 401. The module 405 also comprises a flange 701, referred to herein as a module flange 701. The module flange 701 may be the part of the module 405 that is securable to, and detachable from, the charged particle apparatus 401. The module flange 701 remains outside of the charged particle apparatus 401 and is not inserted into the charged particle apparatus 401. A number of electrical connectors may be provided between the electron-optical device 404 and support circuitry in the flange 701.

The positions of the other components in the charged particle apparatus 401 define the charged particle path 403. The module 405 may position the electron-optical device 404 in the charged particle apparatus 401 so that the electron-optical device 404 may lie in the charged particle path 403. After the module 405 has been secured to the charged particle apparatus 401, fine adjustments of the position of the electron-optical device 404 and/or the charged particle path may be made so that the electron-optical device is appropriately aligned with the charged particle path 403.

Embodiments include a number of different techniques for applying fine adjustments of the position of the electron-optical device 404 relative to the charged particle path 403 when the module 405 is secured to the charged particle apparatus 401.

The module 405 may comprise a support arrangement that is arranged to support the electron-optical device 404 in the module 405. The electron-optical device 404 is held by the support arrangement so that it is fixed to the support arrangement. The electron-optical device 404 may comprise a PCB/stage that is secured to the support arrangement. Additionally, or alternatively, the support arrangement may comprise a stage that the electron-optical device 404 is secured to.

The module 405 may further comprise a support positioning system that is arranged to move the support arrangement relative to the main body 702 of the module 405. The electron-optical device 404 is fixed to support arrangement and thereby moved when the support positioning system moves the support arrangement.

The electron-optical device 404 may be a substantially planar structure that is substantially orthogonal to the charged particle path 403. The plane of the electron-optical device 404 may be referred to as the x-y plane. The charged particle axis may be referred to as a z-axis. The module may also be considered to be a substantially planar structure that is substantially in an x-y plane.

The support arrangement and support positioning system may also be substantially planar structures in x-y planes.

The support positioning system may comprise a position detecting system for determining the movement and/or position of the support arrangement. The position detecting system may be used to improve the accuracy of the movement and positioning of the support arrangement. The position detecting system may use a grid mark, such as an encoder, to determine the position of the support arrangement. The position detecting system may use features of the support arrangement and/or electron-optical device 404 to determine the movement and/or position of the support arrangement and/or electron-optical device 404. For example, the support arrangement and/or electron-optical device 404 may comprise features such as markers (e.g. fiducials), alignment openings (e.g. for use in the manufacture of the electron-optical device 404) and functional features (e.g. openings through beam manipulators). Any of these features may be used to determine the movement and/or position of the support arrangement and/or electron-optical device 404 and thereby the accuracy of applied movements.

Figure 8:
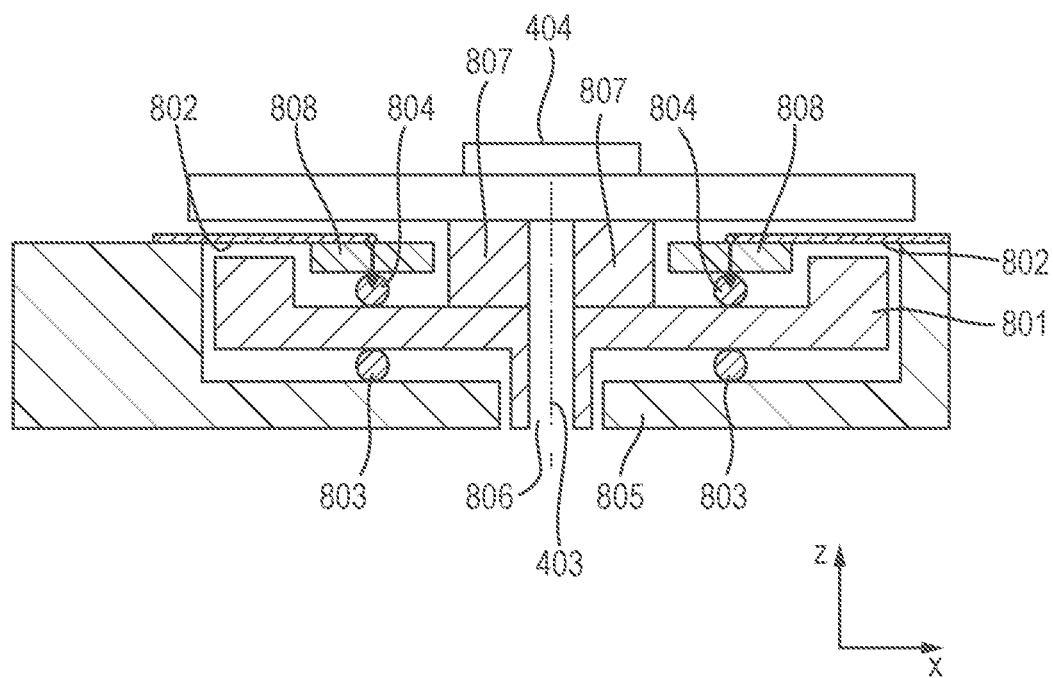
FIG. 8 is a schematic diagram of a cross section through part of a module according to a first embodiment.

FIG. 8 shows a schematic diagram of a cross sectional view through the module 405 according to a first embodiment. The cross-section is in a plane that comprises the charged particle path 403 and shows some details of the support positioning system 801 of the first embodiment.

Figure 9:
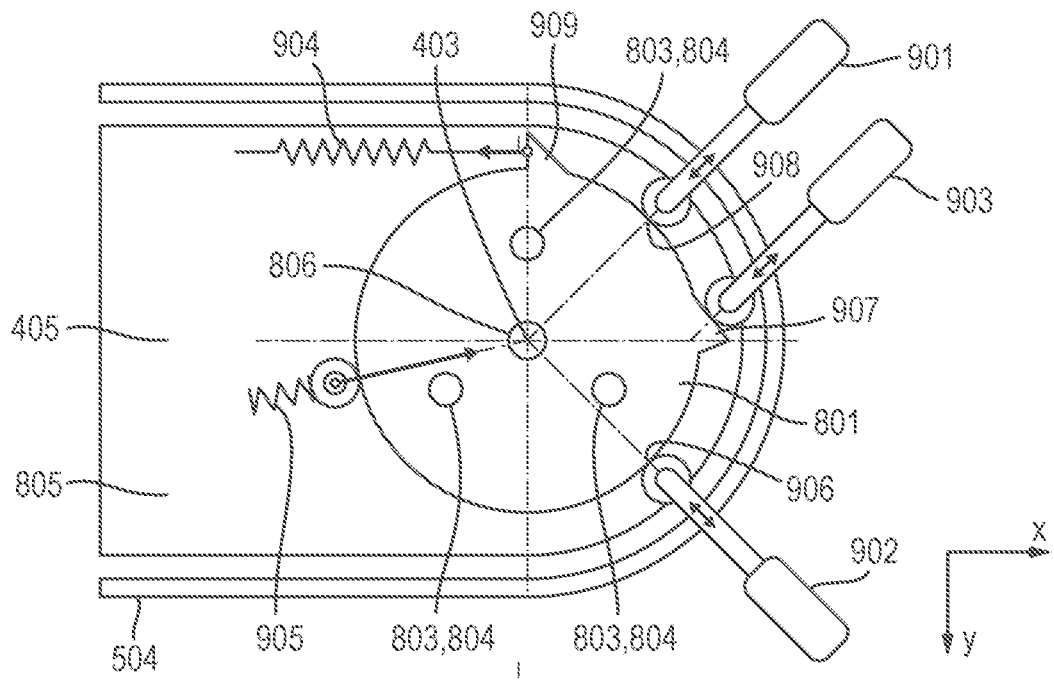
FIG. 9 is a schematic diagram of a cross section through part of a module according to the first embodiment.

FIG. 9 shows a schematic diagram of a cross sectional view through the module 405 according to the first embodiment. The cross-section is in a plane that is orthogonal to the charged particle path 403 and shows some further details of the support positioning system 801 of the first embodiment.

The support arrangement 807 is arranged to hold the electron-optical device 404. The support arrangement 807 is fixed to the support positioning system 801. In the present embodiment, the support arrangement 807 may be a separate component from the support positioning system 801 and secured to the support positioning system 801. For example, the support arrangement may comprise a flexure arrangement so that it may handle thermal expansion of the electron-optical device. Alternatively, the support arrangement 807 may be integral with the support positioning system 801 so that the support arrangement 807 and support positioning system 801 are part of the same structure.

The support positioning system 801 comprises a substantial disc. The disc has an up-beam surface and a down-beam surface. The up-beam and down-beam surfaces are opposing major surfaces of the disc. In the current embodiment the up-beam surface of the disc is the major surface of the disc that is closest to the electron-optical device 404. The down-beam surface of the disc is the major surface of the disc that is furthest from the electron-optical device 404 and faces part of a base 805 of the module 405. It should be clear though that this is merely a design choice in the current design, and the electron-optical device 404 may be positioned closer to the down-beam surface of the disc.

The disc may be substantially annular and comprise a preferably central opening 806 for the charged particle path 403. The support arrangement 807 may also be substantially annular and comprise a central opening for the charged particle path 403. In plan view, the outer perimeter of the disc may be substantially circular. However, embodiments also include the outer perimeter of the disc not being substantially circular in plan view. For example, the outer perimeter of the disc may be substantially hexagonal, or have an irregular shape.

The disc in the current embodiment is supported in the module 405 by a plurality of ball bearings 803, 804, or other types of load bearing rotatable objects. There may be one or more ball bearings 804 in contact with the up-beam surface of the disc. For example, there may be three ball bearings 804 in contact with the up-beam surface of the disc. There may be at least three ball bearings 803 in contact with the down-beam surface of the disc. Alternatively, a spring may be in provided contact with the up-beam surface of the disc instead of any ball bearings. The spring may be arranged to apply a force on the up-beam surface that is directed towards the base 805 of the module 405.

The ball bearings 803 in contact with the down-beam surface may each be in contact with the base 805 of the module 405. The ball bearings 804 in contact with the up-beam surface of the disc may each be in contact with plate 808 that is contact with a spring 802, such as a leaf spring, compression spring or other type of resilient member. Each spring 802 may be an axial spring. Each spring 802 may be fixed to a housing of the module 405 that comprises the base 805 of the module 405. The springs 802 apply a force that presses all of the ball bearings 803, 804 against the disc. The ball bearings 803 in contact with the down-beam surface are also pressed into the base of the module 405. All of the ball bearings 803, 804 are thereby held under compression by the springs 802.

Although there may be a corresponding spring for each for each plate 808, embodiments also include there being a single annular axial spring that acts on all of the plates. Alternatively, more than one spring may be used with the number of springs used not being restricted to the number of plates 808.

In an alternative implementation, axial springs are provided where plates 808 are shown in FIG. 8 and a rigid plate is provided where the springs 802 are shown. The axial springs, that may be compression springs or other type of resilient member, similarly apply a force that presses all of the ball bearings 803, 804 against the disc.

A plurality of actuators 901, 902, 903 are provided for moving the disc in the plane of the module 405. Each actuator 901, 902, 903 may comprise an actuator arm. Each actuator arm may be part of an actuator 901, 902, 903. Alternatively, each actuator arm may be a separate component to each actuator 901, 902, 903 with each actuator arm connected to an actuator 901, 902, 903. There may be a roller bearing at the end of each actor arm or some other means to allow the actuator to move along the disc 801 while causing relatively low friction. Each actuator 901, 902, 903 may, for example, be a linear actuator having a longitudinal axis so that the actuator arm is configured to move along its longitudinal axis. Some or all of the actuators 901, 902, 903 may, for example, be manually and/or automatically operated. Alternatively, some or all of the actuators 901, 902, 903 may be motorized, pneumatically controlled or otherwise moveable so that the actuator arms may be automatically moved. The disc in the current embodiment comprises a plurality of receiving parts 906, 907, 908 in a sidewall of the disc. Each receiving part 906, 907, 908 may be arranged to receive the end of one of the actuator arms so that the actuator arm may be able to apply a force to the disc. Each of receiving parts 906 and 908 may be a substantially smooth surface of the cylindrical sidewall of the disc. The roller bearing on the end of each actuator arm allows movement along the side wall. Receiving part 907 may, for example, constitute an indentation, groove or other structural element in the sidewall of the disc. Alternatively, each receiving part 906, 907, 908 may, for example, constitute an indentation, groove or other structural element in the sidewall of the disc.

A first actuator 901 may be arranged to move the disc in a first linear direction, that may be in an x-y plane. A second actuator 902 may be arranged to move the disc in a second direction that is orthogonal to the first direction and may also be in then x-y plane. A third actuator 903 may, for example, be arranged to apply a rotation to the disc within the x-y plane, which may be an Rz rotation (i.e. movement of the disc about the z-axis).

In the current embodiment, the first actuator 901 may be oriented such that the longitudinal axis of the first actuator 901 is aligned with the first direction as well as with the center of Rz rotation of the disc. Movement of the arm of the first actuator 901 along its longitudinal axis therefore moves the disc only in the first direction and does not substantially rotate the disc. Movement in the first direction by the arm causes relative motion between the receiving parts 908, 907 and 906 and their respective rollers so that the rollers may roll over the surface of the receiving parts 908, 907 and 906.

In the current embodiment, the second actuator 902 may be oriented such that the longitudinal axis of the second actuator 902 is aligned with the second direction as well as the center of Rz rotation of the disc. Movement of the arm of the second actuator 902 along its longitudinal axis therefore moves the disc only in the second direction and does not substantially rotate the disc. Movement in the second direction by the arm causes relative motion between the receiving parts 908, 907 and 906 and their respective rollers so that the rollers may roll over the surface of the receiving parts 908, 907 and 906.

The current embodiment further shows the third actuator 903 which may be oriented such that the longitudinal axis of the third actuator 903 is not aligned with the center of Rz rotation of the disc. The receiving part 907 of the longitudinal axis of the arm of the third actuator may be a protrusion from the sidewall of the disc. Movement of the arm of the third actuator 903 along its longitudinal axis therefore rotates the disc. Rotational movement of the disc causes relative rotational motion between the receiving parts 908, 907, 906 and their respective rollers so that the rollers may roll over the surface of the receiving parts 908, 907, 906.

The support position system 801 may also comprise a plurality of planar springs 904, 905, or other force applying devices or resilient members, for biasing the position of the disc against the actuators in the x-y plane of the module 405.

Each planar spring 904, 905 may, for example, be a linear spring that is arranged to apply a force in the direction of its longitudinal axis. An end of each planar spring 904, 905 may be secured to the base 805 of the module 405 and an opposite end of each spring 904, 905 secured to or pressing against a sidewall of the disc.

A longitudinal axis of an x-y planar spring 905 may be aligned with the center of Rz rotation of the disc, which as shown in FIG. 9 would be at the center of the opening 806. The x-y planar spring 905 may, for example, be described to be arranged on the opposite side of the disc to the receiving part 908 of the actuator arm of the first actuator 901 and the receiving part 906 of the actuator arm of the second actuator 902. That is, the connection of the x-y planar spring 905 may be arranged on the disc so that x-y planar spring may oppose the forces applied to the disc 901 at the first and second receiving parts 906, 908 by the actuators 901, 902. The x-y planar spring may, for example, be configured to contribute to holding the disc under compression in the first and second directions.

In the current embodiment, a longitudinal axis of a rotational planar spring 904 is not aligned with the center of Rz rotation of the disc. The rotational planar spring 904 may, for example, be secured to a protrusion 909 in the side of the disc. The rotational planar spring may be arranged so that the rotational planar spring extends when the actuator arm of the third actuator 903 extends to rotate the disc. In an embodiment, the third actuator arm operates on the third receiving surface 907 on the side of the disc. As shown in FIG. 9, the actuator arm extends to cause the disc to rotate in a clockwise direction. The rotational planar spring 904 is connected to the disc so it extends when the disc is rotated in a clockwise direction and compressed when the disc rotates in an anti-clockwise direction. The rotational planar spring 904 is thereby biased against the rotation applied when the actuator arm of the third actuator 903 extends.

In an alternative implementation of the present embodiment, a single planar spring is used to hold the disc under compression in the first and second directions and also bias against the rotation applied when the actuator arm of the third actuator 903 extends. An end of the planar spring may be secured to the base 805 of the module 405 and an opposite end of the spring may secured close to the edge of the central opening in the disc. The spring may be arranged so that it is not aligned with the center of Rz rotation of the disc.

The actuators 901, 902, 903 may be part of the charged particle apparatus 401 and such actuators not part of the module 405. The actuator arms may extend through openings in the module 405 to contact the receiving parts 906,

907, 908. Alternatively, the actuators 901, 902, 903 may be contained entirely within the module 405 and may be an integral part of the module 405.

The position detecting system may be configured and arranged to determine the movement and/or position of each of the actuator arms. Alternatively, or additionally, the position detecting system may be configured and arranged to determine the movement and/or position of each of the rollers bearings at the end of the actuator arms. The position and/or movement changes may be determined by encoders. The may be located in the main body of each actuator at the opposite end of the actuator to the roller bearing, in each actuator arm and/or in each roller bearing. These position and/or movement determinations may be used to deduce the movement and/or position of the support arrangement 807 and through that, the movement and/or position of the electron-optical device 404. Alternatively the position detecting system may be configured and arranged to determine the movement and/or position of the rotating disc including the support arrangement 807 to determine the movement and/or position of the electron-optical device 404.

The operation of the first, second and third actuators 901, 902, 903 may therefore move the support arrangement relative to the main body 702 of the module 405, and in particular the flange 701 of the module 405, in in the x-y plane as well apply an Rz rotation to the support arrangement.

According to a second embodiment, the support positioning system comprises an Rz flexure arrangement and an x-y flexure arrangement. The Rz flexure arrangement and x-y flexure arrangement may be arranged in a stack. Each flexure arrangement may be a substantially planar structure arranged in an x-y plane. The support positioning system according to the second embodiment may be used instead of that described in the first embodiment. Embodiments also include elements of the support positioning system according to the second embodiment being used in addition to those described in the first embodiment.

Figure 10A:
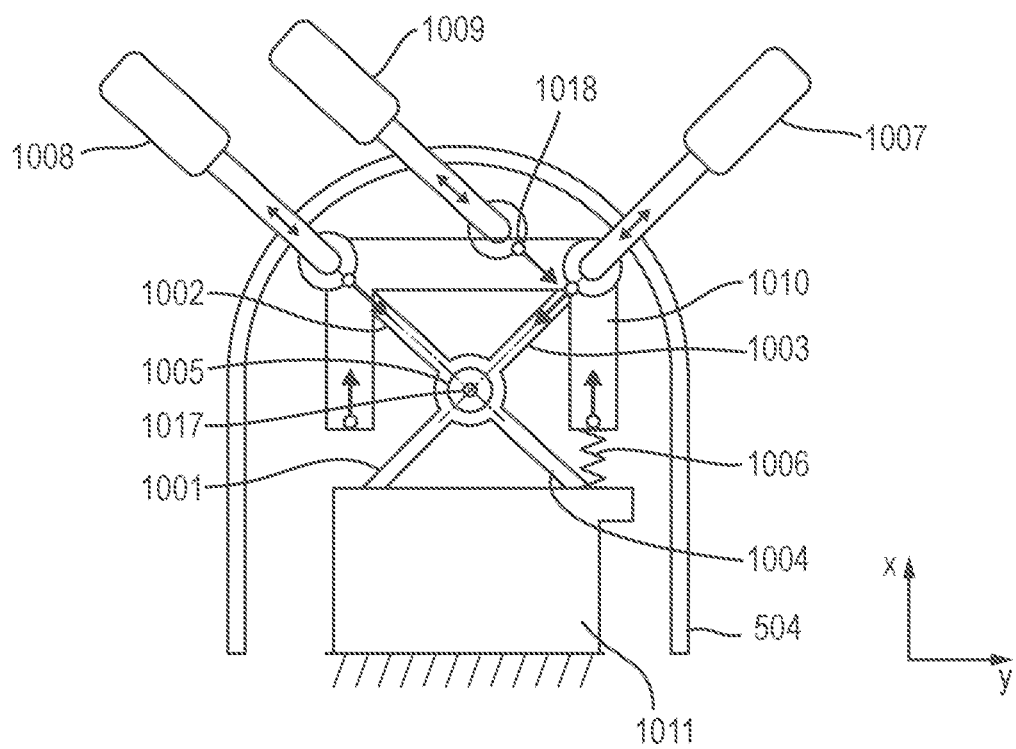
FIG. 10A is a schematic diagram of a cross section through part of a module according to a second embodiment.

FIG. 10A shows schematic diagram of a cross sectional view through the Rz flexure arrangement according to the second embodiment. The cross-section is in a plane that is orthogonal to the charged particle path 403.

Figure 10B:
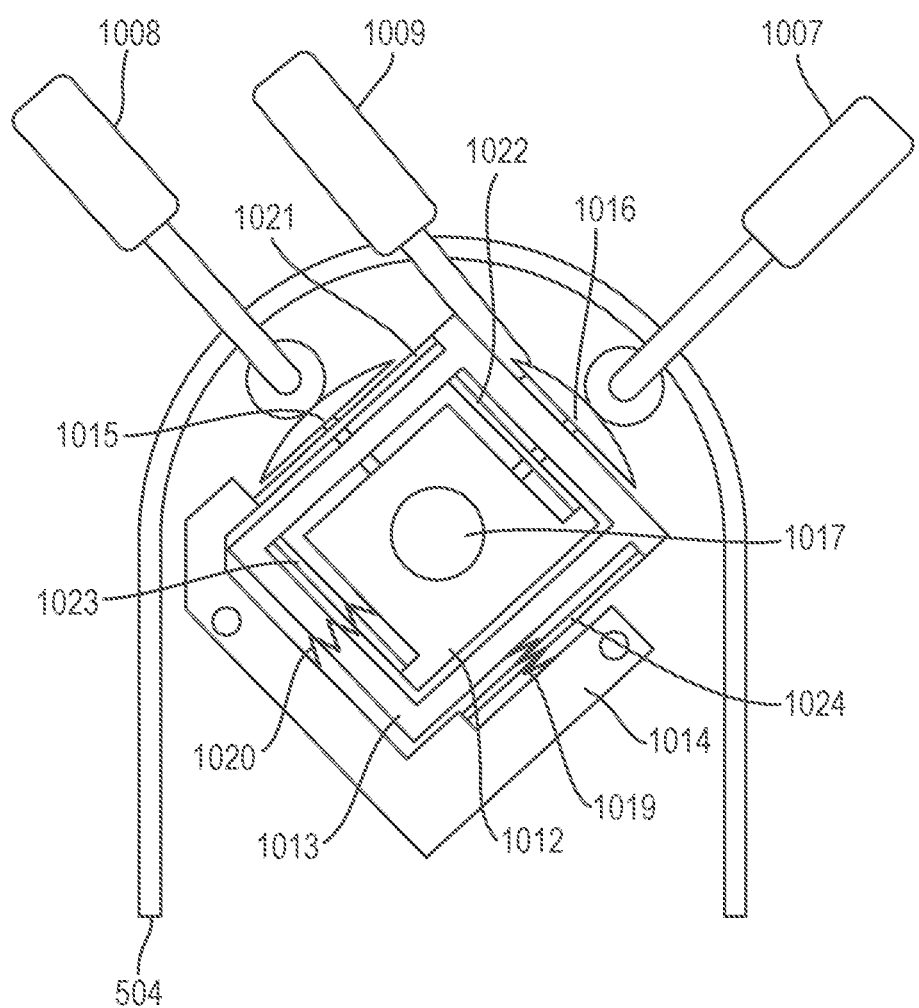
FIG. 10B is a schematic diagram of a cross section through part of a module according to a second embodiment.

FIG. 10B shows schematic diagram of a cross sectional view through the x-y flexure arrangement according to the second embodiment. The cross-section is in a plane that is orthogonal to the charged particle path 403 and at a different position along the charged particle path than the cross-section shown in FIG. 10A.

As shown in FIG. 10A, the Rz flexure arrangement comprises a substantially circular structure 1005, preferably at its center, defining an opening 1017 in the Rz flexure arrangement. The opening 1017 allows the charged particle path 403 to pass through the Rz flexure arrangement. In use, the Rz flexure arrangement may be positioned so that the center of the opening 1017 is preferably substantially aligned with the center of the charged particle path 403. The substantially circular structure may be circular in plan view and substantially cylindrical along the beam path.

In the current embodiment, the Rz flexure arrangement also comprises crossbars arranged to form a cross shape. The cross is formed by a first crossbar and a second crossbar. The first and second crossbars intersect with each other at the substantially circular structure 1005.

The first and second crossbars are preferably both in the x-y plane. The first crossbar may be aligned in a first direction. The second crossbar may be aligned in a second direction. The first and second directions may be orthogonal to each other.

The first crossbar may comprise a first part 1001 and a second part 1003. The substantially circular structure 1005 may be between, and supported by, the first part 1001 and the second part 1003 of the first crossbar. The second crossbar may comprise a first part 1004 and a second part 1002. The substantially circular structure 1005 may be between, and supported by, the first part 1004 and second part 1002 of the second crossbar. The substantially circular structure 1005 may be a cylindrical structure that is circular in plan view.

The flexure comprises a flexure base 1011 and a moveable body 1010. The flexure base 1011 is secured to the main body 702 of the module 405 and cannot substantially move relative to the main body 702 of the module 405.

The moveable body 1010 may be substantially C-shaped, or crescent shaped.

An end of the first part 1001 of the first crossbar may be secured to the flexure base 1011 with the other end of the first part 1001 secured to the substantially circular structure 1005. An end of the second part 1003 of the first crossbar may be secured to the moveable body 1010 with the other end of the second part 1003 secured to the substantially circular structure 1005.

An end of the first part 1004 of the second crossbar may be secured to the flexure base 1011 with the other end of the first part 1004 secured to the substantially circular structure 1005. An end of the second part 1002 of the second crossbar may be secured to the moveable body 1010 with the other end of the second part 1002 secured to the substantially circular structure 1005. The moveable body 1010 is therefore attached to the flexure base 1011 by the first crossbar, the second crossbar and the substantially circular structure 1005.

The first crossbar and second crossbar may bend so that the moveable body 1010 may rotate in Rz. The center of Rz rotation of the moveable body 1010 may be close to, or at, the center point of the substantially circular structure 1005.

The support positioning system may comprise a spring 1006, or other force applying device or resilient member. An end of the spring 1006 may be secured to the flexure base 1011 and the other end secured to an end of the moveable part 1010. The end of the spring 1006 secured to the flexure base 1011 may be secured at substantially the same position as the end of the first part 1004 of the second crossbar that is secured to the flexure base 1011. When the spring is compressed, the bias force applied by the spring 1006 may be in a direction that is orthogonal to a sidewall of the flexure base and not inline with the substantially circular structure 1005. The force applied by the spring 1006 is therefore not directed towards the center of rotation of the moveable body 1010. The effect of the spring 1006 is therefore to apply a bias force that rotates the moveable body 1010 about the z-axis.

As described for the first embodiment, a third linear actuator 1009 may be provided for rotating the Rz flexure arrangement. The third linear actuator 1009 may be manually, or automatically, operated. The Rz flexure arrangement comprises a receiving part 1018. The receiving part 1018 is arranged to receive the end of the actuator arm of the third actuator 1009 so that the actuator arm can apply a force for rotating the Rz flexure arrangement.

The moveable body 1010 may be secured, such as bolted, to the x-y flexure arrangement.

As shown in FIG. 10B, the x-y flexure arrangement comprises an outer structure 1014 that may be secured to the Rz flexure arrangement. The outer structure 1014 may be substantially L-shaped. The outer structure 1014 may be a rigid body.

The x-y flexure arrangement comprises a central structure 1012 that comprises a substantially circular structure 1017 defining an opening in the x-y flexure arrangement. The central structure 1012 may be a rigid body. The opening allows the charged particle path 403 to pass through the x-y flexure arrangement. In use, the x-y flexure arrangement may be positioned so that the center of the opening is substantially aligned with the charged particle path 403.

As described for the first embodiment, first linear actuator 1007 and second linear actuator 1008 are provided for moving the x-y flexure arrangement in orthogonal directions in the x-y plane. The first linear actuator 1007 and second linear actuator 1008 may be manually, or automatically, operated. The x-y flexure arrangement comprises a first receiving part 1015 and a second receiving part 1016. Each receiving part 1015, 1016 is arranged to receive the end of one of the actuator arms so that the actuator arm can apply a force to the x-y flexure arrangement.

The x-y flexure arrangement comprises an intermediate structure 1013. The intermediate structure 1013 may have a substantially square outer periphery around a substantially square opening. The intermediate structure 1013 may be a rigid body. The central structure 1012 may be provided in the opening of the intermediate structure 1013 such that the central structure 1012 is surrounded, in the x-y plane, by the intermediate structure 1013. The intermediate structure 1013 may be at least partly surrounded by the outer structure 1014, receiving part 1015 and receiving part 1016.

The receiving part 1015 may be directly connected to the central structure 1012 by a first connector, such as a rod or bar. Substantially inline with a longitudinal axis of the second linear actuator 1008, and on the opposite side of the central structure to connection point of the first connector, a spring 1019, or other type of biasing device, may be provided between the intermediate structure 1013 and the outer structure 1014.

The receiving part 1016 may be directly connected to the central structure 1012 by a second connector, such as a rod or bar. Substantially inline with a longitudinal axis of the first linear actuator 1007, and on the opposite side of the central structure to connection point of the second connector, a spring 1020, or other type of biasing device, may be provided between the central structure 1012 and the outer structure 1014.

The x-y flexure arrangement comprises leaf springs 1021, 1022, 1023 and 1024. The leaf springs 1021, 1022, 1023 and 1024 may alternatively be other types of resilient members.

The intermediate structure 1013 may be connected to the outer structure 1014 by leaf springs 1021 and 1024. Leaf springs 1021 and 1024 may be arranged on opposite sides of the intermediate structure 1013. Leaf springs 1021 and 1024 may both be arranged so that they are aligned substantially orthogonally with the longitudinal axis of the second linear actuator 1008.

The intermediate structure 1013 may be connected to the central structure 1012 by leaf springs 1022 and 1023. Leaf springs 1022 and 1023 may be arranged on opposite sides of the intermediate structure 1013. Leaf springs 1022 and 1023 may both be arranged so that they are aligned substantially orthogonally with the longitudinal axis of the first linear actuator 1007.

The leaf springs 1022 and 1023 allow movement of the central structure 1012 relative to the intermediate structure 1013. The central structure 1012 is thereby moved relative to the outer structure 1014. Accordingly, a linear extension of the arm of the first actuator 1007 may move the central structure 1012 in a second direction against the bias of the spring 1020. Similarly, the bias of spring 1020 may move the central structure 1012 in the opposite direction if the arm of the first actuator 1007 retracts.

The leaf springs 1021 and 1024 allow movement of the intermediate structure 1013, and thereby central structure 1012, relative to the outer structure 1014. Accordingly, a linear extension of the arm of the second actuator 1008 may move the central structure 1012 in a second direction against the bias of the spring 1019. Similarly, the bias of spring 1019 may move the central structure 1012 in the opposite direction if the arm of the second actuator 1008 retracts.

The first actuator 1007 and second actuator 1008 may therefore be arranged to move the central structure 1012 in orthogonal directions in the x-y plane.

As described above, the flexure arrangement of the present embodiment may be a stack of an Rz flexure arrangement and an x-y flexure arrangement. The Rz flexure arrangement may be secured to the base of the module and the x-y flexure arrangement may be secured on, e.g. up-beam, of the Rz flexure arrangement. The circular structure 1005 of the Rz flexure arrangement may be substantially aligned with the circular structure 1017 of the x-y flexure arrangement.

The longitudinal axis of the arm of the first actuator 1007 may be substantially aligned with that of the first crossbar of the Rz flexure arrangement as well as the center of Rz rotation of the moveable body 1010. Movement of the arm along its longitudinal axis therefore moves the moveable body 1010 only in the first direction and does not substantially rotate the moveable body 1010.

The longitudinal axis of the arm of the second actuator 1008 may be substantially aligned with that of the second crossbar of the Rz flexure arrangement as well as the center of Rz rotation of the moveable body 1010. Movement of the arm along its longitudinal axis therefore moves the moveable body 1010 only in the second direction and does not substantially rotate the moveable body 1010.

The longitudinal axis of the arm of the third actuator 1009 is not aligned with the center of Rz rotation of the moveable body 1010. The receiving part of the longitudinal axis of the arm of the third actuator 1009 may be a recess, or notch, in the side of the moveable body 1010. The movement of the arm along its longitudinal axis therefore rotates the flexure arrangement in Rz. The applied Rz rotation by an extension of the arm of the third actuator 1009 may compress the spring 1006 so that the moveable body 1010 is held under rotational compression.

The x-y flexure arrangement is fixed to the moveable body 1010 of the Rz flexure arrangement and so the entire x-y flexure arrangement is rotated when the moveable body 1010 is rotated.

The central structure 1012 of the x-y flexure arrangement may be the support arrangement and comprise features for holding an electron-optical device 404.

Alternatively, the support arrangement may be a separate structure from those shown in FIG. 10B and secured to the central structure 1012. The support arrangement may be fixed to the central structure 1012 so that there is substantially no relative movement between the support arrangement and the central structure 1012.

The flexure arrangement therefore comprises a moveable body 1010 capable of being moved by the actuators 1007, 1008, 1009 in the x-y plane and in Rz. As described for the first embodiment, a position detecting system may determine the movement and/or position of each of the actuator arms or of the moveable body. These determinations may be used to deduce the movement and/or position of the support arrangement, and finally to determine the movement and/or position of the electron-optical device 404 (not shown).

The x-y flexure arrangement may be a single structure. Alternatively, the x-y flexure arrangement may comprise a plurality of stacked flexures. For example, it may comprise a first flexure for movement in the first direction by the first actuator 1007 and second linear flexure for movement in the second direction by the second actuator 1007.

In an alternative implementation of the x-y flexure arrangement, the receiving part 1015 may be directly connected to the intermediate structure 1013 by the first connector, instead of the first connector connecting to the central structure 1012. Advantageously, movement in the first direction by the first actuator 1007 exerts less force on the leaf spring 1022. The spring 1020 may also be arrange between the central structure 1012 and the intermediate structure 1013, instead of the central structure 1012 and the outer structure 1014. Advantageously, movement in the second direction by the second actuator 1008 exerts less force on the leaf spring 1021.

In a preferred implementation of the second embodiment, the Rz flexure arrangement is secured directly to the main body of the module and the x-y flexure arrangement is provided on, and only secured to, the Rz flexure arrangement. In this implementation the forces applied by the first linear actuator 1007 and the second linear actuator 1008 are substantially along the longitudinal axes of the crossbars of the Rz flexure arrangement. However, embodiments also include the x-y flexure arrangement being secured directly to the main body of the module and the Rz flexure arrangement being provided on, and only secured to, the Rz flexure arrangement.

According to a third embodiment, the support positioning system comprises a plurality of piezo-electric actuator arrangements that are configured to move a stage. The support positioning system according to the third embodiment may be used instead of that described in the first and/or second embodiments. Unlike the first and second embodiments, the actuators may be comprised in the module. Embodiments also include elements of the support positioning system according to the third embodiment being used in addition to those described in the first and/or second embodiments. In such arrangements, actuators may be located both in the module and external to the module.

Figure 11A:
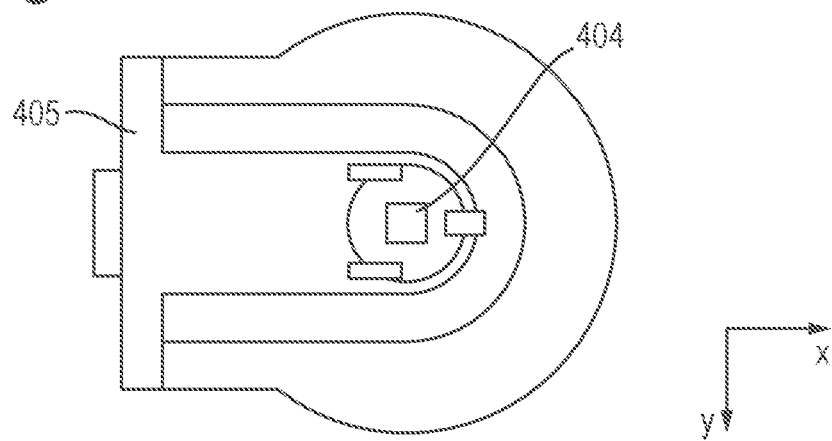
FIG. 11A is a schematic diagram of a cross section through a module according to an implementation of a third embodiment.
Figure 11B:
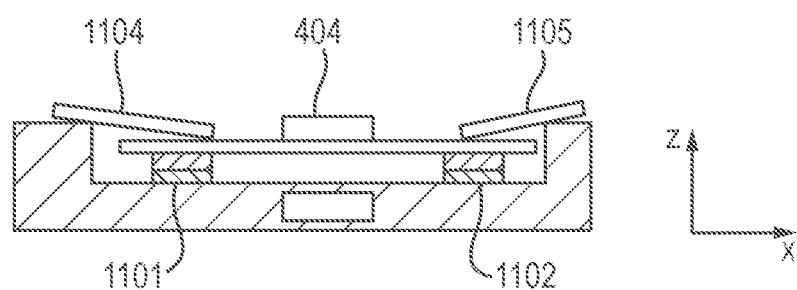
FIG. 11B is a schematic diagram of a cross section through part of a module according to an implementation of the third embodiment.
Figure 11C:
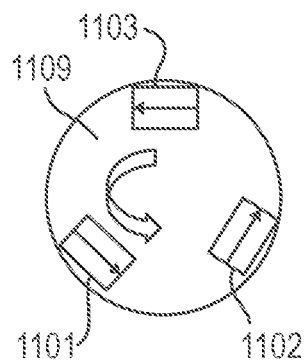
FIG. 11C, FIG. 11D and FIG. 11E are schematic plan views of a stage showing operational states of the piezoelectric actuators according to an implementation of the third embodiment.
Figure 11D:
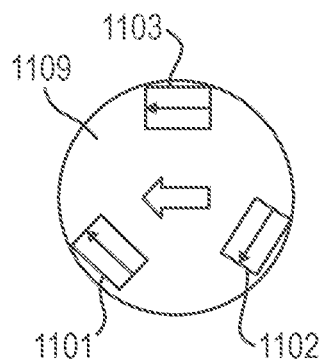
Figure 11E:
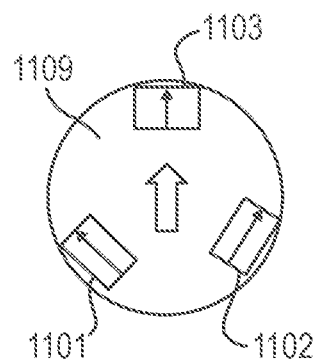

The third embodiment is shown in FIGS. 11A to 11I. FIG. 11A shows a schematic plan view of a cross-section through the module 405 in a plane that is orthogonal to the charged particle path 403. FIG. 11B shows a schematic view of a cross-section through the module 405 in a plane that comprises the charged particle path 403. FIGS. 11C to 11E show schematic plan views of the stage 1109 showing operational states of the piezo-electric actuator arrangements in a first implementation of the third embodiment.

As shown in FIGS. 11C to 11E, there may be three piezo-electric actuator arrangements 1101, 1102, 1103, for example, spaced equidistantly around the periphery of the stage 1109. All of the piezo-electric actuator arrangements 1101, 1102, 1103 may be in contact with the same major surface of the stage 1109, e.g. the major surface of the stage 1109 that faces the module 405 as shown in FIG. 11B. In plan view, all of the piezo-electric actuator arrangements 1101, 1102, 1103 overlap with the stage 1109. For each of the piezo-electric actuator arrangements 1101, 1102, 1103, a contact pad may be provided between the piezo-electric actuator and the stage 1109. The contact pad may be ceramic, or a different material together with an insulating layer.

Each piezo-electric actuator arrangement 1101, 1102, 1103 may, for example be a 2-axis shear mode piezo-electric actuator. As shown in FIG. 11B, each piezo-electric actuator arrangement 1101, 1102, 1103 may comprise a stack of two piezo-electric actuators. Each piezo-electric actuators in each stack may be arranged to move the stage two opposite directions. Each piezo-electric actuator arrangement 1101, 1102, 1103 may comprise to piezo-electric actuators that are arranged so that the movement of the stage by one of the piezo-electric actuators is orthogonal to the movement of the stage by the other of the piezo-electric actuators.

Each of the piezo-electric arrangements 1101, 1102, 1103, may be acted on by a resilient member, e.g. a spring 1104, 1105, or other force applying device. Although not shown in FIG. 11B, each spring may be a helical spring. Each spring 1104, 1105 is arranged to contact an opposite major surface of the stage 1109 to a corresponding piezo-electric actuator 1101, 1102, 1103 that is acted on by the spring 1104, 1105. The stage 1109 is thereby pressed into the piezo-electric actuators 1101, 1102, 1103 by the springs 1104, 1105. As shown in FIGS. 11A and 11B, piezo-electric arrangement 1101 is acted on by the spring 1104 and piezo-electric arrangement 1102 is acted on by the spring 1105.

The piezo-electric arrangements 1101, 1102, 1103 may be controlled to move the stage linearly in a first direction, that may be the x-direction, linearly in a second direction, that may be orthogonal to the first direction, i.e. the y-direction, and to rotate the stage 1109 in the plane of the stage 1109, which may be a movement in Rz.

As shown in FIG. 11C, all of the piezo-electric arrangements 1101, 1102, 1103 may be operated to generate differently directed linear forces, the net effect of which is a force that rotates the stage. The direction of rotation may be changed by changing the directions of all of the linear movements of the piezo-electric arrangements 1101, 1102, 1103.

As shown in FIG. 11D, all of the piezo-electric arrangements 1101, 1102, 1103 may be operated to generate differently directed linear forces, the net effect of which is a force that moves the stage linearly in an x-direction. The direction of movement may be changed by changing the directions of all of the linear movements of the piezo-electric arrangements 1101, 1102, 1103.

As shown in FIG. 11E, all of the piezo-electric arrangements 1101 and 1102 may be operated to generate differently directed linear forces, the net effect of which is a force that moves the stage linearly in a y-direction. The direction of movement may be changed by changing the directions the linear movements of the piezo-electric arrangements 1101 and 1102.

A second implementation of the third embodiment is shown in FIGS. 11F to 11I. The second implementation may differ from the first implementation by at least two of the piezo-electric actuator arrangements 1106, 1107, 1108 being a 3-axis shear mode piezo-electric actuator. A stacked arrangement of three piezo-electric actuators may provide a further degree of movement and thereby improve the accuracy of the movements applied by the piezo-electric actuator arrangements 1106, 1107, 1108 in the x-direction and y-direction, as well as rotational movements about Rz.

The second implementation may also differ from the first implementation in the way that the piezo-electric actuator arrangements 1106, 1107, 1108 are orientated. In the second implementation, each of the piezo-electric arrangements 1101, 1102, 1103, may be preloaded by a spring 1104, 1105, or other force applying device, as described for the first implementation.

Figure 11F:
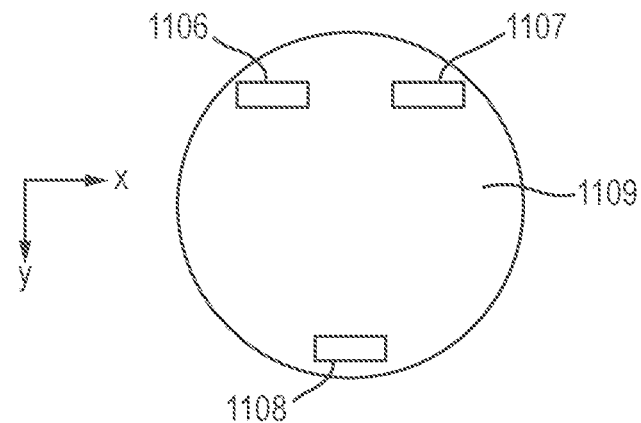
FIG. 11F is a schematic diagram of a cross section through a module according to an implementation of the third embodiment.

FIG. 11F shows a schematic plan view of the stage 1109 showing orientations of the piezo-electric actuator arrangements 1106, 1107, 1108 in the second implementation.

Figure 11G:
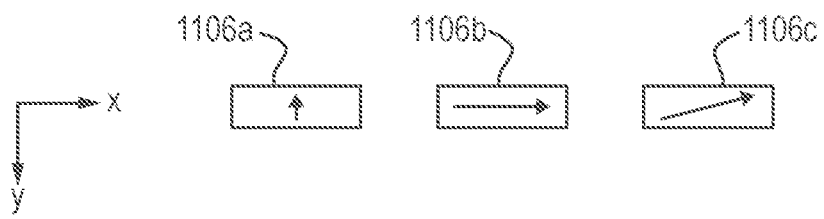
FIG. 11G, FIG. 11H and FIG. 11I are schematic plan views of a stage showing operational states of the piezoelectric actuators according to an implementation of the third embodiment.

FIG. 11G shows possible operations states of a first piezo-electric actuator 1106a, a second piezo-electric actuator 1106b and a third piezo-electric actuator 1106c in the piezo-electric actuator arrangement 1106. Each piezo-electric actuator is arranged to move the stage 1109 linearly in two opposite directions. The movements applied by the first piezo-electric actuator 1106a may be in the y-direction. The movements applied by the second piezo-electric actuator 1106b may be in the x-direction. The third piezo-electric actuator 1106c may apply a linear movement that is angled, i.e. not parallel or orthogonal, relative to direction of movements applied by the first and second piezo-electric actuators. The direction of movement applied by the third piezo-electric actuator 1106c may be in a direction that is substantially tangential to the closest part of the periphery of the stage 1109 and thereby arranged to apply a rotation to the stage 1109.

Figure 11H:
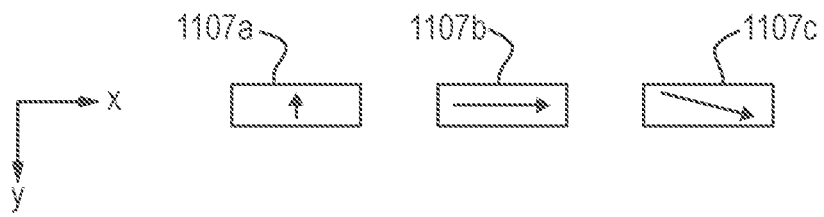

FIG. 11H shows possible operations states of a first piezo-electric actuator 1107a, a second piezo-electric actuator 1107b and a third piezo-electric actuator 1107c in the piezo-electric actuator arrangement 1107. Each piezo-electric actuator is arranged to move the stage linearly in two opposite directions. The movements applied by the first piezo-electric actuator 1107a may be in the y-direction. The movements applied by the second piezo-electric actuator 1107b may be in the x-direction. The third piezo-electric actuator 1107c may apply a linear movement that is angled, i.e. not parallel or orthogonal, relative to direction of movements applied by the first and second piezo-electric actuators. The direction of movement applied by the third piezo-electric actuator 1107c may be in a direction that is substantially tangential to the closest part of the periphery of the stage 1109 and thereby arranged to apply a rotation to the stage 1109.

Figure 11I:
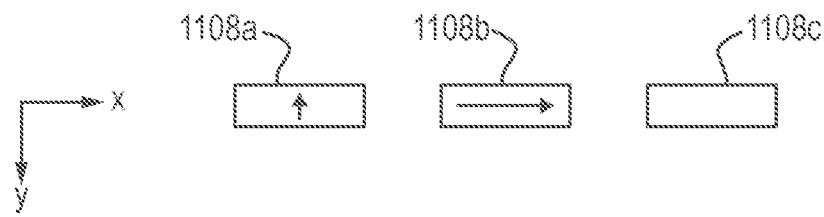

The piezo-electric actuator arrangement 1108 may only comprise a stack of two piezo-electric actuators. FIG. 11I shows possible operations states of a first piezo-electric actuator 1108a and a second piezo-electric actuator 1108b in the piezo-electric actuator arrangement 1108. Each piezo-electric actuator arrangement is arranged to move the stage linearly in two opposite directions. The movements applied by the first piezo-electric actuator 1108a may be in the y-direction. The movements applied by the second piezo-electric actuator 1108b may be in the x-direction.

The stack may comprise a spacer 1108c, i.e. blank, so that it is the same height as the other stacks.

The embodiment shown in FIGS. 11F to 11I allows the stage to be moved in the x-direction and the y-direction by only activating the piezo-electric actuators in each stack that are arranged to apply movements in these directions. The stage may be rotated by applying a movement by the third piezo-electric actuators 1106c and 1107c, as well as a movement by the second piezo-electric actuator 1108b.

In the above-described first and second implementations of the present embodiment, an end of the preloading spring may move over the surface of the stage 1009 when the stage is moved. To avoid this, the above-described first and second implementations of the present embodiment may alternatively have corresponding piezo-electric actuator arrangements both arranged to act on the up-beam and down-beam major surfaces of the stage. That is to say, a preloading spring, or other force applying device, may be in contact with a first piezo-electric actuator arrangement that is in contact with the up-beam major surface stage 1009. A second piezo-electric actuator arrangement, that corresponds to the first piezo-electric actuator arrangement and is arranged inline in the z-direction with the first piezo-electric actuator arrangement, may be in contact with the down-beam major surface stage 1009 and the base of the module. Contact pads may be provided between each component.

In the present embodiment, the support arrangement may be a part of the stage 1109 that is configured to hold the electron-optical device 404. Alternatively, the support arrangement may be separate component that is secured to the stage 1109.

According to a fourth embodiment, shown in FIGS. 12A to 12D, the support positioning system comprises a plurality of piezo-electric actuator arrangements 1201, 1202, 1205, 1206 that are configured to move a stage. The support positioning system according to the fourth embodiment may be used instead of that described in the first, second and/or third embodiments. Embodiments also include elements of the support positioning system according to the fourth embodiment being used in addition to those described in the first, second and/or third embodiments.

Figure 12A:
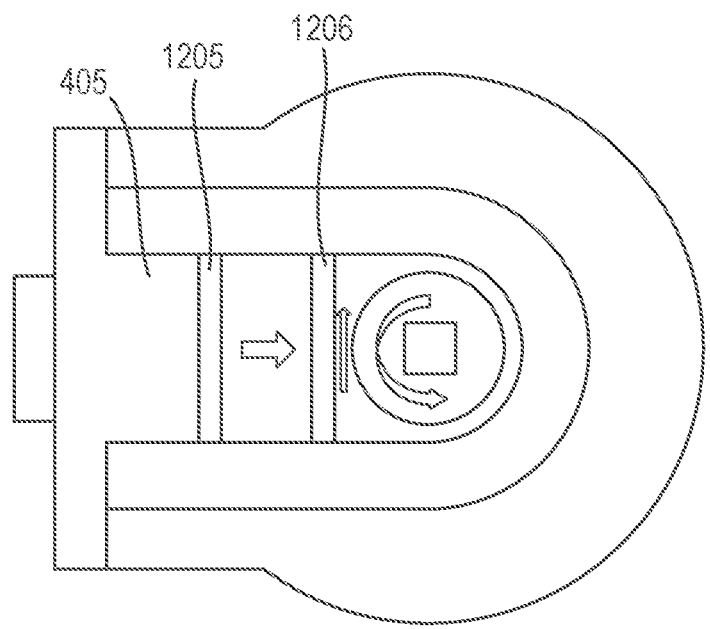
FIG. 12A is a schematic diagram of a cross section through a module according to an implementation of a fourth embodiment.

FIG. 12A shows a schematic plan view of the module 405. The module comprises piezo-electric arrangement 1205 and piezo-electric arrangement 1206. Piezo-electric arrangement 1205 may be arranged so that it may move the piezo-electric arrangement 1206 bi-directionally in the x-direction. Piezo-electric arrangement 1206 may be arranged so that it may move the part of the module 405 that comprises the stage bi-directionally in the y-direction. Embodiments also include the piezo-electric arrangement 1205 alternatively applying movements in the y-direction and piezo-electric arrangement 1206 alternatively applying movements in the x-direction. The module 405 also comprises one or more piezo-electric arrangements for applying bi-directional rotation to the stage around Rz.

Figure 12B:
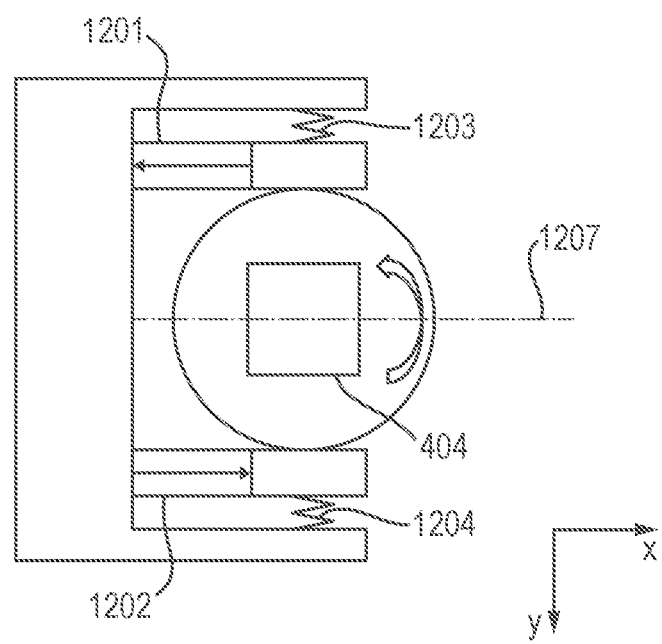
FIG. 12B is a schematic diagram of a cross section through part of a module according to an implementation of the fourth embodiment.

FIG. 12B is a schematic plan view of the part of the module 405 that comprises the stage and the piezo-electric actuator arrangements 1201, 1202.

As shown in FIG. 12B, the support positioning system may comprise two piezo-electric arrangements 1201, 1202. In the current embodiment, the piezo-electric arrangements 1201, 1202 may be on opposite sides of the stage. That is to say, the piezo-electric actuator arrangement 1201 may contact a sidewall of the stage at a first location and the piezo-electric actuator arrangement 1202 may contact a sidewall of the stage at a second location that is, for example, diametrically opposite the first location.

In the fourth embodiment, each piezo-electric arrangement 1201, 1202 may comprise piezo-electric actuator(s) arranged to move in either linear directions along a first axis, that may be the x-axis. Each piezo-electric actuator arrangement 1201, 1202 may also comprise a block that is moved by the piezo-electric actuator arrangement 1201, 1202 and is the part of the piezo-electric actuator arrangement 1201, 1202 that is pressed against the sidewall of the stage. As described earlier for the third embodiment, a contact pad may be provided between each piezo-electric actuator arrangement and the stage.

Each of the piezo-electric actuator arrangements 1201, 1202 may be preloaded by a spring 1203, 1204, or other force applying device. Spring 1203 is arranged on an opposite side of the piezo-electric actuator arrangement 1201 to the stage and is arranged to press the piezo-electric actuator arrangement 1201 into the stage. Similarly, spring 1204 is arranged on an opposite side of the piezo-electric actuator arrangement 1202 to the stage and is arranged to press the piezo-electric actuator arrangement 1202 into the stage. The stage is thereby held under compression by the piezo-electric actuator arrangements 1201, 1202. As shown in FIG. 12B, piezo-electric actuator arrangement 1201 is pre-loaded by the spring 1203 and piezo-electric arrangement 1202 is pre-loaded by the spring 1204.

In the fourth embodiment, the stage may be moved in the x-direction by the piezo-electric actuator arrangement 1205. The stage may be moved in the y-direction by the piezo-electric actuator arrangement 1206.

When the piezo-electric actuator arrangement 1201 and piezo-electric actuator arrangement 1202 are arranged to move by the same amount but in opposite directions to each other, the stage will be rotated about Rz.

Figure 12C:
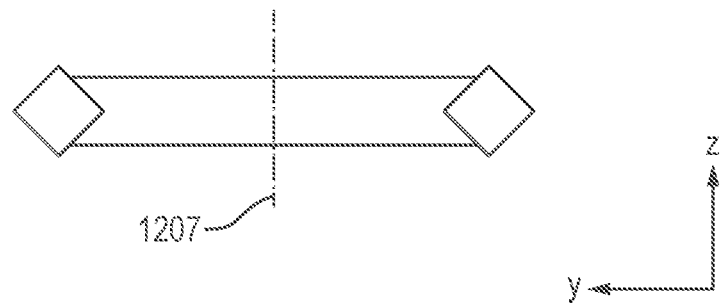
FIG. 12C is a schematic diagram of a cross section through part of a module according to an implementation of the fourth embodiment.

As shown in FIG. 12C, the piezo-electric actuator arrangements 1201 and 1202 may be provided in the same plane as the stage. The piezo-electric actuator arrangements 1201 and 1202 are arranged as bearings that support the stage and may apply a rotation to the stage.

Figure 12D:
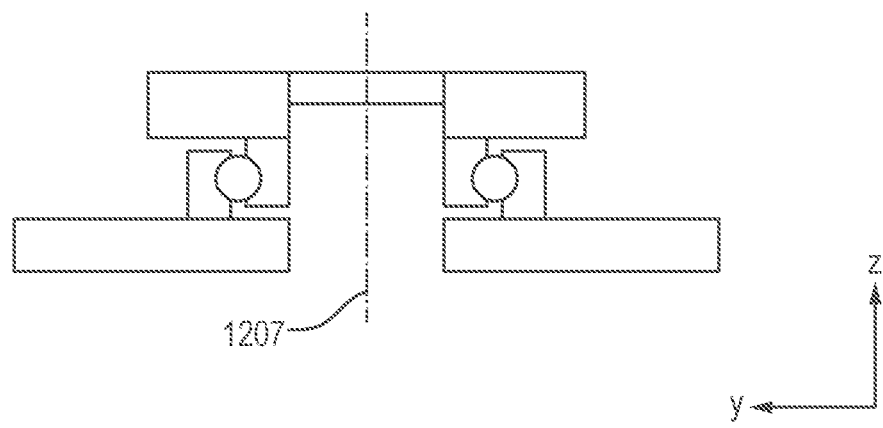
FIG. 12D is a schematic diagram of a cross section through part of a module according to an implementation of the fourth embodiment.

FIG. 12D shows an alternative arrangement to that shown in FIG. 12C. The stage is provided on mechanical bearings for supporting the stage. The piezo-electric actuator arrangements 1201 and 1202 may apply rotation to the stage without being a primary support of the stage.

Embodiments also include an alternative support arrangement of the stage to using mechanical bearings. The stage may comprise a circular grove that sits on fixed supports. One or more biasing members, such as a leaf springs, may be provided for pressing the stage into the supports.

In the present embodiment, the support arrangement may be a part of stage that is configured to hold the electron-optical device 404. Alternatively, the support arrangement may be separate component that is secured to the stage.

Figure 13:
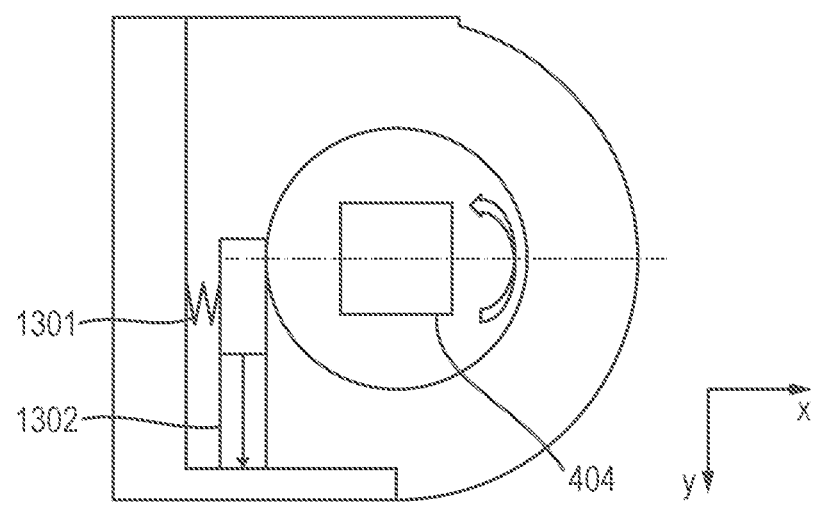
FIG. 13 is a schematic diagram of a cross section through part of a module according to a fifth embodiment.

A fifth embodiment, shown in FIG. 13, differs from the fourth embodiment by the support positioning system comprising a single piezo-electric actuator arrangement 1302 that is configured to rotate the stage.

FIG. 13 shows a schematic plan view of the part of the module 405 that comprises the stage and the piezo-electric actuator arrangement 1302 for rotating the stage.

The piezo-electric actuator arrangement 1302 may be the same as one of the piezo-electric actuator arrangements 1201, 1202 as already described in the fifth embodiment. The piezo-electric actuator arrangement is therefore able to move linearly.

The piezo-electric actuator arrangement is, in plan view, adjacent to and in contact with the stage. The piezo-electric actuator arrangement 1302 may be preloaded by a spring 1301, or other force applying device. The spring 1301 is arranged on an opposite side of the piezo-electric actuator arrangement 1302 to the stage and is arranged to press the piezo-electric actuator arrangement 1302 against the stage.

The linear movement of the piezo-electric actuator arrangement 1302 in a direction tangential to the stage rotates the stage.

The linear movements of the stage may be applied by piezo-electric actuator arrangements 1205, 1206 as already described for the fourth embodiment.

The stage may be provided on mechanical bearings for supporting the stage, as shown in FIG. 12D. Alternatively, the stage may comprise a circular groove, as already described for the fourth embodiment.

In the present embodiment, the support arrangement may be a part of stage that is configured to hold the electron-optical device 404. Alternatively, the support arrangement may be separate component that is secured to the stage.

In all of the above described third to fifth embodiments, a position detecting system may be provided. The position detecting system may comprise encoders for determining the movement and/or position of each piezo-electric arrangement and thereby the stage.

The above described first to fifth embodiments allow the repositioning of the support arrangement within the module 405. An electron-optical device 404, that is secured to the support arrangement, may thereby have fine adjustments made to its position as may be required for appropriately aligning the electron-optical device 404 with the other components of the charged particle apparatus 401. The above-described first to fifth embodiments may be capable of moving the electron-optical device 404 in a number of degrees of freedom. In particular, the above-described first to fifth embodiments may be capable of applying fine adjustments to the position of the electron-optical device 404 in an x-y plane and rotating it about the z-axis. Embodiments also the described first to fifth embodiments being adapted so that they only apply fine alignments in one or two degrees of freedom. For example, embodiments include an arrangement that is only able to: apply fine position adjustments bi-directionally along a single axis in the x-y plane, apply fine position adjustments in orthogonal directions in the x-y plane but not Rz movements, or only apply Rz movements.

Embodiments also include the below-described techniques for positioning an electron-optical device 404 in the module 405.

According to a sixth embodiment, a technique is provided for engaging the module 405 to the housing of the charged particle apparatus 401. The techniques of the sixth embodiment may be applied in together with any of the techniques in the above-described first to fifth embodiments.

Figure 14A:
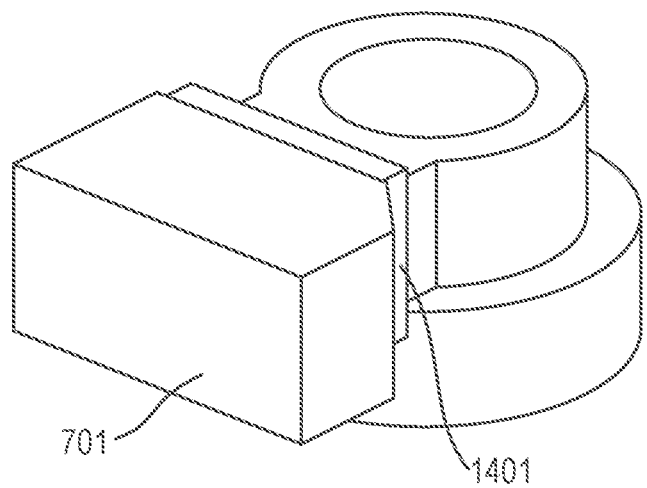
FIG. 14A is a schematic diagram of a module secured to a charged particle apparatus according to a sixth embodiment.

FIG. 14A shows a schematic diagram of the module 405 secured to the charged particle apparatus 401 according to the sixth embodiment.

Figure 14B:
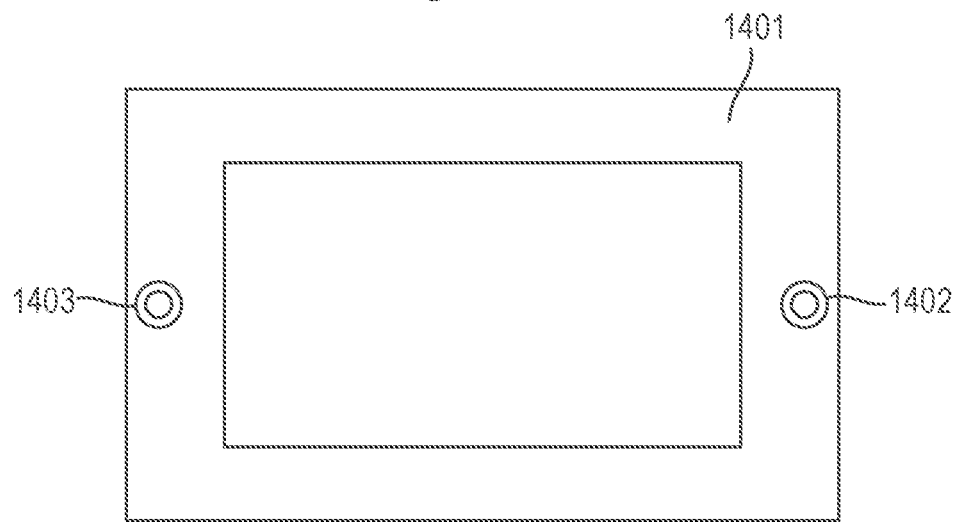
FIG. 14B is a schematic diagram of a flange on a charged particle apparatus according to the sixth embodiment.

As described earlier with reference to FIG. 7, the module 405 comprises a module flange 701 and a main body 702. As shown in FIGS. 14A and 14B, the charged particle apparatus 401 also comprises a flange 1401, referred to herein as a housing flange 1401. The process of securing the module 405 to the charged particle apparatus 401 comprises inserting the module 405 into the charged particle apparatus 401 and engaging the module flange 701 with the housing flange 1401. After the module flange 701 is engaged with the housing flange 1401, the module flange 701 may be secured to the housing flange 1401 by any known technique. For example, the module flange 701 may be bolted onto the housing flange 1401.

The module flange 701 and the housing flange 1401 comprise corresponding engagement surfaces that engage with each other. As shown in FIG. 14B, in the plane of the engagement surface of the housing flange 1401, the shape of the engagement surface may be that of a rectangular engagement surface that surrounds a rectangular opening. The engagement surface of the module flange 701 may have a corresponding shape. The facing surfaces of the module flange 701 and the housing flange 1401 may correspond to each other to provide a seal when secured to each other. The facing surfaces may be co-planar and flat. A vacuum seal may be provided that, when closed, ensures that the connection between the module flange 701 and the housing flange 1401 is airtight so that a vacuum may be created in the part of the charged particle apparatus 401 that comprises the module 405. The vacuum seal may be opened when a module is removed from the charged particle apparatus 401.

As also shown in FIG. 14B, the housing flange 1401 may comprise two or more alignment pins 1402, 1403 that protrude from its surface. Preferably, there are two alignment pins and the alignment pins are provided on opposite sides of the opening in the housing flange 1401. The module flange 701 may comprise corresponding recesses for receiving the alignment pins. The alignment pins may be inserted in the corresponding recesses when the module 405 is inserted into the charged particle apparatus 401. The insertion of the alignment pins into respective recesses advantageously allows coarse positioning of the module 405 in the charged particle apparatus 401. In particular, due to the direct engagement of the module flange 701 and the housing flange 1401, the module 405 is positioned along the charged particle path 403, that may be a z-direction. In the current embodiment, the module 405 may also be coarsely positioned in the direction between the alignment pins, that may be a y-direction. The module 405 may also be coarsely positioned with respect to the direction of insertion of the module 405 into the charged particle path 403, which may be a x-direction. The module 405 may also be coarsely positioned with respect to rotation about the x-direction, i.e. Rx, rotation about the y-direction, i.e. Ry, and rotation about the z-direction, i.e. Rz. The module 405 may therefore be coarsely positioned, in six degrees of freedom, in a plane that is orthogonal to the charged particle path in the charged particle apparatus.

Embodiments also include an alternative implementation in which the module flange 701 comprises alignment pins and the housing flange 1401 comprises corresponding recesses. Alternatively, both the module flange 701 and the housing flange 1401 may comprise alignment pins and corresponding recesses.

The alignment pins and corresponding recesses may both have circular cross sections. However, embodiments also include the alignment pins having oval cross sections. Alternatively, or additionally, the recesses may be slot shaped instead of circular. The use of non-circular alignment pins and/or recesses may allow the alignment tolerances to be less than the manufacturing tolerances.

According to a seventh embodiment the module 405 is configured so that the position of the support positioning system within the module 405 may be adjusted.

Figure 15A:
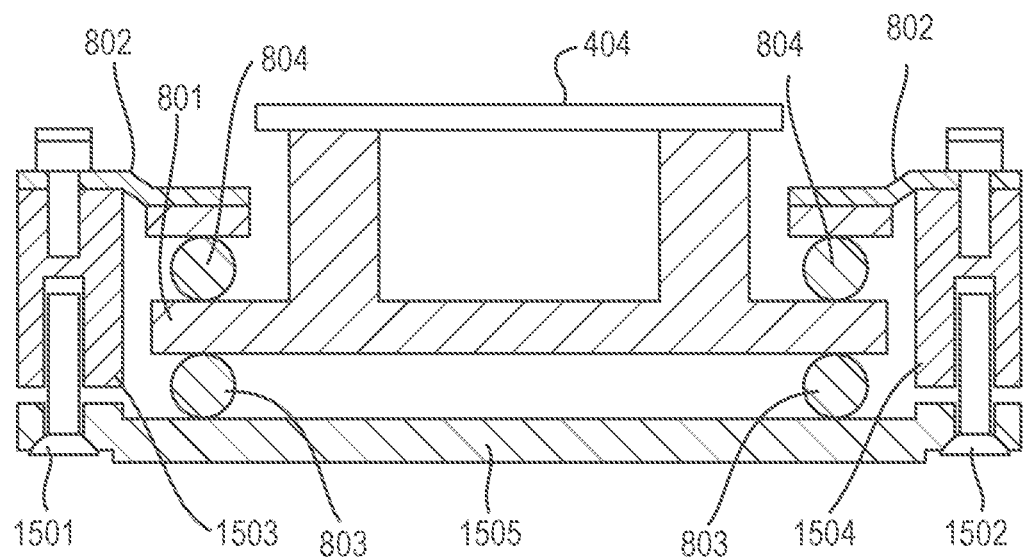
FIG. 15A is schematic diagram of part of a module according to a seventh embodiment in a charged particle apparatus.

FIG. 15A shows cross-section through part of the main body 702 of the module 405 in a plane that comprises the charged particle path 403. The support positioning system in the module 405 is according to the first embodiment of a module as described above with reference to FIGS. 8 and 9.

The support positioning system is supported in the main body 702 of the module 405 by a plurality of adjustable supports 1501, 1502. The adjustable supports 1501, 1502 may be, for example, adjustable sprung bolts or adjustable fasteners, such as pins with locking bolts. There may be a corresponding adjustable support 1501, 1502 for each one of the ball bearings 804 in contact with the up-beam and/or down-beam surface of the disc. For example, there may be three adjustable supports equally spaced around the support positioning system.

Figure 15B:
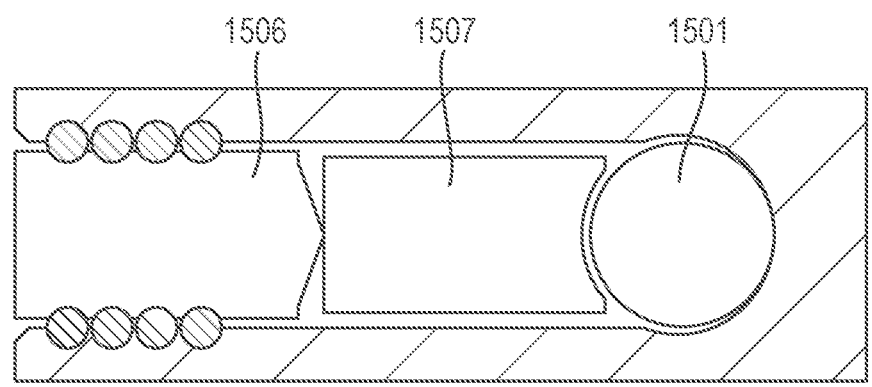
FIG. 15B is schematic diagram of a locking bolt arrangement according to a seventh embodiment.

Each adjustable support 1501, 1502 may comprise a half spherical end and a longitudinal body. The longitudinal body may be an unthreaded pin. The half spherical end of each adjustable support 1501, 1502 may be received by a conical, or v-shaped, recess in a bottom plate 1505. The main body 702 of the module 405 may comprise parts 1503, 1504 with channels for receiving the longitudinal body of each adjustable support 1501, 1502. The extent that each adjustable support 1501, 1502 is inserted into a channel may be adjustable. For example, the longitudinal body of each adjustable support 1501, 1502 may be moved to any location in a corresponding channel and then fixed in position. The longitudinal body of each adjustable support 1501, 1502 may be fixed in position in a channel by a locking bolt arrangement, such as that shown in FIG. 15B. The locking bolt arrangement shown in FIG. 15B comprises a threaded bolt 1506 and a press piece 1507. The threaded bolt 1506 and press piece 1507 are arranged in a channel that may be orthogonal to the channel for the longitudinal body of the adjustable support 1501. When the bolt is rotated so that the end of the bolt is pressed against the press piece 1507, the press piece 1507 is pressed against the longitudinal body and the position of the longitudinal body in the channel is thereby fixed. Rotation of the bolt 1506 in the opposite direction releases the force applied against the longitudinal body and the longitudinal body and thereby move along the channel.

The separation in the z-direction of each part 1503, 1504 and the bottom plate 1505 can therefore be adjusted by adjusting the extent that each adjustable support 1501, 1502 is inserted into a respective channel.

As shown in FIG. 15A, the ball bearings 804 may be in contact with the up-beam surface of the disc and also a module plate 802. Each module plate 802 is biased to apply a force on a ball bearing 804 so that all of the ball bearing 804, the disc and ball bearing 803 are held under compression between the module plate 802 and the bottom plate 1505. Accordingly, the plane of the disc, and thereby the entire support positioning system, may be held parallel with, and at a substantially fixed relation with, the upper surface of the bottom plate 1505.

The parts 1503, 1502 may in a fixed connection with the flange 701 of the module 405 so that they cannot be substantially moved relative to the flange 701. The bottom plate may only be connected to the rest of the module by the adjustable supports 1501, 1502. Accordingly, by adjusting the amount that the adjustable supports 1501, 1502 are inserted into the corresponding parts 1503, 1502, the z-position of the bottom plate relative to the flange 701 may be adjusted. By applying different adjustments to all of the adjustable supports 1501, 1502, the bottom plate, and thereby entire support positioning system may be tilted in Rx and Ry, as well as adjusted in the z-direction.

Accordingly, in the current embodiment, when the module 405 is outside of the charged particle apparatus 401, each of the adjustable supports 1501, 1502 may be manually, and/or automatically, operated to adjust the position of the support positioning system relative to the flange 701 of the module 405. The z-position and tilt, i.e. Rx and Ry state, of the support positioning system, and consequently an electron-optical device 404, can thereby be set by the adjustable supports 1501, 1502 before the module 405 is inserted into the charged particle apparatus 401. Thus, the position of the electron-optical device 404 and its support arrangement may be adjusted relative to the flange 701 of the module 405 in z, Rx and Ry, and also relative to the housing flange 1401 when the two flanges are secured together. Hence, the electron-optical device 404 position can be pre-calibrated, i.e. pre-adjusted, relative to the charged particle apparatus, for example the frame (not shown) of the charged particle apparatus, before insertion of the module 405 into the charged particle apparatus 401. So, after mounting of the module 405 on the charged particle apparatus 401, the support arrangement and the supported electron-optical device 404 are coarsely positioned in a desired location relative to the frame.

The adjustments of the z-position and/or tilt, i.e. Rx and Ry state, of the electron-optical device 404 relative to the flange 701 of the module 405 according to the seventh embodiment may be referred to as a pre-calibration operation. The techniques of the seventh embodiment may be applied in addition to those of the sixth embodiment, as well as any of the first to fifth embodiments.

According to an eighth embodiment, further techniques are applied for aligning the electron-optical device 404 with a source beam. After the module 405 comprising the electron-optical device 404 has been secured to the charged particle apparatus 401, electron-optical alignment techniques may be used to align a source beam with the electron-optical device 404. For example, electric and magnetic charged particle manipulators, such as deflectors and lenses (not shown), may be used up-beam of the module 405 to control the path of a source beam so that it is appropriately aligned with the electron-optical device 404. For example: manipulators such as deflectors for example in the form of multipoles may be used to adjust the beam path in axes orthogonal to the beam path, such as in the x axis and/or in the y axis. A set of two deflectors may be used along the beam path to adjust in each axis. The first of each pair applies a correction to the path, and the second of each set redirects the beam along a path that corresponds to a desired angle of incidence on the device, which may correspond to the angle of incidence of the beam path to the first deflector of the set. Because of the redirection of the second of the set, the correction of the first deflector of each set is in effect an over-correction. Micro-deflector array 323 may be used for this electrostatic correction, for example if it was located up beam of the module. A condenser lens arrangement such as condenser lens 210 or 310 could be controlled to apply a correction in Rz to the path of the beam. Electric and magnetic charged particle manipulators, such as deflectors and lenses (not shown), may additionally and/or alternatively be used down-beam of the module 405 to control the path(s) of a beam, or multi-beam, output form the module 405.

The electron-optical alignment techniques of the eighth embodiment may be applied in addition to, or instead of, the techniques of one or more of the first to seventh embodiments. In particular, the alignment process of the electron-optical device 404 with a charged particle beam, or multi-beam, may comprise determining the location of one or more beams that have passed through the electron-optical device, and/or one or beams that have been reflected by the electron-optical device, and then applying fine position adjustments in dependence on the determined beam locations. The fine position adjustments may include mechanical adjustments according to the techniques of the first to fifth embodiments and/or the electronic/electron-optical alignment techniques of the eighth embodiment.

The extent of re-positioning provided by the pre-calibration techniques of the seventh embodiment depends on the design of the module. The adjustments in the z direction may be from less than 50 µm to greater than 200 µm. The adjustments in Rx and Ry may be for less than 0.1 mrad to greater than 1 mrad.

The sixth embodiment may be referred to as a coarse positioning technique. The sixth embodiment may be used to position an electron-optical device 404 in x, y and z to within 50 µm to 200 µm relative to a vacuum chamber for the module in the charged particle apparatus. The position in Rx, Ry and Rz may be between 1 mrad to 5 mrad with respect to the vacuum chamber.

The techniques of the sixth and seventh embodiment may position an electron-optical device within a known range of locations relative to the vacuum chamber. However, due to the variation in the position of the charged particle beam path, the electron-optical device may be within 1 mm in the x- and/or y-directions from the charged particle beam path, and 100 mrad in Rz from the charged particle beam path.

The first to fifth embodiments, as well as the eighth embodiment, may be referred to as fine positioning techniques. They may be used to align the electron-optical device 404 with a charged particle beam, or multi-beam.

The first to fifth embodiments may be able to move the electron-optical device by 0.5 µm to 100 µm in the x and/or y-direction, as well as apply up to 1 rad rotation in Rz.

The eighth embodiment may be able to move the charged particle beam path by up to 2 mm in the x and/or y-direction, as well as apply up to 1 rad rotation in Rz. The eighth embodiment may be able to move the charged particle beam path in the z-direction by changing the focus of the charged particle beam, or multi-beam.

Embodiments also include applying manual, and/or automatic, re-positioning techniques to other components in the charged particle apparatus 401. For example, the source 402 and/or objective lens may be moved. For example, a source beam may first be aligned to an objective lens and then the techniques according to any of the embodiments described herein applied to align a charged particle beam, or multi-beam, with the electron-optical device 404.

Embodiments also include a method of installing an electron-optical device 404 in a charged particle apparatus 401. The method may comprise one or more of the steps of: attaching an electron-optical device 404 to a module 405; performing a pre-calibration process to adjust the relative positon of the electron-optical device 404 and the module 405; applying a coarse adjustment to the Rx state of the electron optical device 404 relative to a main body 702 of the module 405; applying a coarse adjustment to the Ry state of the electron optical device 404 relative to a main body 702 of the module 405; applying a coarse adjustment to the z-position of the electron optical device 404 relative to a main body 702 of the module 405; and/or securing the module 405 to a charged particle apparatus 401. The module 405 may be a module according to any of the above-described first to fifth embodiments. The pre-calibration process may be according to the above-described seventh embodiment. The coarse alignment process may be according to the above-described sixth embodiment.

After a module 405 comprising an electron-optical device 404 has been secured to a charged particle apparatus 401, embodiments include a method of aligning the electron-optical device 404 with a charged particle beam, or multi-beam, within the charged particle apparatus 401. The method may comprise one or more of the steps of: applying a fine adjustment to the x-position of the electron optical device 404 relative to a main body 702 of the module 405; applying a fine adjustment to the y-position of the electron optical device 404 relative to a main body 702 of the module 405; applying a fine adjustment to the Rz state of the electron optical device 404 relative to a main body 702 of the module 405; and/or applying an adjustment to the path of a charged particle beam, or multi-beam, within the charged particle apparatus 401. The module 405 may be a module 405 according to any of the above-described first to fifth embodiments. The applied adjustments to the path of a charged particle beam, or multi-beam, within the charged particle apparatus may be according to the techniques of the above-described eighth embodiment.

The above-described method of installing an electron-optical device 404 in a charged particle apparatus 401 may be applied together with the above-described method of aligning an electron-optical device 404 with a charged particle beam, or multi-beam, within a charged particle apparatus 401.

A method of replacing an electron-optical device 404 in a charged particle apparatus 401 may comprise: switching off the power supply to the source; closing the valves that isolate the vacuum chamber that comprises the module 405; venting the vacuum chamber; unsealing the vacuum seal of the vacuum chamber; removing the module 405 from the charged particle apparatus 401; inserting a replacement module 405 into the charged particle apparatus 401; sealing the vacuum seal of the vacuum chamber; pumping the vacuum chamber to restore the vacuum chamber to vacuum conditions and baking the module 405; opening the valves that isolate the vacuum chamber; performing mechanical fine alignment; switching on the power supply to the source; performing a high voltage test; and performing electrical fine alignment of the electron-optical device 404 and the charged particle path 403.

Figure 17:
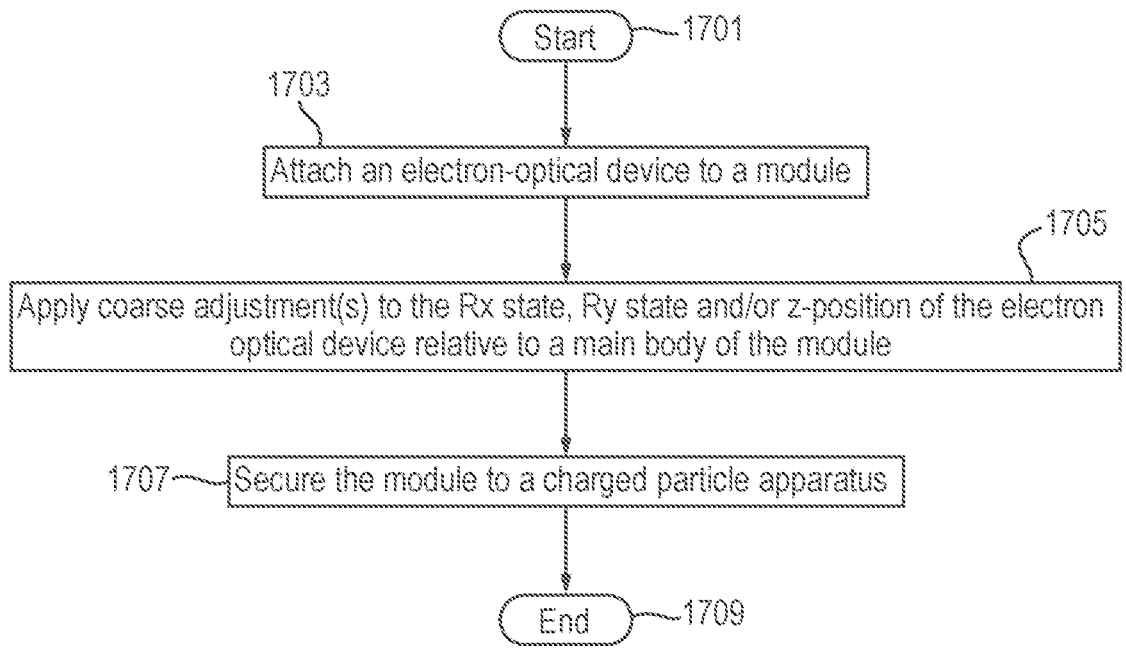
FIG. 17 is a flowchart of a method according to an embodiment.

FIG. 17 shows a flowchart of a method of installing an electron-optical device within a charged particle apparatus according to an embodiment.

In step 1701, the method begins.

In step 1703, an electron-optical device is attached to a module.

In step 1705, a coarse adjustment is applied to the Rx state, Ry state and/or z-position of the electron optical device relative to a main body of the module.

In step 1707, the module is secured to a charged particle apparatus.

In step 1709, the method ends.

Figure 18:
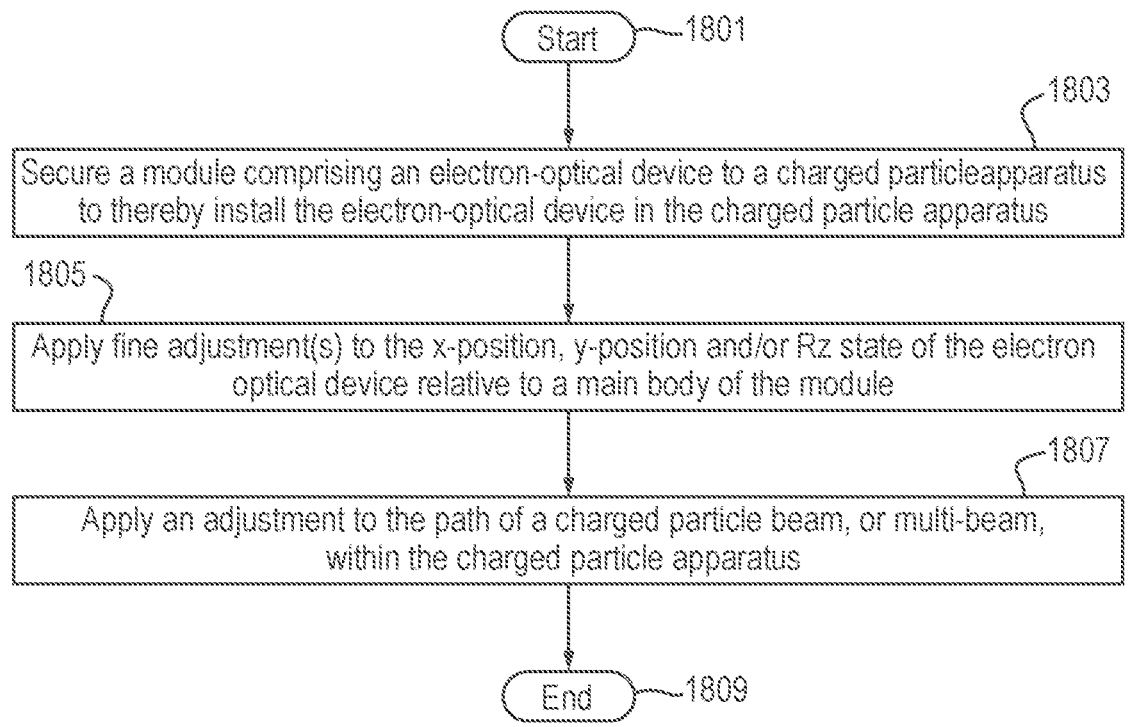
FIG. 18 is a flowchart of a method according to an embodiment.

FIG. 18 shows a flowchart of a method of aligning an electron-optical device with a charged particle beam, or multi-beam, within a charged particle apparatus according to an embodiment.

In step 1801, the method begins.

In step 1803, a module comprising an electron-optical device is secured to a charged particle apparatus to thereby install the electron-optical device in the charged particle apparatus.

In step 1805, fine adjustment(s) are applied to the x-position, y-position and/or Rz state of the electron optical device relative to a main body of the module.

In step 1807, an adjustment to the path of a charged particle beam, or multi-beam, within the charged particle apparatus is applied.

In step 1809, the method ends.

Embodiments include a number of modifications and variations to the techniques described above.

In the above-described embodiments, the main body 702 of the module 405 is permanently secured to the module flange 701. Embodiments also include an equivalent feature to the main body of the module 405 being secured, and optionally permanently located, in the charged particle apparatus 401. An equivalent feature to the flange (not shown) is separate from the main body and is effectively a removable cover for access to the equivalent feature to the main body. An electron-optical device may be replaced by removing the flange to thereby gain access to an electron-optical device on the equivalent feature to the main body. In such an arrangement in which the flange is separate, and mechanically independent, from the rest of the module including the support and the device, the module has an engagement arrangement which interacts with an engagement arrangement within the apparatus, preferably the column to coarsely align the module and thus the device relative the frame of the apparatus. The engagement arrangement of the apparatus and of the module may take the form of a drawer capable of aligning the module relative to the frame in all degrees of freedom and may include a flange and pin features applied to this arrangement and adapted from embodiment six.

Throughout embodiments, techniques for positioning an electron-optical device are described.

Figure 16:
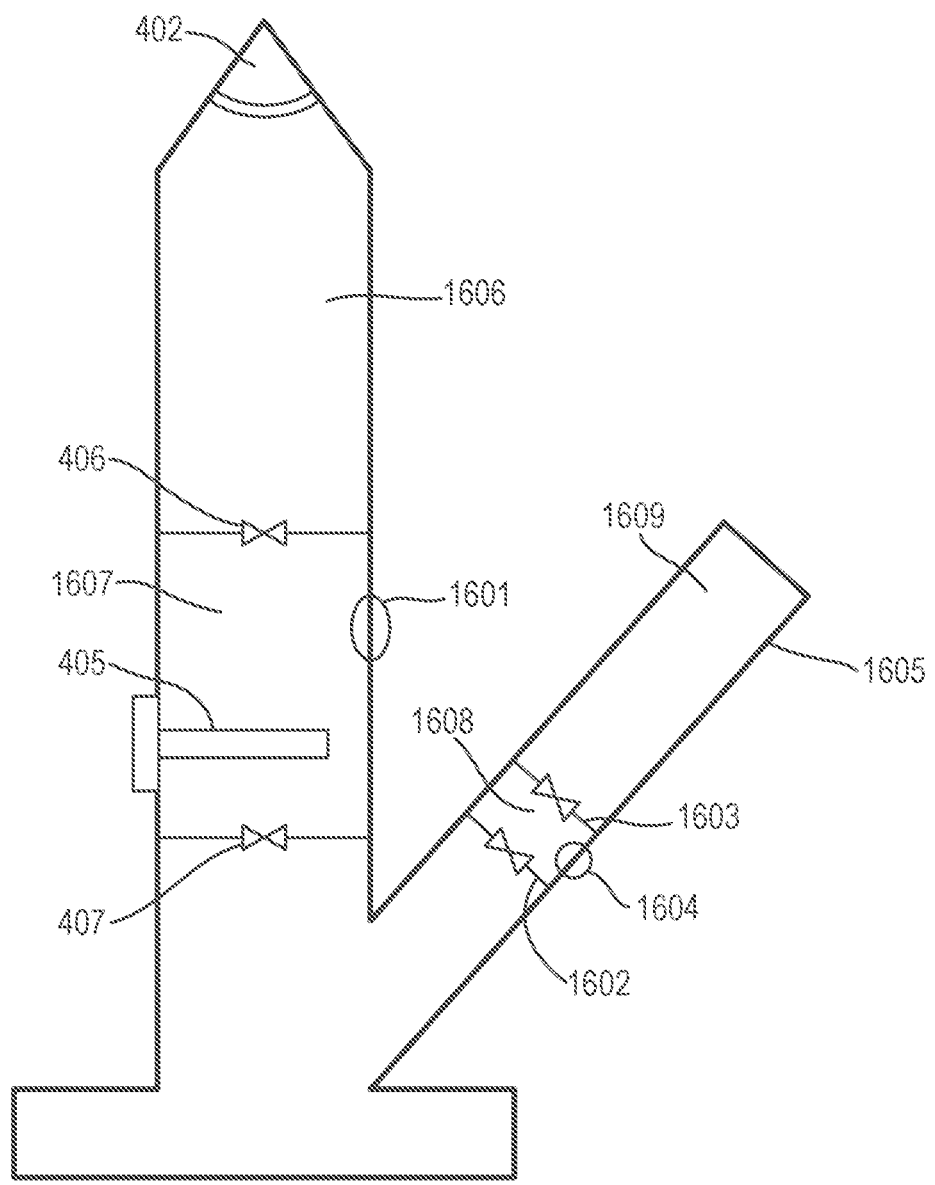
FIG. 16 is a schematic diagram of a charged particle apparatus according to an embodiment.

Vacuum locks may also be provided at other locations of the charged particle apparatus 401 and a tool comprising the charged particle apparatus 401. For example, as shown in FIG. 16, there may be a source vacuum lock (not shown) between the up-beam vacuum lock 406 and the source 402. The source vacuum lock allows the region of the charged particle apparatus 401 that comprises the source 402 to be isolated from the rest of the charged particle apparatus 401 and the time to replace the source 402 to be reduced. The source 402 may also be comprised by a replaceable module so that the source 402 is field replaceable.

As shown in FIG. 16, a vent/pump valve 1601 may be provided in the module region 1607 that is isolated by the up-beam valve 406 and the down-beam valve 407. The vent/pump valve 1601 may be used to both vent and pump the module region 1607 when the module 405 is replaced. The vent/pump valve 1601 may be used to also vent and pump the source region 1606, with up-beam valve 406 open and down-beam valve 407 closed. With the module region 1607 vented, the module 405 may be dismounted.

With the source region vented and the up-beam valve closed, a source module comprising the source 402 and the source region 1606 may be dismounted from the apparatus. In another arrangement the source region may have a designated vent/pump valve. The source region may be operated independently of the module region 1607. The source module may be field replaceable.

A shown in FIG. 16, a tool comprising the charged particle apparatus 401 may also comprise a secondary column 1605 that comprises a detector (not shown) and a probe (not shown). The detector may be configured to detect electrons, e.g. secondary electrons, from a sample. Up-beam vacuum lock 1602 and down-beam vacuum lock 1603 may be provided up-beam and down-beam of the detector and provide an isolated detector region 1608 in the secondary column. Vent/pump valve 1604 may be provided in the detector region 1608 that is isolated by the up-beam valve 1602 and the down-beam valve 1603. The detector may therefore also be field replaceable. The vent/pump valve 1604 may be used to also vent and pump the probe region 1609, with up-beam valve 1602 closed and down-beam valve 1603 open.

In an arrangement, the apparatus may comprises more than one module 405 which may be located in one or more isolatable and/or independently operable module regions. The detector column may have one or more modules in one or more isolatable and/or independently operable module regions. Each additional modules may be field replaceable.

Embodiments also include the device supported by the module 405 being a different type of device than an electron-optical device 404.

The charged particle apparatus 401 may specifically be a multi-beam charged particle apparatus. The charged particle apparatus may comprise any of the components of the apparatuses described above with reference to FIGS. 1, 2 and 3.

The multi-beam charged particle apparatus may be a component of an inspection (or metro-inspection) tool or part of an e-beam lithography tool. The multi-beam charged particle apparatus may be used in a number of different applications that include electron microscopy in general, not just SEM, and lithography.

The multi-beam charged particle apparatus may comprise more than one source of charged particles.

Throughout embodiments a charged particle axis is described. This axis describes the path of charged particles through and output from the source 201, 301. The sub-beams of an output multi-beam may all be substantially parallel to the charged particle optical axis 403. The charged particle optical axis 204, 304 may be the same as, or different from, a mechanical axis of the illumination apparatus.

Embodiments include the following statements.

According to a first aspect of the invention, there is provided a module for supporting a device configured to manipulate charged particle paths in a charged particle apparatus, the module comprising: a support arrangement configured to support the device, wherein the device is configured to manipulate a charged particle path within the charged particle apparatus; and a support positioning system configured to move the support arrangement within the module; wherein the module is arranged to be field replaceable in the charged particle apparatus.

Preferably, when the module is in use in a charged particle apparatus with a device held by the support arrangement: the charged particle path is substantially parallel to a charged particle axis of the charged particle apparatus.

Preferably, the support positioning system is configured to move the support arrangement in at least three degrees of freedom of movement.

Preferably, the charged particle axis corresponds to a z-axis; the module is a substantially planar structure in an x-y plane; and the at least three degrees of movement comprise movement in the x-y plane and rotation about the z-axis (Rz).

Preferably, the support positioning system is a manual and/or an automatic positioning system.

Preferably, the support positioning system is configured to: move the support arrangement to within about 0.5 μm to 100 μm of a desired position of the support arrangement; and/or to apply up to 1 rad rotation in Rz to the support arrangement.

Preferably, the module further comprises a position detecting system configured to determine the movement and/or position of the support arrangement and/or a device held by the support arrangement.

Preferably, the position detecting system comprises a grid mark, such as an encoder, for use in determining the movement and/or position of the support arrangement and/or a device held by the support arrangement.

Preferably, the position detecting system is configured to determine the movement and/or position of the support arrangement, and/or a device held by the support arrangement, in dependence one or more features of the device held by the support arrangement.

Preferably, the one or more features of the device comprise: an array of openings; and/or one or more fiducials.

Preferably, the array of openings are an array of openings for use in aligning substrates in a substrate stack comprised by the device during manufacture of the device.

Preferably, the array of openings are for charged particle paths through beam manipulators comprised by the device.

Preferably, the module further comprises receiving parts that are configured to receive the respective ends of actuator arms.

Preferably, the actuator arms are comprised by actuators that are external to the module; and the support positioning system is configured to be moved by the actuators.

Preferably: a first receiving part is arranged to receive an end of a first actuator arm for moving the support positioning system in a first direction; a second receiving part is arranged to receive an end of a second actuator arm for moving the support arrangement, by the support positioning system in a second direction, that may be orthogonal to the first direction; and a third receiving part is arranged to receive the end of a third actuator arm for rotating the support arrangement.

Preferably, the first and second directions are in an x-y plane; and the rotation is about an axis, such as a z-axis, that is orthogonal to the x-y plane.

Preferably, the support positioning system comprises: a disc; and a plurality of load bearing rotatable objects configured to support the disc within the module.

Preferably: the disc has an up-beam surface and a down-beam surface; a first set of one or more load bearing rotatable objects is arranged to contact the up-beam surface of the disc; and a second set of a plurality of load bearing rotatable objects is arranged to contact the down-beam surface of the disc.

Preferably, the first set of load bearing rotatable objects comprises one, two or three load bearing rotatable objects; and the second set of load bearing rotatable objects comprises three load bearing rotatable objects.

Preferably, in a plan view, the disc is arranged such that, when the module is installed within a charged particle apparatus, the charged particle path passes through an opening defined in the disc.

Preferably, in a plan view, the disc is substantially annular.

Preferably, the disc is a substantially planar structure, preferably in the x-y plane.

Preferably, the disc comprises the support arrangement.

Preferably: the module comprises a first force applying device arranged to apply a force to the disc, wherein the force in the substantially in same plane as the disc and is for moving the disc within the plane; and the module comprises a second force applying device arranged to apply a force to the disc, wherein the force is in the substantially in same plane as the disc and is for rotating the disc.

Preferably, the first force applying device is configured so that its applied force is substantially in a direction that passes through the axis of rotation of the disc so that the force does not substantially rotate the disc.

Preferably, in use, the disc is compressed by a force from the first force applying device; a force applied to the first receiving part; and a force applied to the second receiving part.

Preferably, in use, the second force applying device arranged to apply a force that presses the third receiving part into the end of the third actuator arm.

Preferably, the second force applying device arranged to apply a force to a first protrusion from a sidewall of the disc; and/or the third receiving part comprises a second protrusion from a sidewall of the disc.

Preferably: the module comprises a force applying device arranged to apply a force to the disc; the applied force in the substantially in same plane as the disc; the applied force is for moving the disc linearly within the plane; and the applied force is for rotating the disc.

Preferably, the module comprises one or more axial force applying devices arranged so that the disc is held under compression between the first and second sets of load bearing rotatable objects.

Preferably: each axial force applying device comprises a plate for contacting one of the load bearing rotatable objects; and/or one or more of the axial force applying devices are resilient members, such as springs.

Preferably, the support positioning system comprises a flexure arrangement.

Preferably, the flexure arrangement comprises an Rz flexure arrangement and an x-y flexure arrangement.

Preferably, the Rz flexure arrangement and the x-y flexure arrangement are both substantially planar structures, preferably in the x-y plane.

Preferably, the Rz flexure arrangement and the x-y flexure arrangement are arranged in a stack; and the Rz flexure arrangement is preferably down-beam of the x-y flexure arrangement.

Preferably, in plan view, the Rz flexure arrangement comprises a substantially circular structure defining an opening in the Rz flexure arrangement.

Preferably, the center of the substantially circular structure is substantially aligned with the z-axis.

Preferably, in plan view, the Rz flexure arrangement comprises a cross; the cross comprises intersecting first and second crossbars at an intersection; the first crossbar is aligned in a first direction in the plane of the plane of the Rz flexure arrangement; and the second crossbar is aligned in a second direction in the plane of the Rz flexure arrangement, wherein the second direction is orthogonal to the first direction.

Preferably: the circular structure is at the intersection of the first and second crossbars; and the circular structure is supported between first and second parts of the first crossbar and between first and second parts of the second crossbar.

Preferably: the first crossbar is aligned with the first receiving part; and the second crossbar is aligned with the second receiving part.

Preferably, the Rz flexure arrangement comprises a base and a moveable body.

Preferably, the third receiving part comprises a recess in a sidewall of the Rz flexure arrangement.

Preferably, the Rz flexure arrangement comprises a rotational force applying device configured to apply a force for rotating the moveable body.

Preferably, in use, the rotational force applied by the rotational force applying device is configured to press the third receiving part into the end of the third actuator arm.

Preferably, the x-y flexure arrangement comprises: an outer structure; an intermediate structure; a central structure; and a plurality of leaf springs; wherein, in the plane of the x-y flexure arrangement, the intermediate structure is substantially surrounded by the outer structure, the first receiving part and the first receiving part; wherein, in the plane of the x-y flexure arrangement, the central structure is substantially surrounded by the intermediate structure; the outer structure is connected to the intermediate structure by at least one leaf spring; and the intermediate structure is connected to the central structure by at least one leaf spring.

Preferably: the at least one leaf spring that connects the intermediate structure to the central structure is arranged so that the central structure is arranged to move in a first direction relative to the outer structure in response to a force applied to the first receiving part; and the at least one leaf spring that connects the outer structure to the intermediate structure is arranged so that the intermediate structure is arranged to move in a second direction relative to the outer structure in response to a force applied to the second receiving part.

Preferably: the intermediate structure is connected to the central structure by two leaf springs arranged on opposite sides of the central structure; and the intermediate structure is connected to the outer structure by two leaf springs arranged on opposite sides to the intermediate structure.

Preferably, the module further comprises: a first biasing device arranged to apply a force so that the intermediate structure and/or central structure are held under compression in the first direction; and a second biasing device arranged to apply a force so that the intermediate structure and/or central structure are held under compression in the second direction.

Preferably, the outer structure of the x-y flexure arrangement is secured to the moveable body of the Rz flexure arrangement.

Preferably, the first and/or second biasing devices are resilient members, such as springs.

Preferably, the support positioning system comprises one or more linear actuators.

Preferably, each actuator is a piezo-electric actuator arrangement.

Preferably, each piezo-electric actuator arrangement comprises a two axis shear mode piezo-electric device.

Preferably, the support positioning system comprises a plurality of actuators.

Preferably, the number of actuators comprised by the support positioning system is three.

Preferably, the support positioning system comprises a stage.

Preferably, in plan view, the stage is substantially annular.

Preferably, the actuators are spaced at substantially equal angular positions about a mid-point of the stage.

Preferably, the actuators are aligned so that the angle between the longitudinal axes of adjacent actuators is 60 degrees.

Preferably, the actuators are configured so that all of the actuators may be operated together to rotate the stage in the plane of the stage.

Preferably, the actuators are configured so that all of the actuators may be operated together to move the stage in a first direction in the plane of the stage.

Preferably, the actuators are configured so that all of the actuators may be operated together to move the stage in a second direction in the plane of the stage, wherein the second direction is orthogonal to the first direction.

Preferably, the module further comprises one or more force applying devices, wherein each force applying device is arranged to apply a force that presses an actuator into the stage.

Preferably, in plan view, at least one actuator is arranged by the side of the stage and configured such that linear movement of the actuator causes the stage to rotate; and wherein, for each actuator by the side of the stage, there is a force apply device configured to apply a force that presses the actuator into the stage.

Preferably, there are two actuators by the side of the stage; and the actuators are on opposing sides of the stage.

Preferably, the module further comprises first and second linear actuators; wherein: the first linear actuator is arranged to move the second linear actuator in a first direction; and the second linear actuator is arranged to move the at least one actuator is arranged by the side of the stage in a second direction that is orthogonal to the first direction.

According to a second aspect of the invention, there is provided a module for supporting a device configured to manipulate the paths of charged particles in a charged particle apparatus, the module comprising: a module flange configured to attach to, and detach from, a housing flange of a housing of the charged particle apparatus such that the module is field replaceable in the charged particle apparatus.

Preferably, when the module is in use in the charged particle apparatus with the module supporting a device, the device is configured to manipulate a charged particle path that is substantially along the charged particle axis of the charged particle apparatus.

Preferably, the charged particle axis corresponds to a z-axis; and the module is a substantially planar structure in an x-y plane.

Preferably: the module flange comprises one or more holes for receiving alignment pins of the housing flange; and/or the module flange comprises one or more alignment pins for insertion into holes of the housing flange.

Preferably, the module flange comprises one or more alignment pins for insertion into the housing flange.

Preferably, the module comprises: a device support arrangement for supporting the device; and a mechanism for adjusting the positon of the device support arrangement in at least one degree of freedom of movement.

Preferably, the device support system allows the position of the device support arrangement to be adjusted in three degrees of freedom of movement; and the three degrees of freedom of movement are preferably the z, Rx and Ry positions of the device support arrangement.

Preferably, the mechanism for adjusting the z, Rx and Ry position of the device support arrangement comprises one or more adjustable supports, such as adjustable sprung bolts, adjustable fasteners or adjustable pins.

Preferably, the adjustable supports are arranged around the device support arrangement.

Preferably, the adjustable supports are spaced at substantially equal angular positions about a mid-point of the device support arrangement.

Preferably, there are three adjustable supports.

Preferably, the adjustable supports are independently adjustable.

Preferably, the mechanism for adjusting the z, Rx and Ry position of the device support arrangement is configured to be operated when the module is outside of the charged particle apparatus.

Preferably, the module is a module according to any of the first and/or second aspects.

Preferably, the device support arrangement comprises the support positioning system and support arrangement according to the first aspect.

According to a third aspect of the invention, there is provided a charged particle apparatus comprising a field replaceable module according to any of the first and/or second aspects.

Preferably, the module comprises a device configured to manipulate charged particle paths in the charged particle apparatus.

Preferably, the charged particle apparatus comprises actuators for actuating the support positioning system of the module; and wherein the actuators are linear actuators.

Preferably, each actuator comprises an actuator arm that is configured to engage with a corresponding receiving part comprised by the module.

Preferably, the ends of the actuator arms comprise roller bearings.

Preferably, the device comprises beam manipulators that are arranged to manipulate the sub-beams of a multi-beam of charged particles.

Preferably, the charged particle apparatus comprises a housing flange that is configured to be attachable to, and detachable from, a module flange of the module.

Preferably, the housing flange comprises one or more alignment pins for insertion into corresponding openings in module flange.

Preferably, the module flange comprises one or more alignment pins for insertion into corresponding openings in housing flange.

Preferably, the charged particle apparatus further comprises a position detecting system configured to determine the movement and/or position of the device.

Preferably, the charged particle apparatus further comprises: a source of charged particles; and one or more manipulator arrangements configured to manipulate a charged particle path up-beam and/or down-beam of the device.

Preferably, the one or more manipulator arrangements are configured to adjust the charged particle path, and/or the module is configured to adjust the position of the device, such that the charged particle path is aligned with device.

Preferably, the charged particle system further comprising a control system configured to control the one or more manipulator arrangements.

Preferably, a first set of manipulator arrangement is provided up-beam of the module; and a second set of manipulator arrangement is provided down-beam of the module.

Preferably, the one or more of manipulator arrangements comprise an electro-static deflector for deflecting the charged particle path.

Preferably, the one or more of manipulator arrangements comprise a magnetic lens for deflecting the charged particle path.

Preferably, the charged particle apparatus further comprises a source movement mechanism for adjusting the position of the source.

Preferably, the charged particle apparatus further comprises an objective lens; and the charged particle apparatus further comprises a lens movement mechanism for adjusting the position of the objective lens.

Preferably, at least one of the manipulator arrangements is configured to be controllable so as to manipulate the charged particle path from the source to be aligned with the device and the objective lens.

Preferably, the charged particle apparatus further comprises: an up-beam vacuum lock on an up-beam side of the module; and a down-beam vacuum lock on a down-beam side of the module.

Preferably, the up-beam vacuum lock and the down-beam vacuum lock are operable to isolate the region of the charged particle apparatus that comprises the module from vacuum conditions in the adjacent regions of the charged particle apparatus.

Preferably, the charged particle system further comprises a source vacuum lock down-beam from the source.

Preferably, the source vacuum lock is operable to isolate the region of the charged particle apparatus that comprises the source from vacuum conditions in an adjacent region of the charged particle apparatus.

Preferably, the source is comprised by a field replaceable module.

Preferably, the charged particle apparatus further comprises a secondary column; and the secondary column comprises a detector configured to detect electrons from a sample.

Preferably, the secondary column further comprises one or more vacuum locks for isolating the region of the secondary column that comprises the detector from vacuum conditions in the adjacent region(s) of the secondary column.

Preferably, the detector is comprised by a field replaceable module.

According to a fourth aspect of the invention, there is provided a method of installing an electron-optical device within a charged particle apparatus, the method comprising: attaching an electron-optical device to a module; applying a coarse adjustment to the Rx state, Ry state and/or z-position of the electron optical device relative to a main body of the module; and securing the module to the charged particle apparatus.

Preferably, the module is a module according to the first and/or second aspect; and the charged particle apparatus.

According to a fifth aspect of the invention, there is provided a method of aligning an electron-optical device with a charged particle beam, or multi-beam, within a charged particle apparatus, the method comprising: securing a module comprising an electron-optical device to a charged particle apparatus to thereby install the electron-optical device in the charged particle apparatus; applying fine adjustment(s) to the x-position, y-position and/or Rz state of the electron optical device relative to a main body of the module; and applying an adjustment to the path of a charged particle beam, or multi-beam, within the charged particle apparatus.

Preferably, before the electron-optical device is installed in the charged particle apparatus, a module receiving region in the charged particle apparatus for receiving the module is isolated, by closed internal vacuum seals, from substantial vacuum conditions in adjacent regions within the charged particle apparatus such that the module receiving region may be vented and at the ambient conditions outside of the charged particle apparatus.

Preferably, the method further comprises: closing an external vacuum seal for the module receiving region, after the module has been secured to the charged particle apparatus, so that the module receiving region is isolated from the ambient conditions outside of the charged particle apparatus; pumping the module receiving region so that it is at substantial vacuum conditions; baking the module; opening the internal vacuum seals; activating the source of the charged particle apparatus so that there is a charged particle beam, or multi-beam, within the charged particle apparatus.

Preferably, the module is a module according to the first and/or second aspect; and the charged particle apparatus is a charged particle apparatus according to the third aspect.

According to a sixth aspect of the invention, there is provided an electron optical column configured to project an electron beam to a sample, the column comprising: a frame configured to define a frame of reference of the column; and a chamber for accepting a field replaceable module comprising an electron-optical device. The electron optical column may comprise an engagement arrangement configured to engage with the field replaceable module to align the field replaceable module with the frame. The electron optical column may comprise an active positioning system configured to position the beam and the device relative to each other for fine alignment.

Preferably, the active positioning system comprises an electron-optical element up beam of the field replaceable module that is controllable to manipulate the path of the electron beam, such as lens or deflect the electron beam path.

Preferably, the active positioning system comprises an actuator configured to be engageable with field replaceable module and controllable to move the device relative to the path of the electron beam in a degree of freedom which is preferably a degree of freedom of the device in a plane orthogonal to the path of the electron beam, preferably the device being a planar structure in the plane orthogonal to the path of the electron beam.

Preferably, the electron optical column further comprises an up-beam valve to seal the column up-beam of the chamber and a down beam valve to seal the chamber from down beam part of the column, preferably so that the chamber is segmented from the rest of the column Preferably, the chamber defines an opening in a side of the column configured to receive the field replaceable module and is configured to be sealable with the field replaceable module.

According to a seventh aspect of the invention, there is provided a field replaceable module arranged to be removably insertable into an electron-optical column, the field replaceable module comprising: an electron-optical element configured to manipulate a path of an electron beam in the electron-optical column; and a support configured to support the electron optical element. The field replaceable module may comprise an engagement arrangement configured to align the support with a frame of the electron-optical column in all degrees of freedom.

Preferably, the field replaceable module further comprises a support positioning system configured to displace the element with respect to the rest of the module so as to enable the element to be positioned with respect to a path of an electron beam through the column.

Preferably, the element is a planar structure arranged to be orthogonal to the path of the charged particle beam, wherein the support positioning system is configured to displace the support in at least one degree of freedom of the plane of the planar structure, preferably in the x axis, in they axis and/or in rotation about the z axis.

Preferably, the support positioning system is configured to engageable with an actuator associated with frame of the electron optical column, the actuator associated with a degree of freedom of the plane of the planar structure, the support being controllably operable by the actuator so that a position of the support relative to the frame is adjusted.

Preferably, the engagement arrangement comprises: a planar surface and two interlocking features each assigned to an axial degree of freedom.

Preferably, the engagement arrangement is configured to seal against a side surface of the column.

Preferably, the field replaceable module further comprises a pre-calibration system configured to be adjustable to adjust the alignment of the support relative to the frame preferably in a degree of freedom other than that adjusted by the support positioning system and/or preferably in a degree of freedom that is out of the plane of the planar structure of the device.

While the present invention has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

There are provided a number of clauses:

Clause 1: A module for supporting a device configured to manipulate charged particle paths in a charged particle apparatus, the module comprising: a support arrangement configured to support the device, wherein the device is configured to manipulate a charged particle path within the charged particle apparatus; and a support positioning system configured to move the support arrangement within the module; wherein the module is arranged to be field replaceable in the charged particle apparatus.

Clause 2: The module according to clause 1, wherein, when the module is in use in a charged particle apparatus with a device held by the support arrangement: the charged particle path is substantially parallel to a charged particle axis of the charged particle apparatus.

Clause 3: The module according to clause 1 or 2, wherein the support positioning system is configured to move the support arrangement in at least three degrees of freedom of movement.

Clause 4: The module according to any preceding clause, wherein the charged particle axis corresponds to a z-axis; the module is a substantially planar structure in an x-y plane; and the at least three degrees of movement comprise movement in the x-y plane and rotation about the z-axis (Rz).

Clause 5: The module according to any preceding clause, wherein the support positioning system is a manual and/or an automatic positioning system.

Clause 6: The module according to any preceding clause, wherein the support positioning system is configured to: move the support arrangement to within about 0.5 µm to 100 µm of a desired position of the support arrangement; and/or to apply up to 1 rad rotation in Rz to the support arrangement.

Clause 7: The module according to any preceding clause, wherein the module further comprises a position detecting system configured to determine the movement and/or position of the support arrangement and/or a device held by the support arrangement.

Clause 8: The module according to clause 7, wherein the position detecting system comprises a grid mark, such as an encoder, for use in determining the movement and/or position of the support arrangement and/or a device held by the support arrangement.

Clause 9: The module according to clause 7 or 8, wherein the position detecting system is configured to determine the movement and/or position of the support arrangement, and/or a device held by the support arrangement, in dependence one or more features of the device held by the support arrangement.

Clause 10: The module according to clause 9, wherein the one or more features of the device comprise: an array of openings; and/or one or more fiducials.

Clause 11: The module according to clause 10, wherein the array of openings are an array of openings for use in aligning substrates in a substrate stack comprised by the device during manufacture of the device.

Clause 12: The module according to clause 10, wherein the array of openings are for charged particle paths through beam manipulators comprised by the device.

Clause 13: The module according to any preceding clause, wherein the module further comprises receiving parts that are configured to receive the respective ends of actuator arms.

Clause 14: The module according to clause 13, wherein the actuator arms are comprised by actuators that are external to the module; and the support positioning system is configured to be moved by the actuators.

Clause 15: The module according to clause 14, wherein: a first receiving part is arranged to receive an end of a first actuator arm for moving the support positioning system in a first direction; a second receiving part is arranged to receive an end of a second actuator arm for moving the support arrangement, by the support positioning system in a second direction, that may be orthogonal to the first direction; and a third receiving part is arranged to receive the end of a third actuator arm for rotating the support arrangement.

Clause 16: The module according to clause 15, wherein the first and second directions are in an x-y plane; and the rotation is about an axis, such as a z-axis, that is orthogonal to the x-y plane.

Clause 17: The module according to any preceding clause, wherein the support positioning system comprises: a disc; and a plurality of load bearing rotatable objects configured to support the disc within the module.

Clause 18: The module according to clause 17, wherein: the disc has an up-beam surface and a down-beam surface; a first set of one or more load bearing rotatable objects is arranged to contact the up-beam surface of the disc; and a second set of a plurality of load bearing rotatable objects is arranged to contact the down-beam surface of the disc.

Clause 19: The module according to clause 17 or 18, wherein the first set of load bearing rotatable objects comprises one, two or three load bearing rotatable objects; and the second set of load bearing rotatable objects comprises three load bearing rotatable objects.

Clause 20: The module according to any of clauses 17 to 19, wherein, in a plan view, the disc is arranged such that, when the module is installed within a charged particle apparatus, the charged particle path passes through an opening defined in the disc.

Clause 21: The module according to any of clauses 17 to 20, wherein, in a plan view, the disc is substantially annular.

Clause 22: The module according to any of clauses 17 to 21, wherein the disc is a substantially planar structure, preferably in the x-y plane.

Clause 23: The module according to any of clauses 17 to 22, wherein the disc comprises the support arrangement.

Clause 24: The module according to any of clauses 17 to 23, wherein: the module comprises a first force applying device arranged to apply a force to the disc, wherein the force in the substantially in same plane as the disc and is for moving the disc within the plane; and the module comprises a second force applying device arranged to apply a force to the disc, wherein the force is in the substantially in same plane as the disc and is for rotating the disc.

Clause 25: The module according to clause 24, wherein the first force applying device is configured so that its applied force is substantially in a direction that passes through the axis of rotation of the disc so that the force does not substantially rotate the disc.

Clause 26: The module according to clause 24 or 25, wherein, in use, the disc is compressed by a force from the first force applying device; a force applied to the first receiving part; and a force applied to the second receiving part.

Clause 27: The module according to any of clauses 24 to 26, wherein, in use, the second force applying device arranged to apply a force that presses the third receiving part into the end of the third actuator arm.

Clause 28: The module according to any of clauses 24 to 27, wherein the second force applying device arranged to apply a force to a first protrusion from a sidewall of the disc; and/or the third receiving part comprises a second protrusion from a sidewall of the disc.

Clause 29: The module according to any of clauses 17 to 23, wherein: the module comprises a force applying device arranged to apply a force to the disc; the applied force in the substantially in same plane as the disc; the applied force is for moving the disc linearly within the plane; and the applied force is for rotating the disc.

Clause 30: The module according to any of clauses 17 to 29, wherein the module comprises one or more axial force applying devices arranged so that the disc is held under compression between the first and second sets of load bearing rotatable objects.

Clause 31: The module according to clause 30, wherein: each axial force applying device comprises a plate for contacting one of the load bearing rotatable objects; and/or one or more of the axial force applying devices are resilient members, such as springs.

Clause 32: The module according to any of clauses 1 to 16, wherein the support positioning system comprises a flexure arrangement.

Clause 33: The module according to clause 32, wherein the flexure arrangement comprises an Rz flexure arrangement and an x-y flexure arrangement.

Clause 34: The module according to clause 33, wherein the Rz flexure arrangement and the x-y flexure arrangement are both substantially planar structures, preferably in the x-y plane.

Clause 35: The module according to any of clauses 33 or 34, wherein the Rz flexure arrangement and the x-y flexure arrangement are arranged in a stack; and the Rz flexure arrangement is preferably down-beam of the x-y flexure arrangement.

Clause 36: The module according to any of clauses 33 to 35, wherein, in plan view, the Rz flexure arrangement comprises a substantially circular structure defining an opening in the Rz flexure arrangement.

Clause 37: The module according to clause 36, wherein the center of the substantially circular structure is substantially aligned with the z-axis.

Clause 38: The module according to any of clauses 36 or 37, wherein, in plan view, the Rz flexure arrangement comprises a cross; the cross comprises intersecting first and second crossbars at an intersection; the first crossbar is aligned in a first direction in the plane of the plane of the Rz flexure arrangement; and the second crossbar is aligned in a second direction in the plane of the Rz flexure arrangement, wherein the second direction is orthogonal to the first direction.

Clause 39: The module according to any of clauses 36 to 38, wherein: the circular structure is at the intersection of the first and second crossbars; and the circular structure is supported between first and second parts of the first crossbar and between first and second parts of the second crossbar.

Clause 40: The module according to clause 39, wherein: the first crossbar is aligned with the first receiving part; and the second crossbar is aligned with the second receiving part.

Clause 41: The module according to any of clauses 33 to 40, wherein the Rz flexure arrangement comprises a base and a moveable body.

Clause 42: The module according to clause 41, wherein the third receiving part comprises a recess in a sidewall of the Rz flexure arrangement.

Clause 43: The module according to any of clauses 41 or 42, wherein the Rz flexure arrangement comprises a rotational force applying device configured to apply a force for rotating the moveable body.

Clause 44: The module according to clause 43, wherein, in use, the rotational force applied by the rotational force applying device is configured to press the third receiving part into the end of the third actuator arm.

Clause 45: The module according to any of clauses 33 to 44, wherein the x-y flexure arrangement comprises: an outer structure; an intermediate structure; a central structure; and a plurality of leaf springs; wherein, in the plane of the x-y flexure arrangement, the intermediate structure is substantially surrounded by the outer structure, the first receiving part and the first receiving part; wherein, in the plane of the x-y flexure arrangement, the central structure is substantially surrounded by the intermediate structure; the outer structure is connected to the intermediate structure by at least one leaf spring; and the intermediate structure is connected to the central structure by at least one leaf spring.

Clause 46: The module according to clause 45, wherein: the at least one leaf spring that connects the intermediate structure to the central structure is arranged so that the central structure is arranged to move in a first direction relative to the outer structure in response to a force applied to the first receiving part; and the at least one leaf spring that connects the outer structure to the intermediate structure is arranged so that the intermediate structure is arranged to move in a second direction relative to the outer structure in response to a force applied to the second receiving part.

Clause 47: The module according to clause 46, wherein: the intermediate structure is connected to the central structure by two leaf springs arranged on opposite sides of the central structure; and the intermediate structure is connected to the outer structure by two leaf springs arranged on opposite sides to the intermediate structure.

Clause 48: The module according to any of clauses 45 to 47, further comprising: a first biasing device arranged to apply a force so that the intermediate structure and/or central structure are held under compression in the first direction; and a second biasing device arranged to apply a force so that the intermediate structure and/or central structure are held under compression in the second direction.

Clause 49: The module according to any of clauses 45 to 48 when dependent on clause 41, wherein the outer structure of the x-y flexure arrangement is secured to the moveable body of the Rz flexure arrangement.

Clause 50: The module according to any of clauses 32 to 49, wherein the first and/or second biasing devices are resilient members, such as springs.

Clause 51: The module according to any of clauses 1 to 16, wherein, the support positioning system comprises one or more linear actuators or an actuator arrangement.

Clause 52: The module according to clause 51, wherein each actuator is a piezo-electric actuator arrangement.

Clause 53: The module according to clause 52, wherein each piezo-electric actuator arrangement comprises a two axis shear mode piezo-electric device.

Clause 54: The module according to any of clauses 51 to 53, wherein the support positioning system comprises a plurality of actuators.

Clause 55: The module according to clause 54, wherein the number of actuators comprised by the support positioning system is three.

Clause 56: The module according to any of clauses 51 to 55, wherein the support positioning system comprises a stage.

Clause 57: The module according to clause 56, wherein, in plan view, the stage is substantially annular.

Clause 58: The module according to any of clauses 56 or 57, wherein the actuators are spaced at substantially equal angular positions about a mid-point of the stage.

Clause 59: The module according to clause 58, wherein the actuators are aligned so that the angle between the longitudinal axes of adjacent actuators is 60 degrees.

Clause 60: The module according to any of clauses 51 to 59, wherein the actuators are configured so that all of the actuators or actuator arrangement may be operated together to rotate the stage in the plane of the stage.

Clause 61: The module according to any of clauses 51 to 60, wherein the actuators are configured so that all of the actuators may be operated together to move the stage in a first direction in the plane of the stage.

Clause 62: The module according to any of clauses 51 to 61, wherein the actuators are configured so that all of the actuators may be operated together to move the stage in a second direction in the plane of the stage, wherein the second direction is orthogonal to the first direction.

Clause 63: The module according to any of clauses 51 to 62, further comprising one or more force applying devices, wherein each force applying device is arranged to apply a force that presses an actuator into the stage.

Clause 64: The module according to any of clauses 51 to 57, wherein, in plan view, at least one actuator is arranged by the side of the stage and configured such that linear movement of the actuator causes the stage to rotate; and wherein, for each actuator by the side of the stage, there is a force apply device configured to apply a force that presses the actuator into the stage.

Clause 65: The module according to clause 64, wherein there are two actuators by the side of the stage; and the actuators are on opposing sides of the stage.

Clause 66: The module according to any of clauses 64 or 65, further comprising first and second linear actuators; wherein: the first linear actuator is arranged to move the second linear actuator in a first direction; and the second linear actuator is arranged to move the at least one actuator is arranged by the side of the stage in a second direction that is orthogonal to the first direction.

Clause 67: A module for supporting a device configured to manipulate the paths of charged particles in a charged particle apparatus, the module comprising: a module flange configured to attach to, and detach from, a housing flange of a housing of the charged particle apparatus such that the module is field replaceable in the charged particle apparatus.

Clause 68: The module according to clause 67, wherein, when the module is in use in the charged particle apparatus with the module supporting a device, the device is configured to manipulate a charged particle path that is substantially along the charged particle axis of the charged particle apparatus.

Clause 69: The module according to clause 68, wherein the charged particle axis corresponds to a z-axis; and the module is a substantially planar structure in an x-y plane.

Clause 70: The module according to any of clauses 67 to 69, wherein: the module flange comprises one or more holes for receiving alignment pins of the housing flange; and/or the module flange comprises one or more alignment pins for insertion into holes of the housing flange.

Clause 71: The module according to clause 70, wherein the module flange comprises one or more alignment pins for insertion into the housing flange.

Clause 72: The module according to any of clauses 67 to 71, wherein the module comprises: a device support arrangement for supporting the device; and a mechanism for adjusting the positon of the device support arrangement in at least one degree of freedom of movement.

Clause 73: The module according to clause 72, wherein the device support system allows the position of the device support arrangement to be adjusted in three degrees of freedom of movement; and the three degrees of freedom of movement are preferably the z, Rx and Ry positions of the device support arrangement.

Clause 74: The module according to any of clauses 72 or 73, wherein the mechanism for adjusting the z, Rx and Ry position of the device support arrangement comprises one or more adjustable supports, such as adjustable sprung bolts, adjustable fasteners or adjustable pins.

Clause 75: The module according to clause 74, wherein the adjustable supports are arranged around the device support arrangement.

Clause 76: The module according to clause 74 or 75, wherein the adjustable supports are spaced at substantially equal angular positions about a mid-point of the device support arrangement.

Clause 77: The module according to any of clauses 74 to 76, wherein there are three adjustable supports.

Clause 78: The module according to any of clauses 74 to 76, wherein the adjustable supports are independently adjustable.

Clause 79: The module according to any of clauses 72 to 78, wherein the mechanism for adjusting the z, Rx and Ry position of the device support arrangement is configured to be operated when the module is outside of the charged particle apparatus.

Clause 80: The module according to any of clauses 67 to 79, wherein the module is a module according to any of clauses 1 to 66.

Clause 81: The module according to clause 80, wherein the device support arrangement comprises the support positioning system and support arrangement according to any of clauses 1 to 67.

Clause 82: A charged particle apparatus comprising a field replaceable module according to any of clauses 1 to 81.

Clause 83: The charged particle apparatus according to clause 82, wherein the module comprises a device configured to manipulate charged particle paths in the charged particle apparatus.

Clause 84: The charged particle apparatus according to clause 83, wherein the charged particle apparatus comprises actuators for actuating the support positioning system of the module; and wherein the actuators are linear actuators.

Clause 85: The charged particle apparatus according to clause 84, wherein each actuator comprises an actuator arm that is configured to engage with a corresponding receiving part comprised by the module.

Clause 86: The charged particle apparatus according to clause 85, wherein the ends of the actuator arms comprise roller bearings.

Clause 87: The charged particle apparatus according to any of clauses 83 to 86, wherein the device comprises beam manipulators that are arranged to manipulate the sub-beams of a multi-beam of charged particles.

Clause 88: The charged particle apparatus according to any of clauses 82 to 86, wherein the charged particle apparatus comprises a housing flange that is configured to be attachable to, and detachable from, a module flange of the module.

Clause 89: The charged particle apparatus according to clause 88, wherein the housing flange comprises one or more alignment pins for insertion into corresponding openings in module flange.

Clause 90: The charged particle apparatus according to clause 88 or 89, wherein the module flange comprises one or more alignment pins for insertion into corresponding openings in housing flange.

Clause 91: The charged particle apparatus according to any of clauses 83 to 90, wherein the charged particle apparatus further comprises a position detecting system configured to determine the movement and/or position of the device.

Clause 92: The charged particle apparatus according to any of clauses 83 to 91, wherein the charged particle apparatus further comprises: a source of charged particles; and one or more manipulator arrangements configured to manipulate a charged particle path up-beam and/or down-beam of the device.

Clause 93: The charged particle apparatus according to clause 92, wherein the one or more manipulator arrangements are configured to adjust the charged particle path, and/or the module is configured to adjust the position of the device, such that the charged particle path is aligned with device.

Clause 94: The charged particle apparatus according to any of clauses 92 or 93, wherein the charged particle system further comprising a control system configured to control the one or more manipulator arrangements.

Clause 95: The charged particle apparatus according to any of clauses 92 to 94, wherein a first set of manipulator arrangement is provided up-beam of the module; and a second set of manipulator arrangement is provided down-beam of the module.

Clause 96: The charged particle apparatus according to any of clauses 92 to 95, wherein the one or more of manipulator arrangements comprise an electro-static deflector for deflecting the charged particle path.

Clause 97: The charged particle apparatus according to any of clauses 92 to 96, wherein the one or more of manipulator arrangements comprise a magnetic lens for deflecting the charged particle path.

Clause 98: The charged particle apparatus according to any of clauses 92 to 97, wherein the charged particle apparatus further comprises a source movement mechanism for adjusting the position of the source.

Clause 99: The charged particle apparatus according to any of clauses 92 to 98, wherein the charged particle apparatus further comprises an objective lens; and the charged particle apparatus further comprises a lens movement mechanism for adjusting the position of the objective lens.

Clause 100: The charged particle apparatus according to clause 99, wherein at least one of the manipulator arrangements is configured to be controllable so as to manipulate the charged particle path from the source to be aligned with the device and the objective lens.

Clause 101: The charged particle apparatus according to any of clauses 92 to 100, wherein the charged particle apparatus further comprises: an up-beam vacuum lock on an up-beam side of the module; and a down-beam vacuum lock on a down-beam side of the module.

Clause 102: The charged particle apparatus according to clause 101, wherein the up-beam vacuum lock and the down-beam vacuum lock are operable to isolate the region of the charged particle apparatus that comprises the module from vacuum conditions in the adjacent regions of the charged particle apparatus.

Clause 103: The charged particle apparatus according to any of clauses 92 to 102, wherein the charged particle system further comprises a source vacuum lock down-beam from the source.

Clause 104: The charged particle apparatus according to clause 103, wherein the source vacuum lock is operable to isolate the region of the charged particle apparatus that comprises the source from vacuum conditions in an adjacent region of the charged particle apparatus.

Clause 105: The charged particle apparatus according to clause 104, wherein the source is comprised by a field replaceable module.

Clause 106: The charged particle apparatus according to any of clauses 92 to 105, wherein the charged particle apparatus further comprises a secondary column; and the secondary column comprises a detector configured to detect electrons from a sample.

Clause 107: The charged particle apparatus according to clause 106, wherein the secondary column further comprises one or more vacuum locks for isolating the region of the secondary column that comprises the detector from vacuum conditions in the adjacent region(s) of the secondary column.

Clause 108: The charged particle apparatus according to clause 107, wherein the detector is comprised by a field replaceable module.

Clause 109: A method of installing an electron-optical device within a charged particle apparatus, the method comprising: attaching an electron-optical device to a module; applying a coarse adjustment to the Rx state, Ry state and/or z-position of the electron optical device relative to a main body of the module; and securing the module to the charged particle apparatus.

Clause 110: The method according to clause 109, wherein the module is a module according to any of clauses 1 to 81; and the charged particle apparatus is a charged particle apparatus according to any of clauses 82 to 108.

Clause 111: A method of aligning an electron-optical device with a charged particle beam, or multi-beam, within a charged particle apparatus, the method comprising: securing a module comprising an electron-optical device to a charged particle apparatus to thereby install the electron-optical device in the charged particle apparatus; applying fine adjustment(s) to the x-position, y-position and/or Rz state of the electron optical device relative to a main body of the module; and applying an adjustment to the path of a charged particle beam, or multi-beam, within the charged particle apparatus.

Clause 112: The method according to clause 111, wherein, before the electron-optical device is installed in the charged particle apparatus, a module receiving region in the charged particle apparatus for receiving the module is isolated, by closed internal vacuum seals, from substantial vacuum conditions in adjacent regions within the charged particle apparatus such that the module receiving region may be vented and at the ambient conditions outside of the charged particle apparatus.

Clause 113: The method according to clause 112, the method further comprising: closing an external vacuum seal for the module receiving region, after the module has been secured to the charged particle apparatus, so that the module receiving region is isolated from the ambient conditions outside of the charged particle apparatus; pumping the module receiving region so that it is at substantial vacuum conditions; baking the module; opening the internal vacuum seals; activating the source of the charged particle apparatus so that there is a charged particle beam, or multi-beam, within the charged particle apparatus.

Clause 114: The method according to clause 111 to 113, wherein the module is a module according to any of clauses 1 to 81; and the charged particle apparatus is a charged particle apparatus according to any of clauses 82 to 108.

Clause 115: An electron optical column configured to project an electron beam to a sample, the column comprising: a frame configured to define a frame of reference of the column; a chamber for accepting a field replaceable module comprising an electron-optical device; an engagement arrangement configured to engage with the field replaceable module to align the field replaceable module with the frame; and an active positioning system configured to position the beam and the device relative to each other for fine alignment.

Clause 116: The electron optical column of clause 115, wherein the active positioning system comprises an electron-optical element up beam of the field replaceable module that is controllable to manipulate the path of the electron beam, such as lens or deflect the electron beam path.

Clause 117: The electron-optical column of clause 115 or 116, wherein the active positioning system comprises an actuator configured to be engageable with field replaceable module and controllable to move the device relative to the path of the electron beam in a degree of freedom which is preferably a degree of freedom of the device in a plane orthogonal to the path of the electron beam, preferably the device being a planar structure in the plane orthogonal to the path of the electron beam.

Clause 118: The electron optical column of any of clauses 115 to 117, further comprising an up-beam valve to seal the column up-beam of the chamber and a down beam valve to seal the chamber from down beam part of the column, preferably so that the chamber is segmented from the rest of the column Clause 119: The electron optical column of any of clauses 115 to 118, wherein the chamber defines an opening in a side of the column configured to receive the field replaceable module and is configured to be sealable with the field replaceable module.

Clause 120: A field replaceable module arranged to be removably insertable into an electron-optical column, the field replaceable module comprising: a) an electron-optical element configured to manipulate a path of an electron beam in the electron-optical column; b) a support configured to support the electron optical element; and c) an engagement arrangement configured to align the support with a frame of the electron-optical column in all degrees of freedom.

Clause 121: The field replaceable module of clause 120 further comprising a support positioning system configured to displace the element with respect to the rest of the module so as to enable the element to be positioned with respect to a path of an electron beam through the column.

Clause 122: The field replaceable module of clause 121, wherein the element is a planar structure arranged to be orthogonal to the path of the charged particle beam, wherein the support positioning system is configured to displace the support in at least one degree of freedom of the plane of the planar structure, preferably in the x axis, in they axis and/or in rotation about the z axis.

Clause 123: The field replaceable module of clause 121 or 122, wherein the support positioning system is configured to engageable with an actuator associated with frame of the electron optical column, the actuator associated with a degree of freedom of the plane of the planar structure, the support being controllably operable by the actuator so that a position of the support relative to the frame is adjusted.

Clause 124: The field replaceable module of any of clauses 120 to 123, wherein the engagement arrangement comprises: a planar surface and two interlocking features each assigned to an axial degree of freedom.

Clause 125: The field replaceable module of any of clauses 120 to 124, wherein the engagement arrangement is configured to seal against a side surface of the column.

Clause 126: The field replaceable module of any of clauses 120 to 125, further comprising a pre-calibration system configured to be adjustable to adjust the alignment of the support relative to the frame preferably in a degree of freedom other than that adjusted by the support positioning system and/or preferably in a degree of freedom that is out of the plane of the planar structure of the device.

The invention claimed is:

1. A module for supporting a device configured to manipulate paths of charged particles in a charged particle apparatus, the module comprising:
   a module flange configured to attach to, and detach from, a housing flange of a housing of the charged particle apparatus such that the module is field replaceable in the charged particle apparatus;
   wherein, when the module is in use in the charged particle apparatus with the module supporting a charged particle optical device, the charged particle optical device is configured to manipulate a charged particle path that is substantially along a charged particle axis of the charged particle apparatus; and
   wherein the charged particle axis corresponds to a z-axis; and the module is a substantially planar structure in an x-y plane;
   wherein the module comprises:
   a device support for supporting the charged particle optical device; and
   a mechanism for adjusting the position of the device support in at least one degree of freedom of movement,
   wherein the mechanism for adjusting a position of the device support comprises one or more adjustable supports, and is configured to be operated when the module is outside of the charged particle apparatus, wherein one or more of the adjustable supports are configured to be inside the charged particle apparatus when the module is inside the charged particle apparatus.

2. The module according to claim 1, wherein the mechanism for adjusting the position of the device support allows the position of the device support to be adjusted in three degrees of freedom of movement.

3. The module according to claim 2, wherein the three degrees of freedom of movement are the z, Rx and Ry positions of the device support.

4. The module according to claim 1, wherein the one or more adjustable supports comprise at least one of adjustable sprung bolts, adjustable fasteners or adjustable pins.

5. The module according to claim 4, wherein the adjustable supports are arranged around the device support.

6. The module according to claim 4, wherein the adjustable supports are spaced at substantially equal angular positions about a mid-point of the device support.

7. The module according to claim 4, wherein the adjustable supports are independently adjustable.

8. A charged particle apparatus comprising a field replaceable module for supporting a device configured to manipulate paths of charged particles in a charged particle apparatus, the module comprising:
- a module flange configured to attach to, and detach from, a housing flange of a housing of the charged particle apparatus such that the module is field replaceable in the charged particle apparatus,
- wherein, when the module is in use in the charged particle apparatus with the module comprising and supporting a charged particle optical device, the charged particle optical device is configured to manipulate a charged particle path that is substantially along a charged particle axis of the charged particle apparatus; and
- wherein the charged particle axis corresponds to a z-axis; and the module is a substantially planar structure in an x-y plane;
- wherein the module comprises:
- a device support for supporting the charged particle optical device; and
- a mechanism for adjusting a position of the device support in at least one degree of freedom of movement,
- wherein the mechanism for adjusting the position of the device support comprises one or more adjustable supports, and is configured to be operated when the module is outside of the charged particle apparatus, wherein one or more of the adjustable supports are configured to be inside the charged particle apparatus when the module is inside the charged particle apparatus.

9. The charged particle apparatus according to claim 8, wherein the charged particle apparatus comprises a support positioning system of the module, the support positioning system comprising a plurality of actuators; and
- wherein the actuators are linear actuators.

10. The charged particle apparatus according to claim 9, wherein each actuator comprises an actuator arm that is configured to engage with a corresponding receiving part comprised by the module.

11. The charged particle apparatus according to claim 8, wherein the device comprises beam manipulators that are arranged to manipulate sub-beams of a multi-beam of charged particles.

12. The charged particle apparatus according to claim 11, wherein the housing flange comprises one or more alignment pins for insertion into corresponding openings in module flange and/or the module flange comprises one or more alignment pins for insertion into corresponding openings in housing flange.

13. The charged particle apparatus according to claim 8, wherein the charged particle apparatus further comprises a position detector configured to determine movement and/or position of the device.

14. The charged particle apparatus according to claim 8, wherein the charged particle apparatus further comprises:
- a source of charged particles;
- one or more beam manipulators configured to manipulate a charged particle path up-beam and/or down-beam of the device.

15. The charged particle apparatus according to claim 14, wherein the charged particle apparatus further comprises an objective lens; and
- the charged particle apparatus further comprises a lens actuator for adjusting the position of the objective lens,
- wherein at least one of the beam manipulators is configured to be controllable so as to manipulate the charged particle path from the source to be aligned with the device and the objective lens.

16. The charged particle apparatus according to claim 14, wherein the charged particle apparatus further comprises:
- an up-beam vacuum lock on an up-beam side of the module; and
- a down-beam vacuum lock on a down-beam side of the module.

17. The charged particle apparatus according to claim 14, wherein the charged particle apparatus further comprises a secondary column; and
- the secondary column comprises a detector configured to detect electrons from a sample,
- wherein the detector is comprised by a field replaceable module.

18. The charged particle apparatus according to claim 14, wherein the one or more beam manipulators are configured to adjust the charged particle path, and/or the module is configured to adjust the position of the device, such that the charged particle path is aligned with device.

19. A method of aligning an electron-optical device with a charged particle beam, or multi-beam, within a charged particle apparatus, the method comprising:
- adjusting a position of an electron-optical device in a module comprising the electron-optical device when the module is outside of a charged particle apparatus;
- securing the module comprising the electron-optical device to the charged particle apparatus to thereby install the electron-optical device in the charged particle apparatus;
- applying fine adjustment(s) to an x-position, y-position and/or Rz state of the installed electron optical device relative to a main body of the module; and
- applying an adjustment to a path of a charged particle beam, or multi-beam, within the charged particle apparatus.

20. The method according to claim 19, wherein, before the electron-optical device is installed in the charged particle apparatus, isolating a module receiving region in the charged particle apparatus for receiving the module by closed internal vacuum seals, from substantial vacuum conditions in adjacent regions within the charged particle apparatus such that the module receiving region may be vented and at ambient conditions outside of the charged particle apparatus.

* * * * *